(12) United States Patent
Takano et al.

(10) Patent No.: US 7,709,883 B2
(45) Date of Patent: May 4, 2010

(54) NONVOLATILE SEMICONDUCTOR MEMORY DEVICE

(75) Inventors: Tamae Takano, Atsugi (JP); Atsushi Tokuda, Isehera (JP); Ryota Tajima, Atsugi (JP); Shunpei Yamazaki, Setagaya (JP)

(73) Assignee: Semiconductor Energy Laboratory Co., Ltd, Atsugi-shi, Kanagawa-ken ( * ) Notice: Subject to any disclaimer, the term of this patent is extended or adjusted under 35 U.S.C. 154(b) by 138 days.

(21) Appl. No.: 11/802,463

(22) Filed: May 23, 2007

(65) Prior Publication Data

US 2007/0278563 A1    Dec. 6, 2007

(30) Foreign Application Priority Data

Jun. 1, 2006    (JP) ............................. 2006-153516

(51) Int. Cl.
*H01L 29/788* (2006.01)
(52) U.S. Cl. ................ 257/324; 257/325; 257/E29.309
(58) Field of Classification Search ................. 257/314, 257/324, 325, 390, 391, E29.304, E29.309
See application file for complete search history.

(56) References Cited

U.S. PATENT DOCUMENTS

| | | | |
|---|---|---|---|
| 6,005,270 A | 12/1999 | Noguchi | |
| 6,388,291 B1 | 5/2002 | Zhang et al. | |
| 6,417,538 B1 | 7/2002 | Choi | |
| 6,433,361 B1 | 8/2002 | Zhang et al. | |
| 6,906,390 B2 * | 6/2005 | Nomoto et al. | 257/406 |
| 7,391,075 B2 * | 6/2008 | Jeon et al. | 257/316 |
| 2006/0118858 A1 * | 6/2006 | Jeon et al. | 257/321 |
| 2006/0175656 A1 * | 8/2006 | Govoreanu et al. | 257/321 |
| 2007/0082447 A1 * | 4/2007 | Lu et al. | 438/264 |
| 2007/0221971 A1 | 9/2007 | Yamazaki et al. | |
| 2007/0221985 A1 | 9/2007 | Yamazaki et al. | |
| 2007/0228420 A1 | 10/2007 | Takano et al. | |
| 2007/0228449 A1 | 10/2007 | Takano et al. | |
| 2007/0235793 A1 | 10/2007 | Yamazaki et al. | |
| 2007/0235794 A1 | 10/2007 | Yamazaki et al. | |
| 2007/0281400 A1 | 12/2007 | Yamazaki et al. | |

FOREIGN PATENT DOCUMENTS

JP    2000-058685    2/2000
JP    2006-013534    1/2006

* cited by examiner

*Primary Examiner*—Minh-Loan T Tran
(74) *Attorney, Agent, or Firm*—Eric J. Robinson; Robinson Intellectual Property Law Office, P.C.

(57) ABSTRACT

An object is to provide a nonvolatile semiconductor memory device which is excellent in a writing property and a charge retention property. In addition, another object is to provide a nonvolatile semiconductor memory device capable of reducing writing voltage. A nonvolatile semiconductor memory device includes a semiconductor layer or a semiconductor substrate including a channel formation region between a pair of impurity regions that are formed apart from each other, and a first insulating layer, a plurality of layers formed of different nitride compounds, a second insulating layer, and a control gate that are formed in a position which is over the semiconductor layer or the semiconductor substrate and overlaps with the channel formation region.

48 Claims, 57 Drawing Sheets

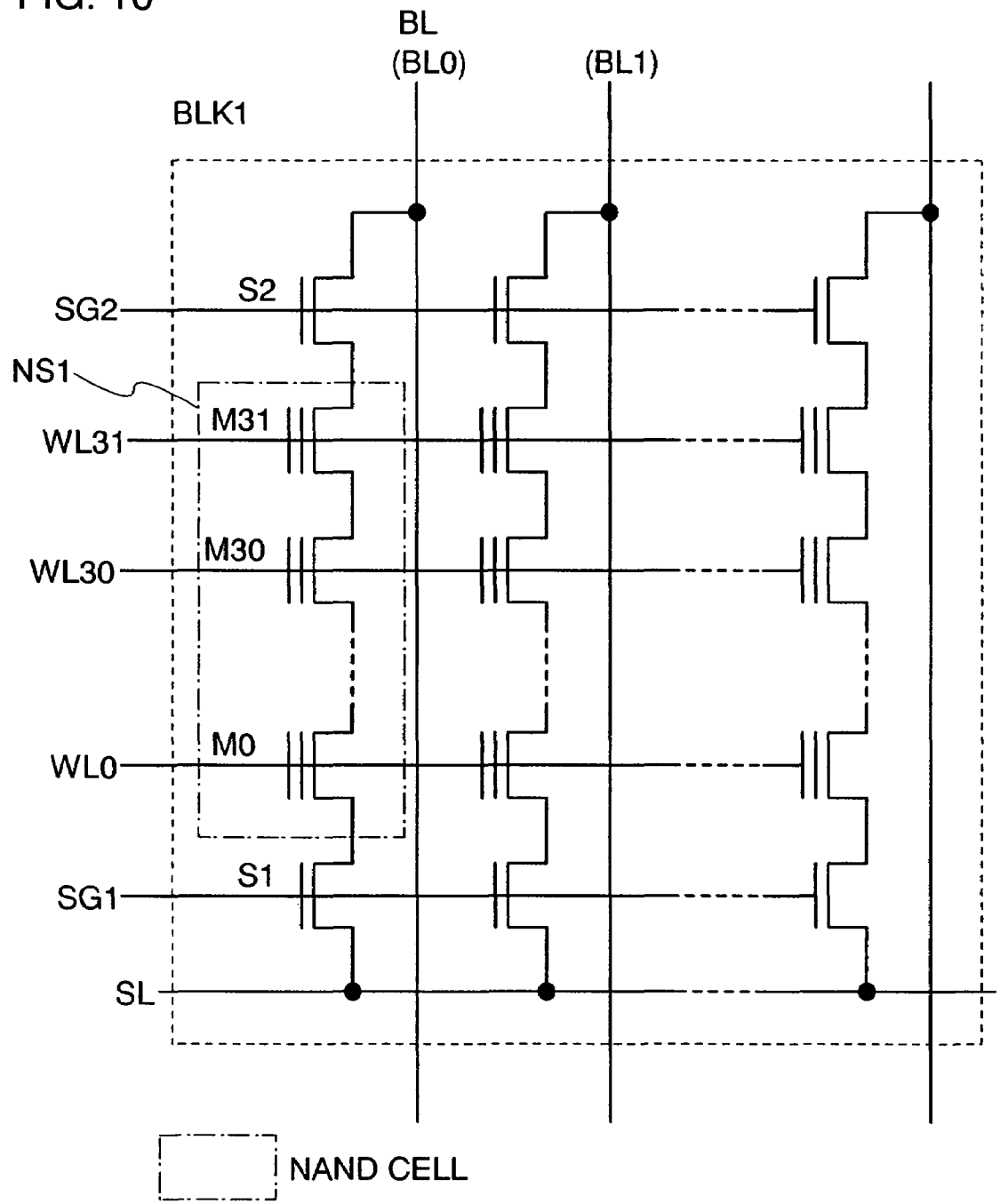

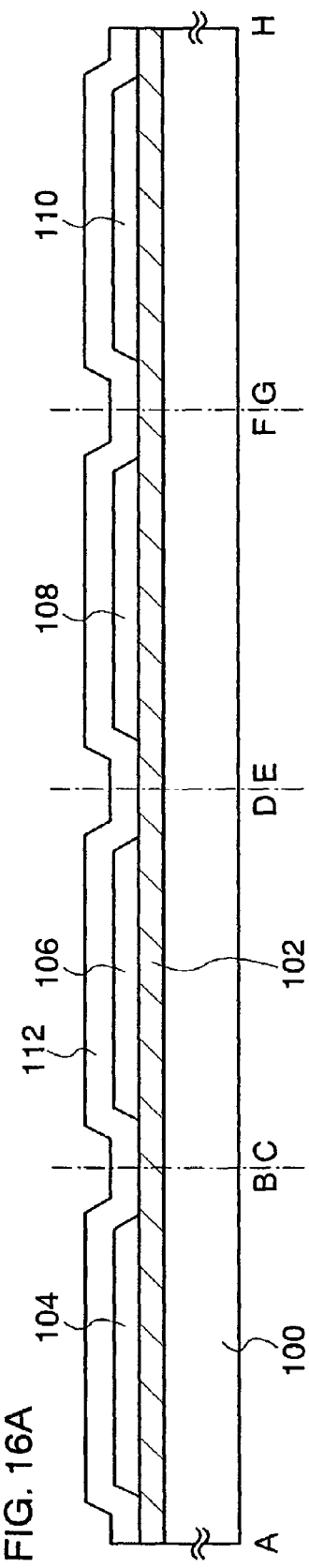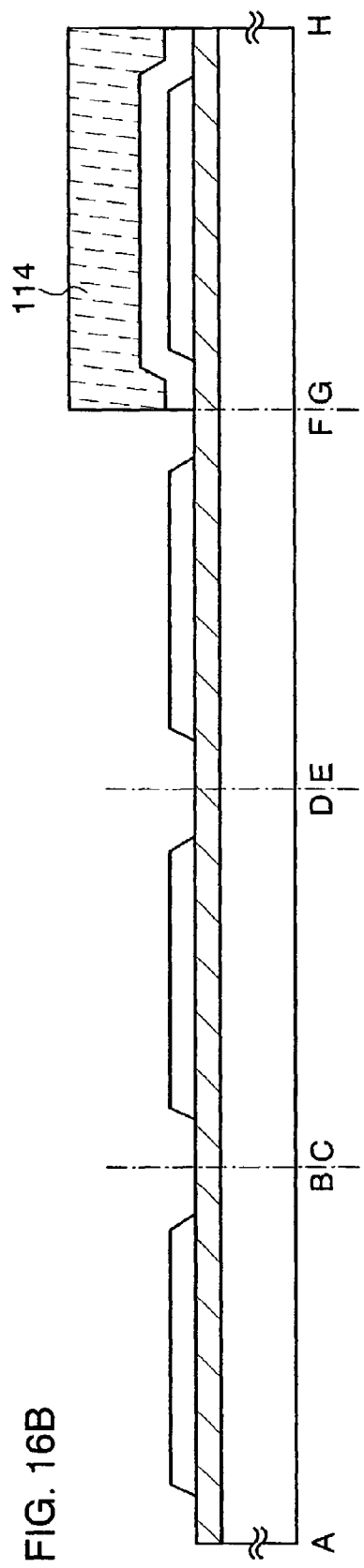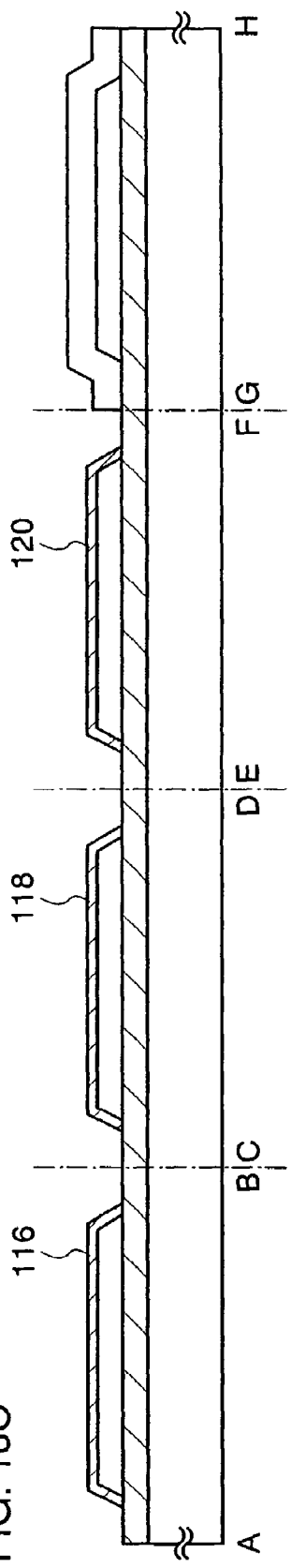

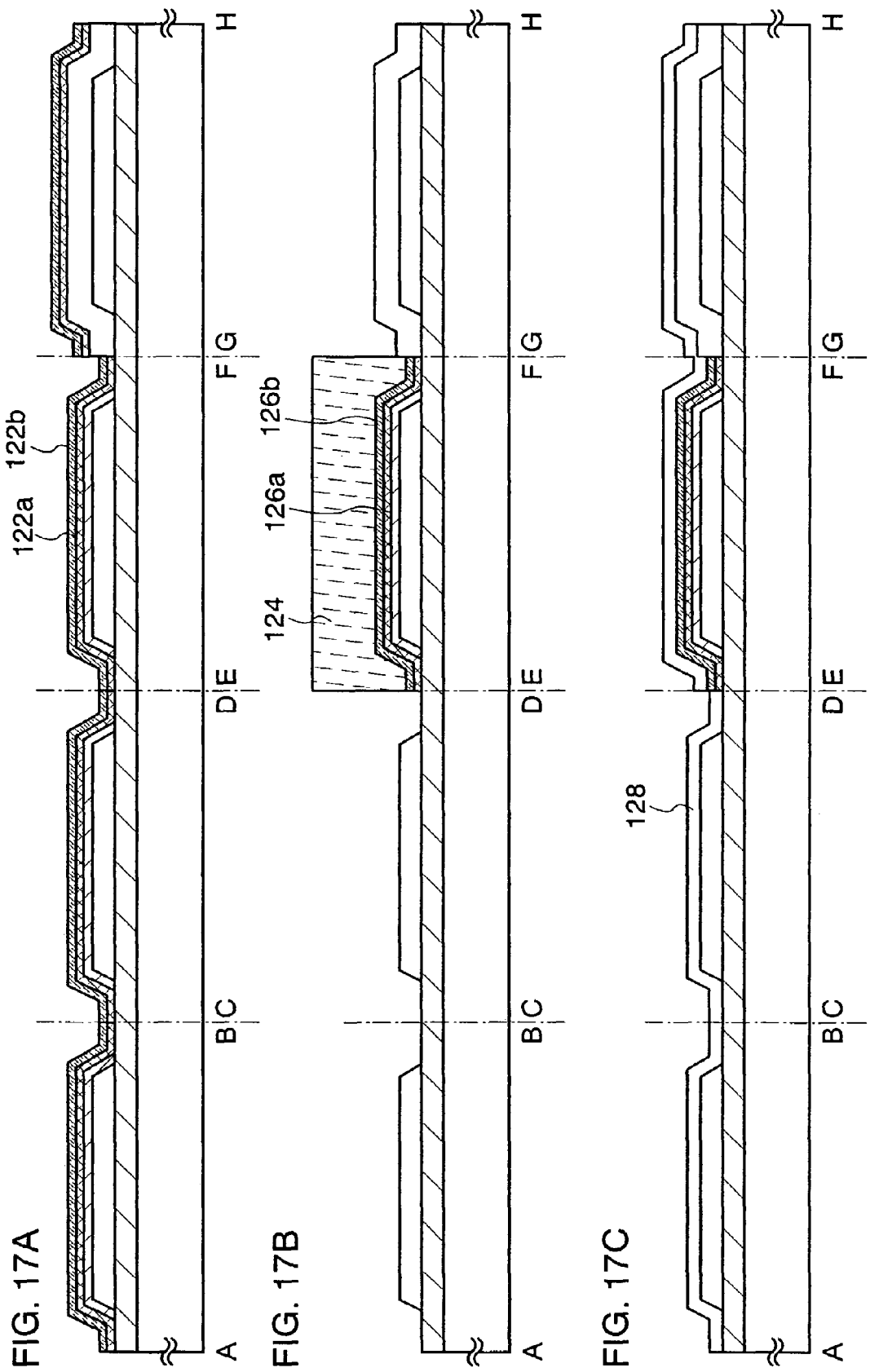

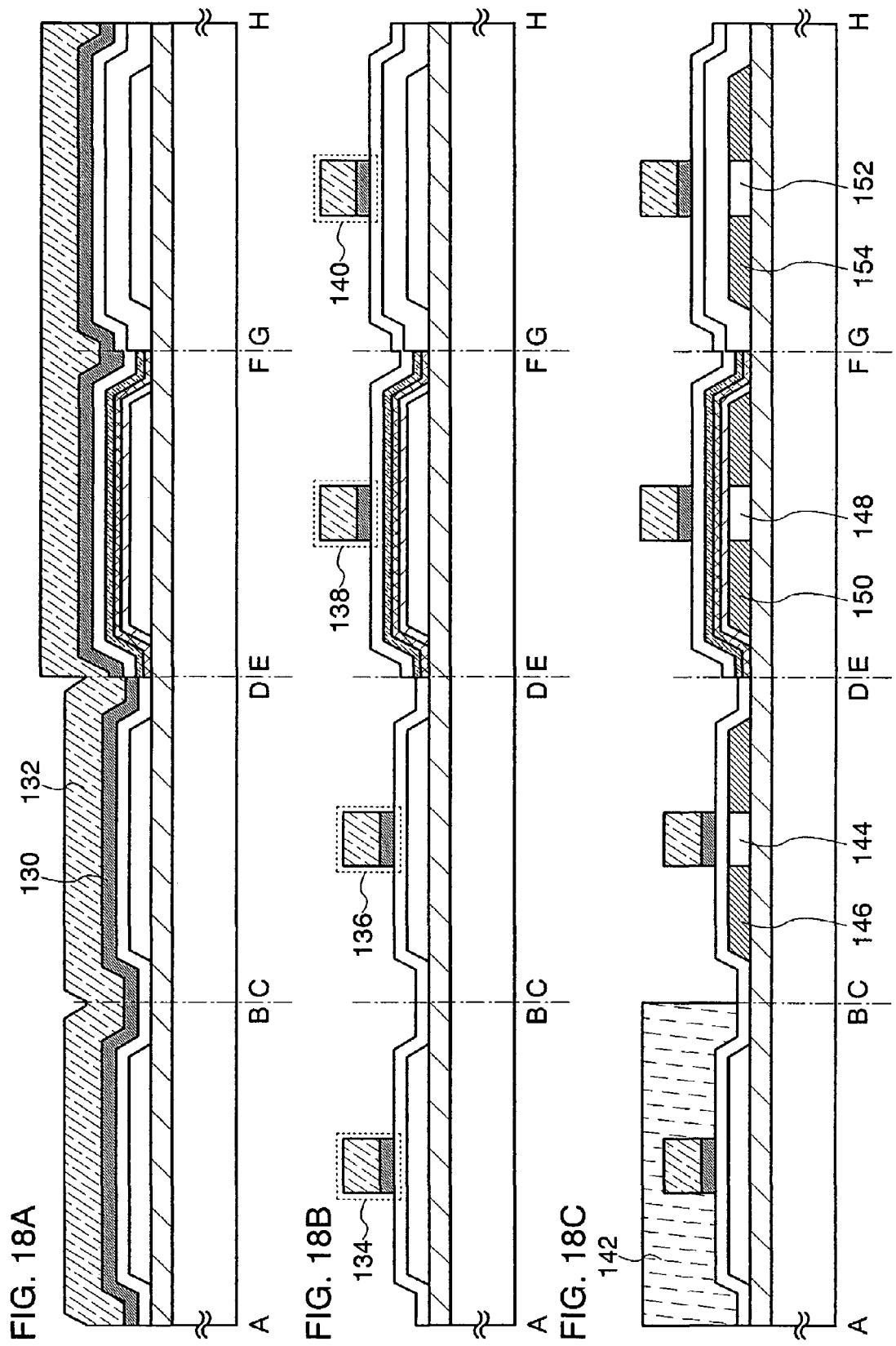

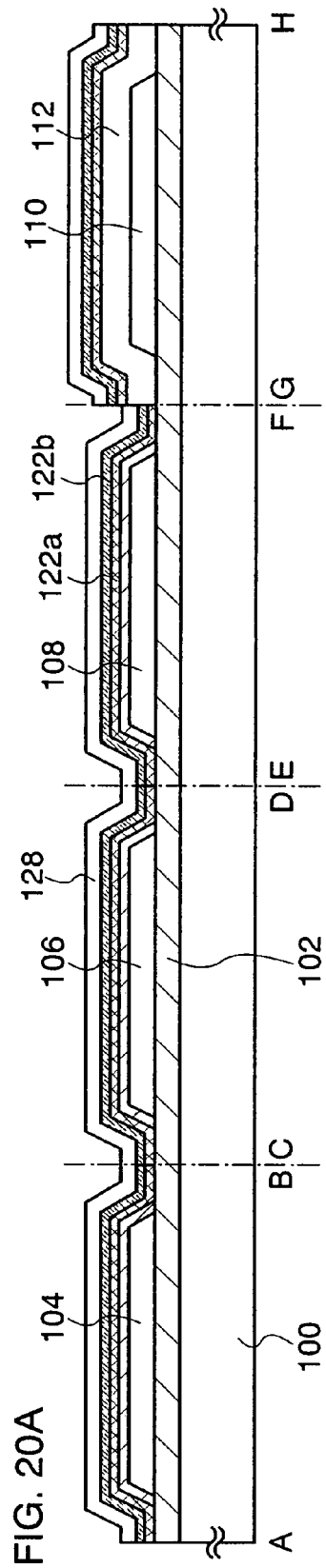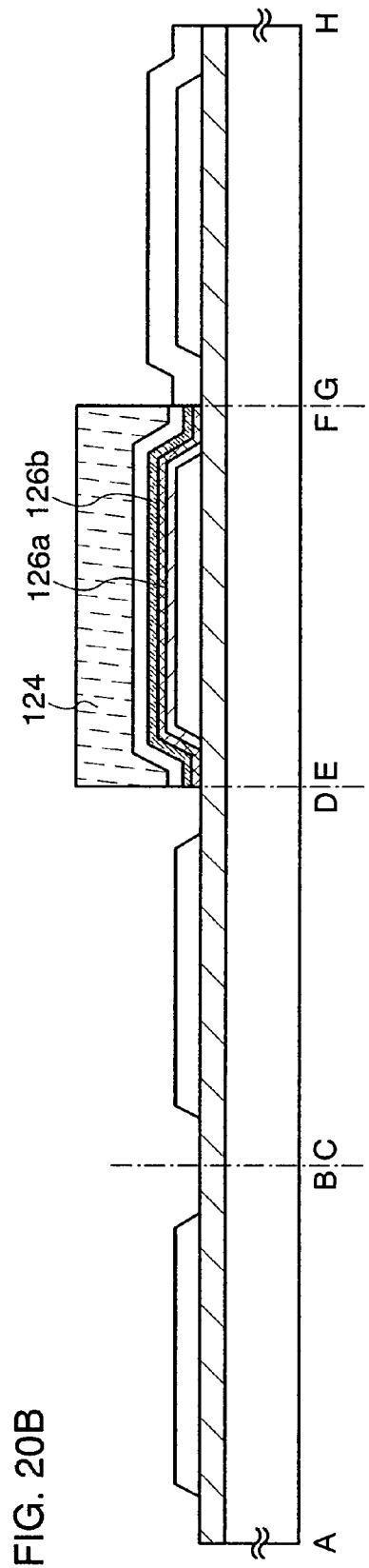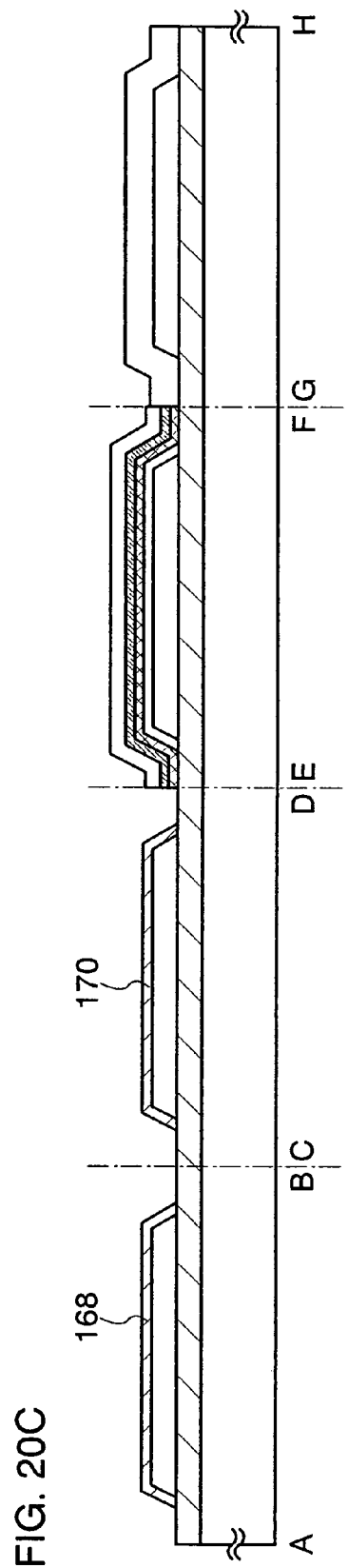

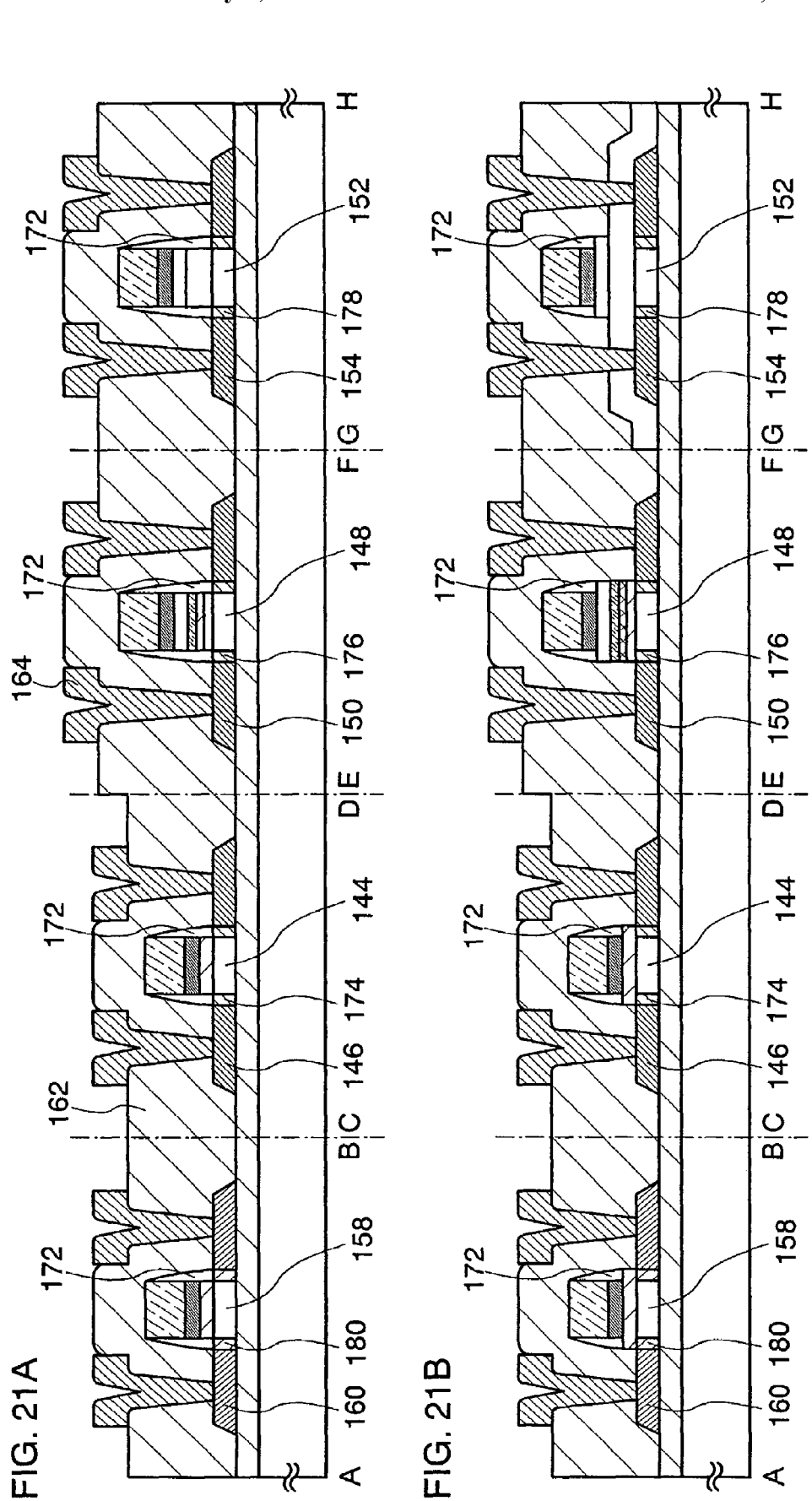

FIG. 23
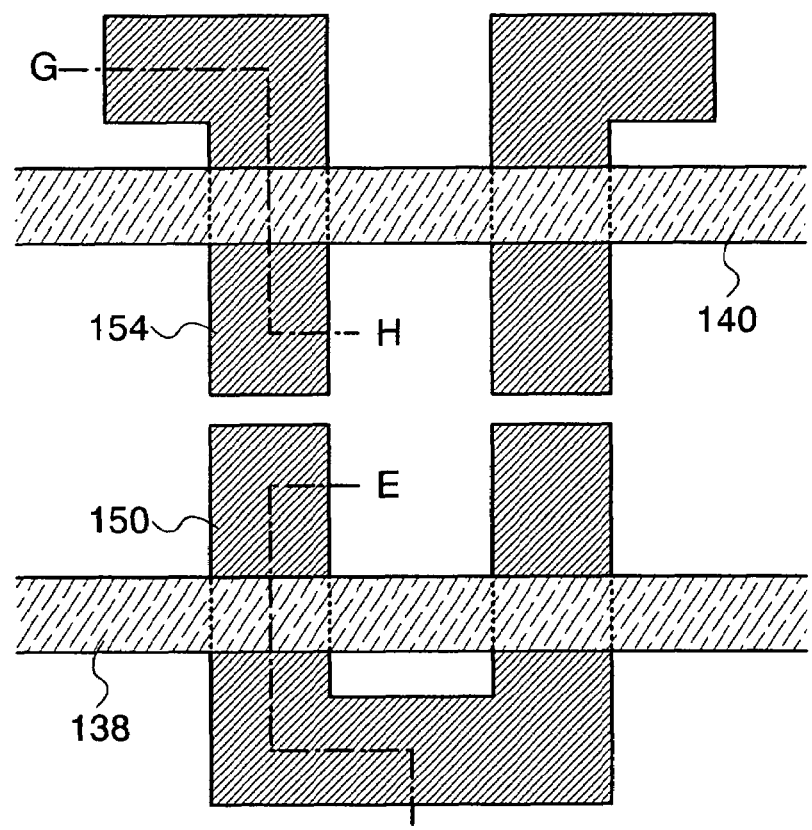
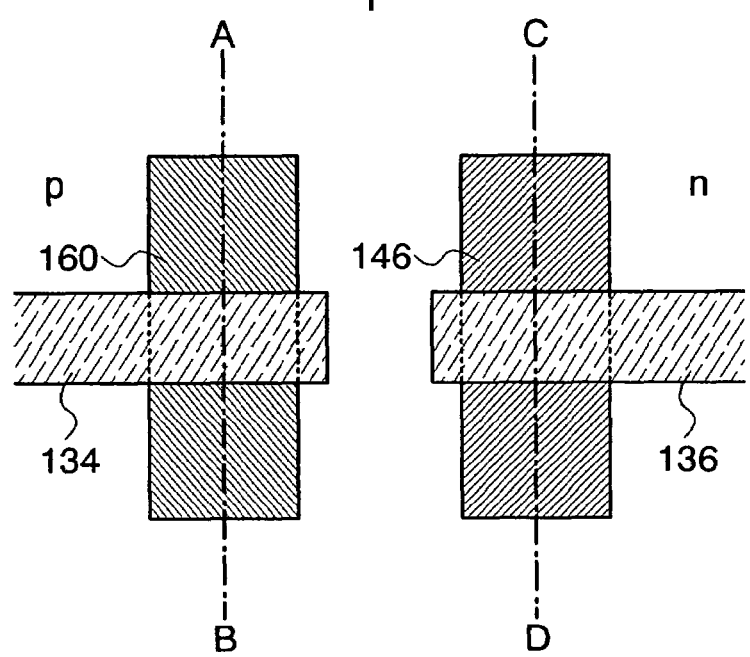

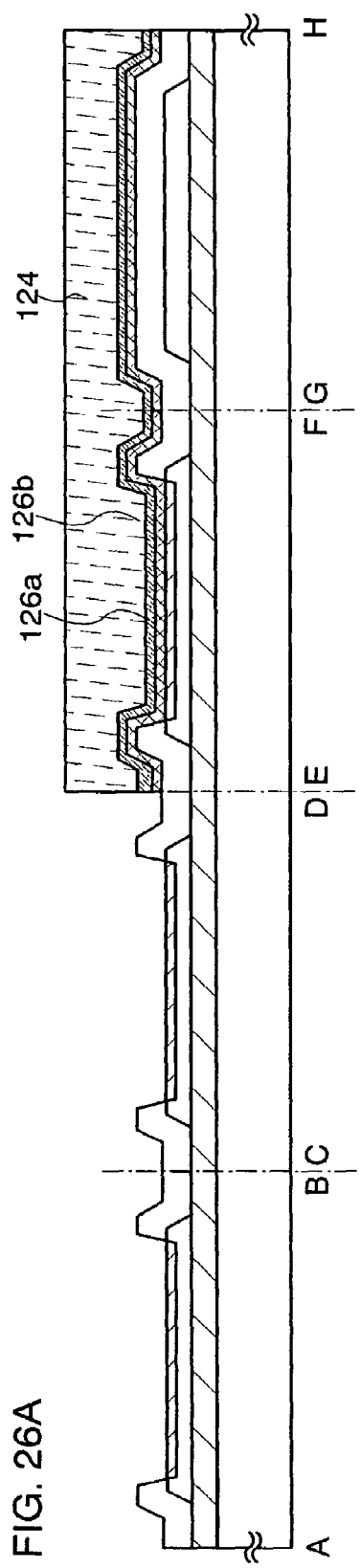
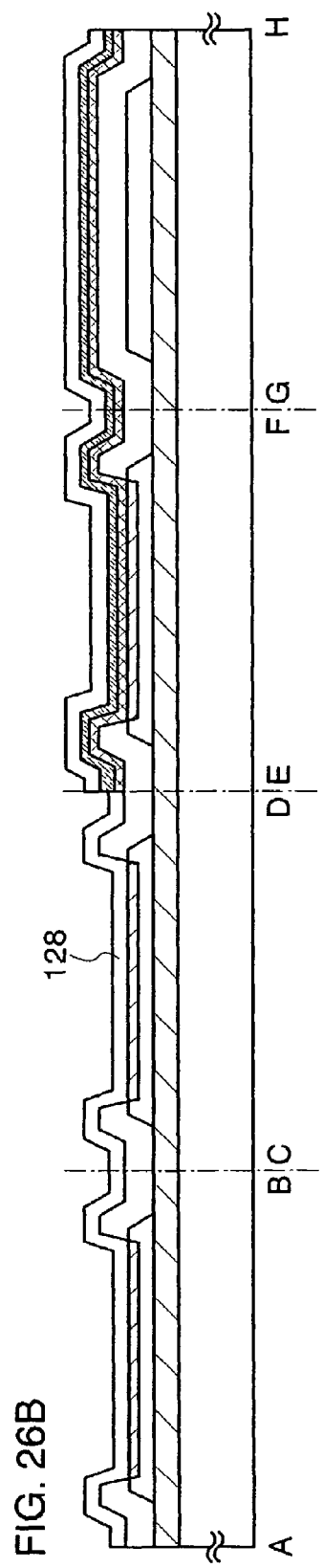
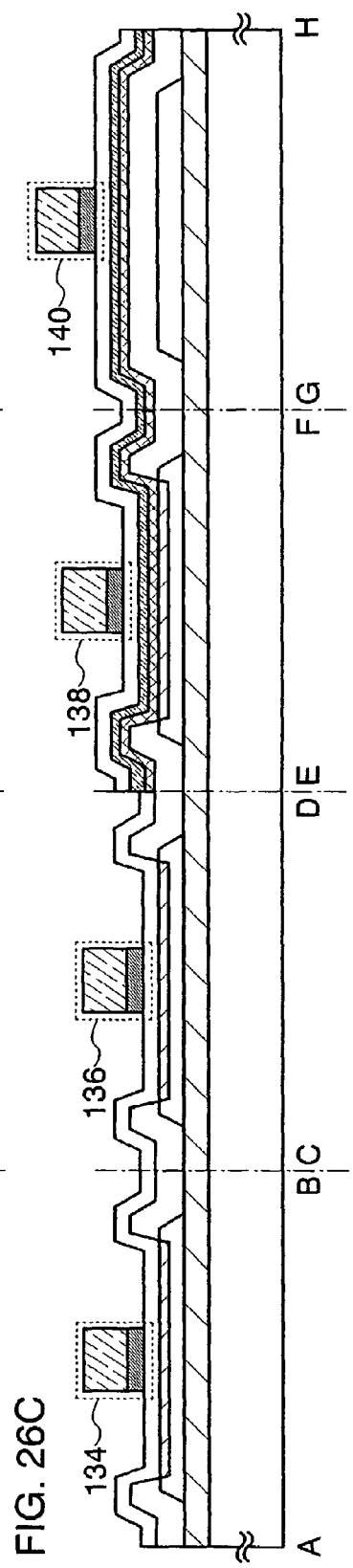
FIG. 26A
FIG. 26B
FIG. 26C

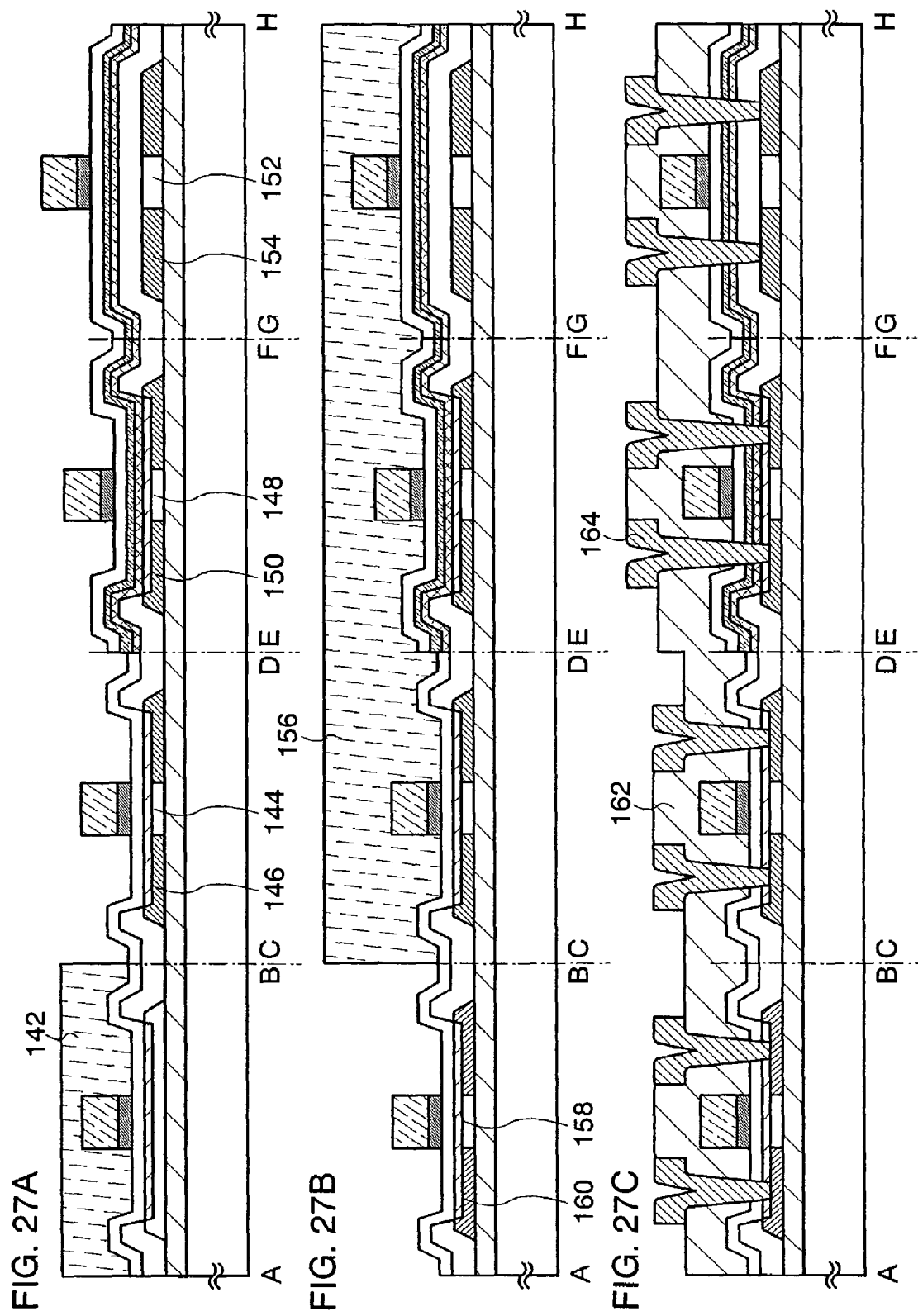

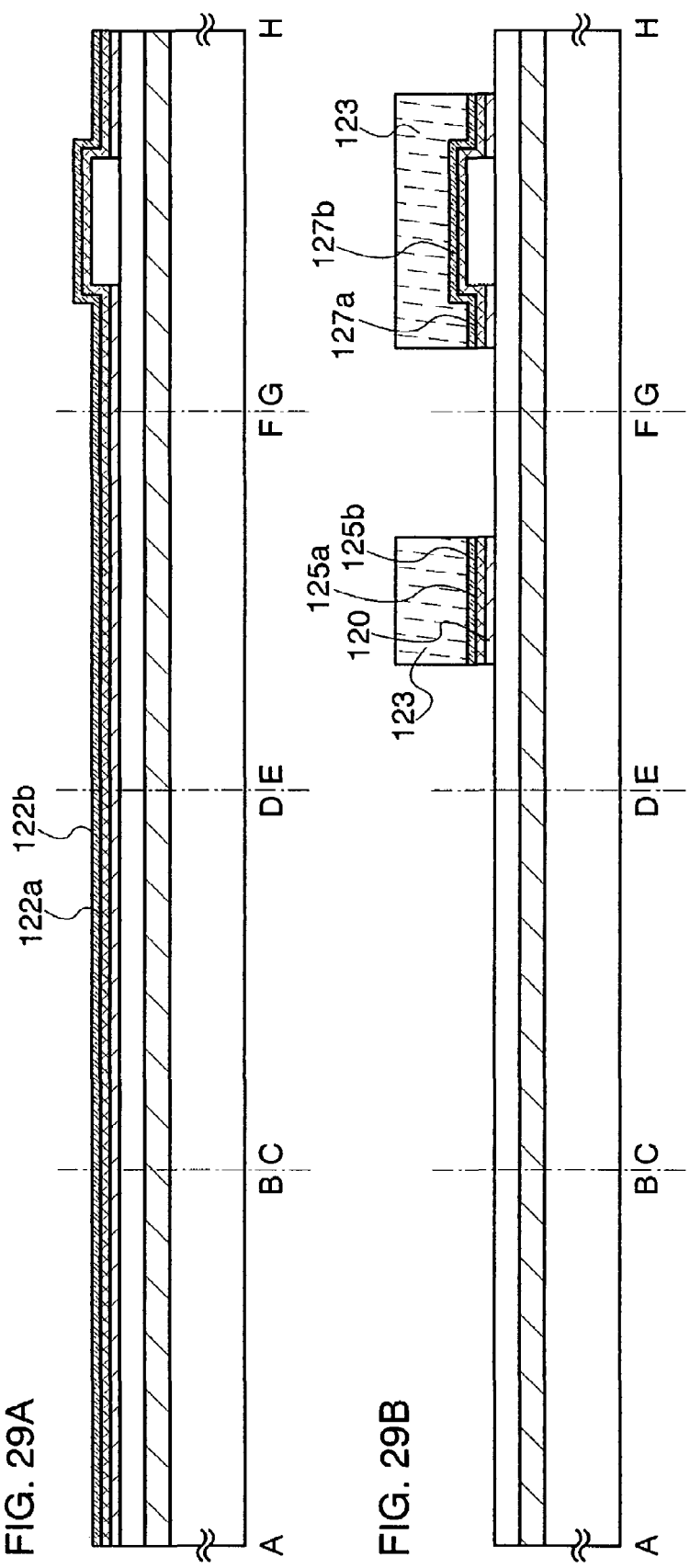

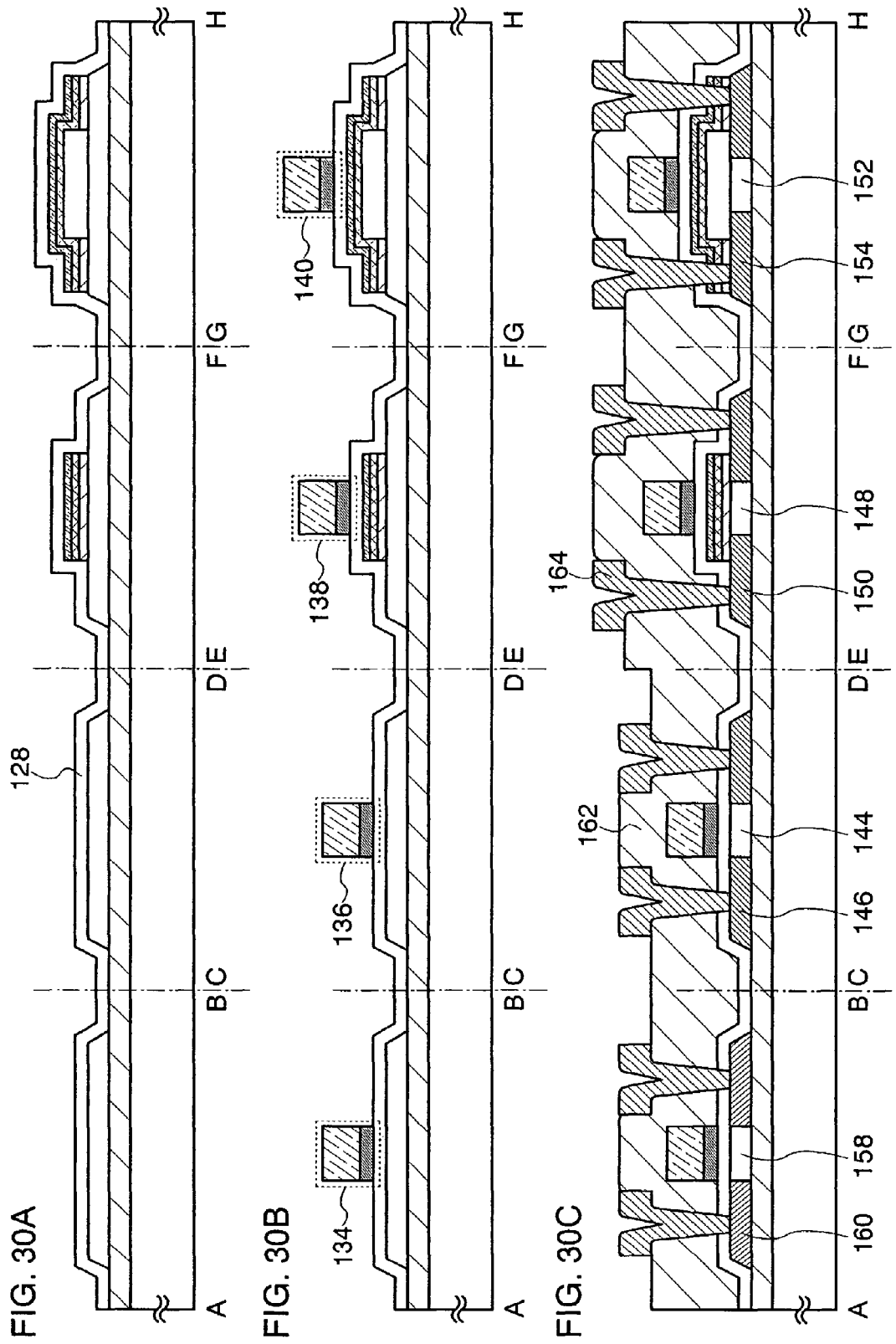

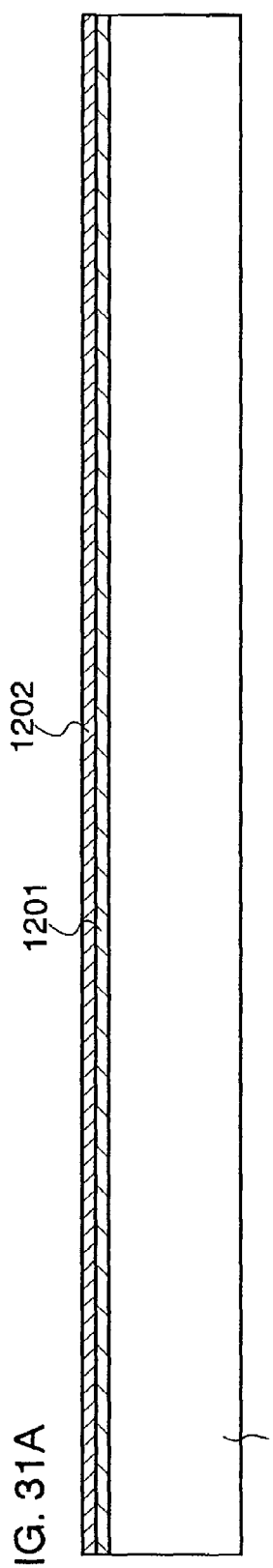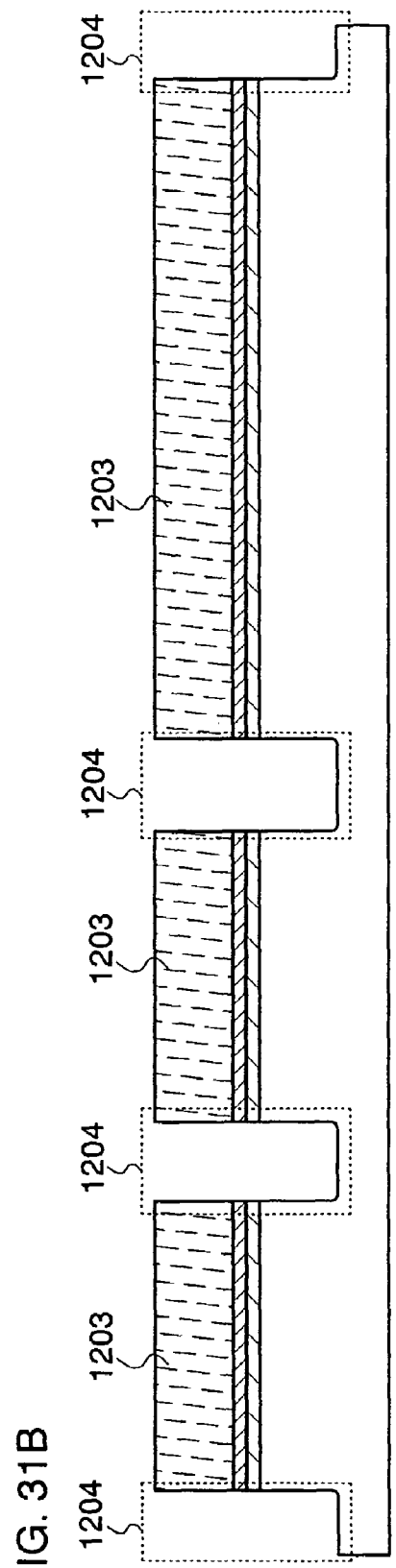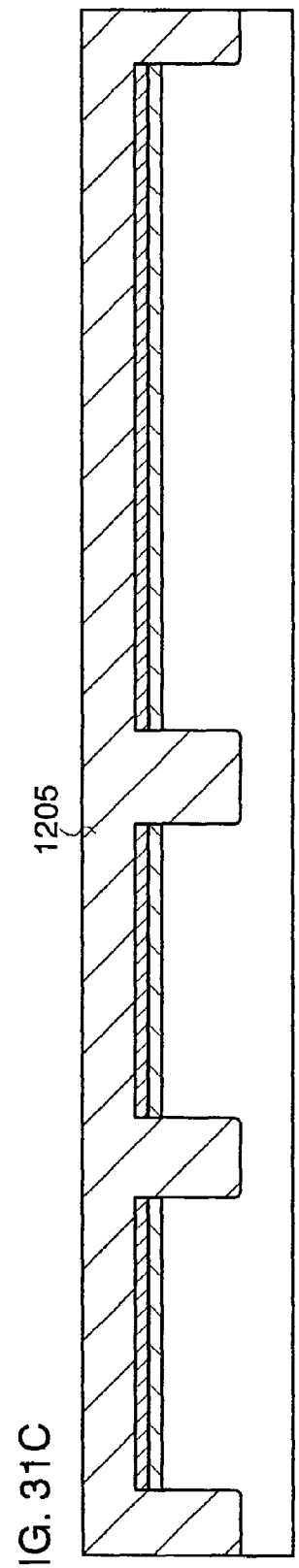

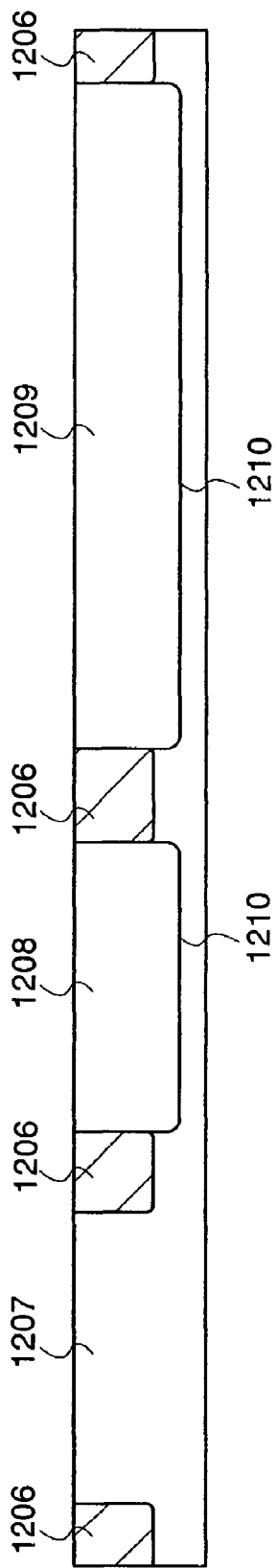
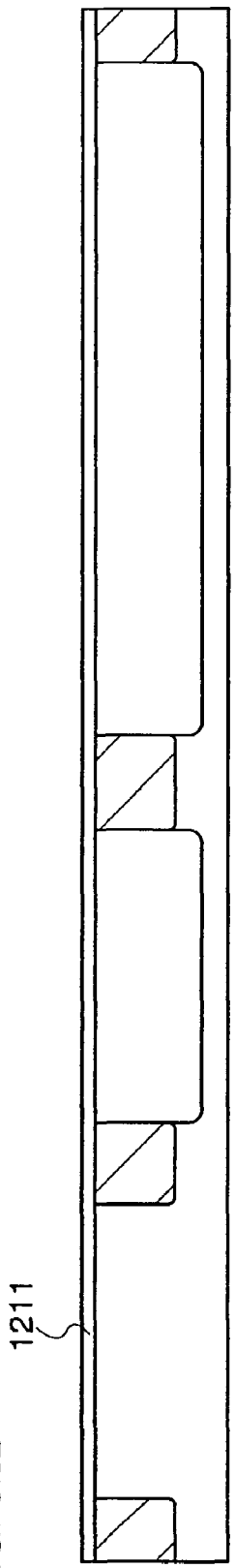
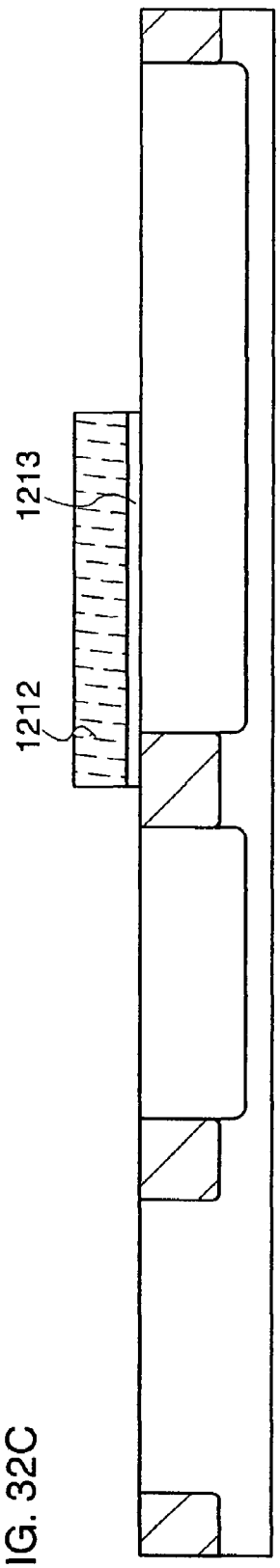
FIG. 32A
FIG. 32B
FIG. 32C

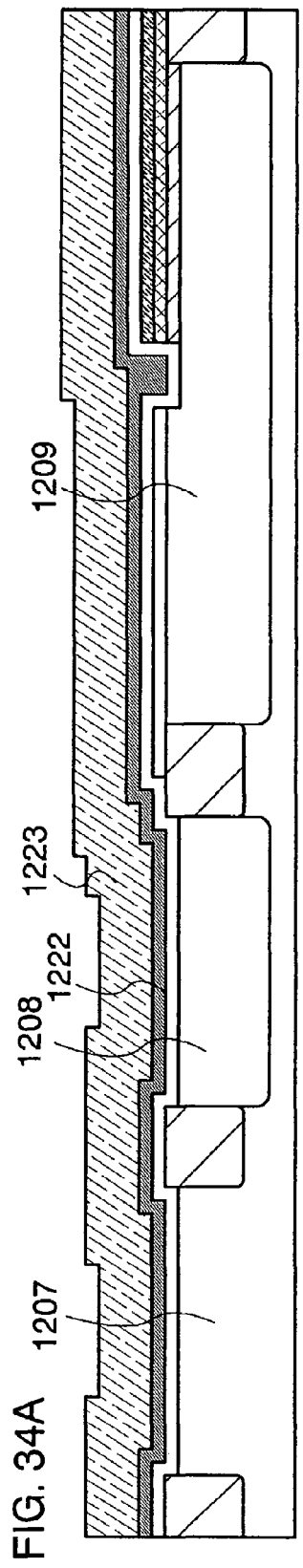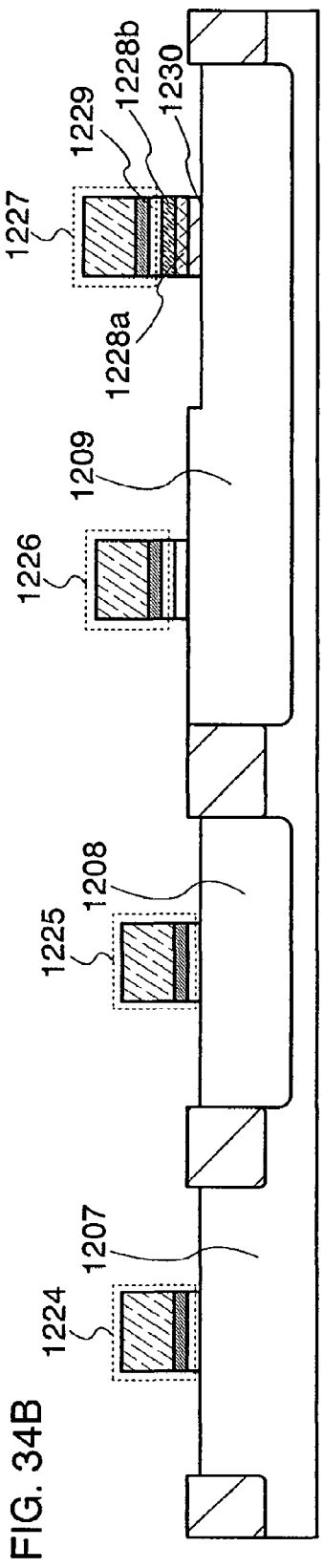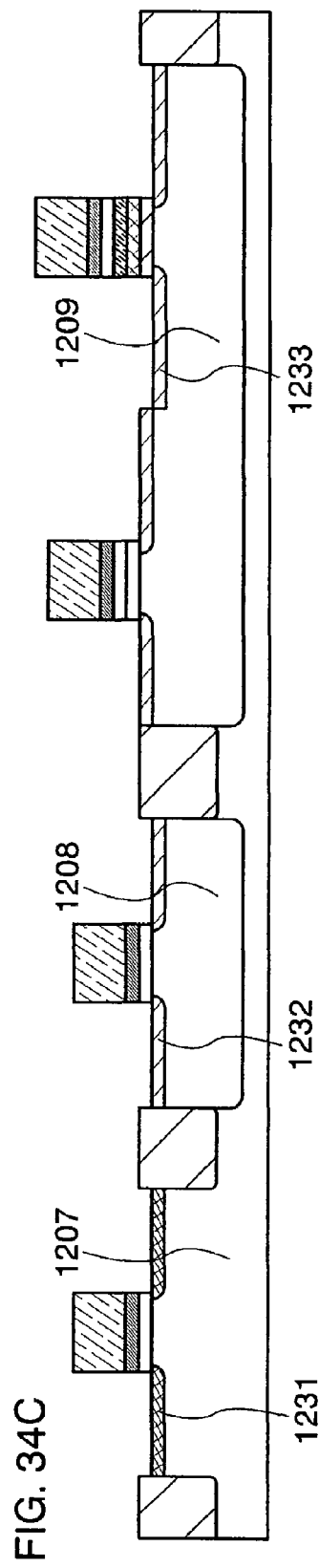

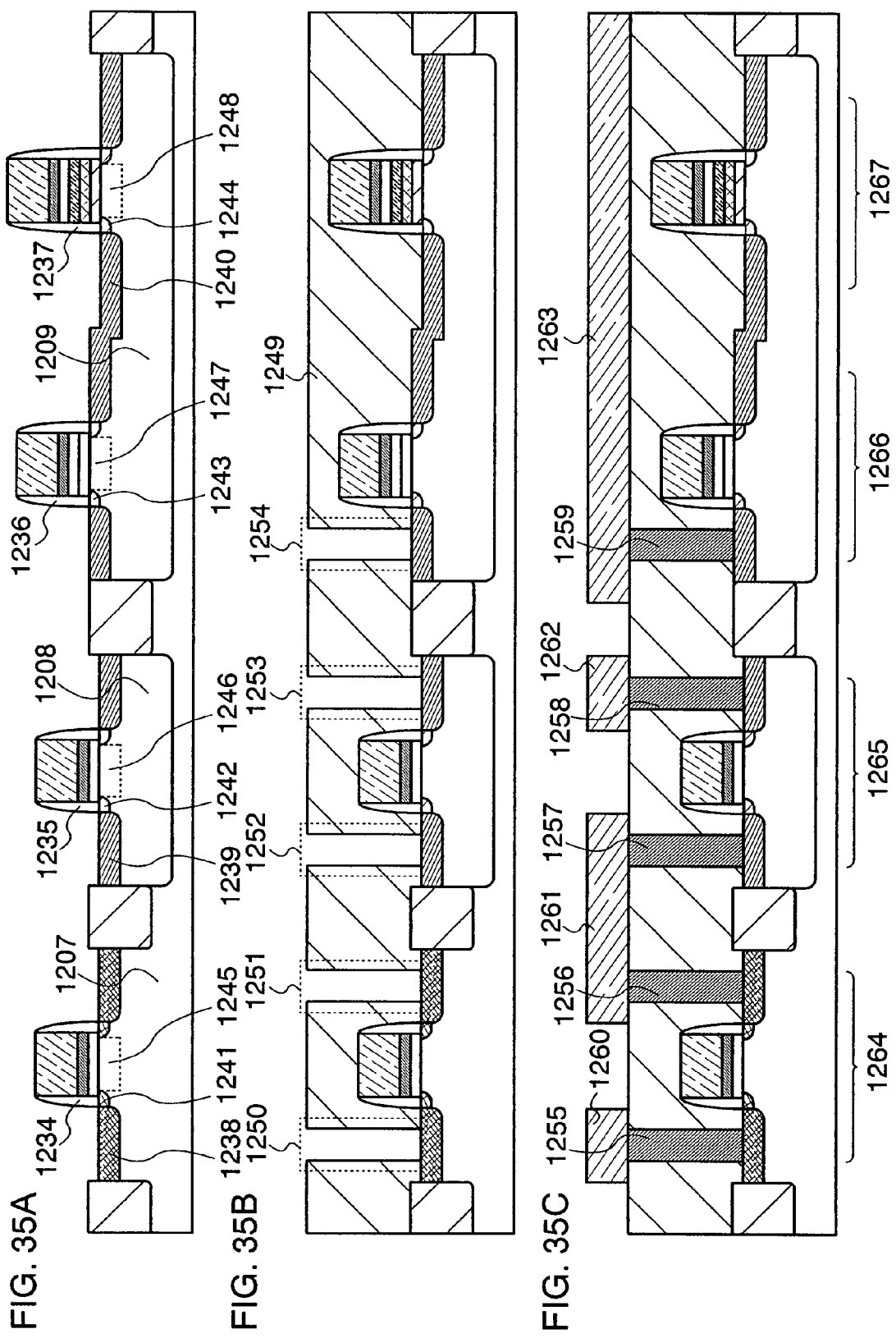

1263

1260     1261     1262

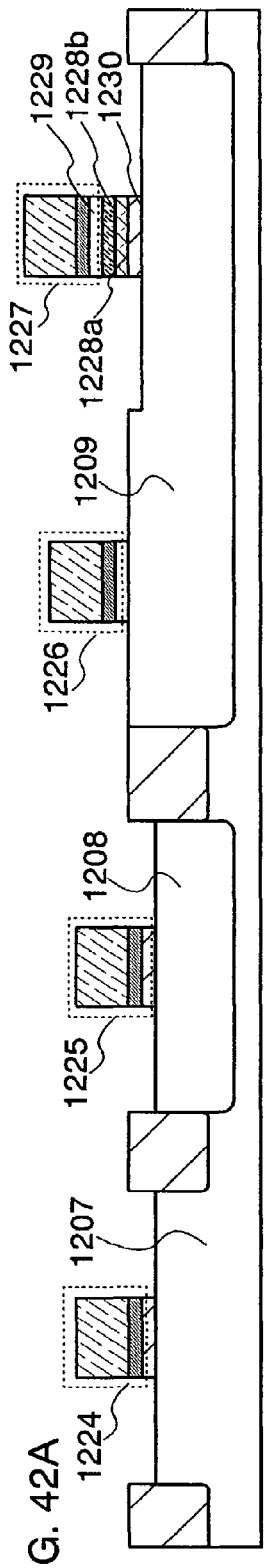
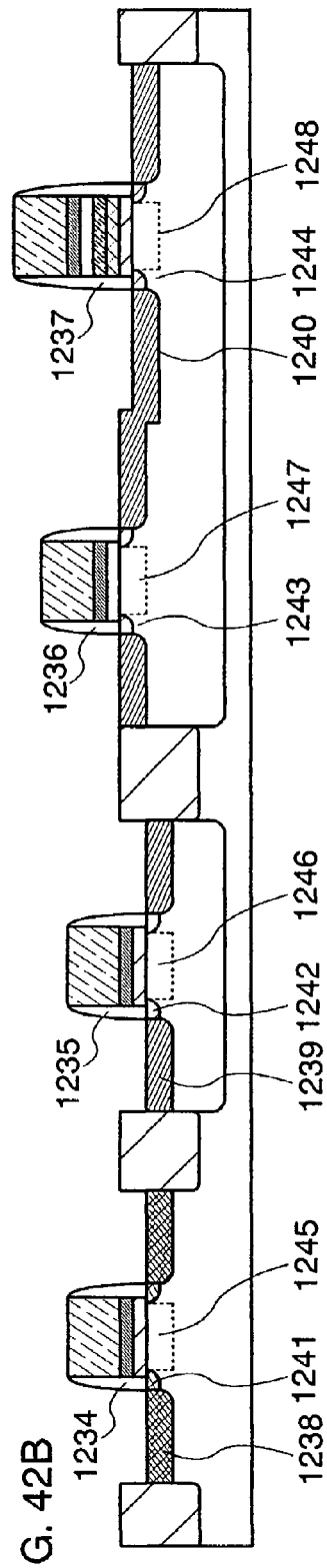
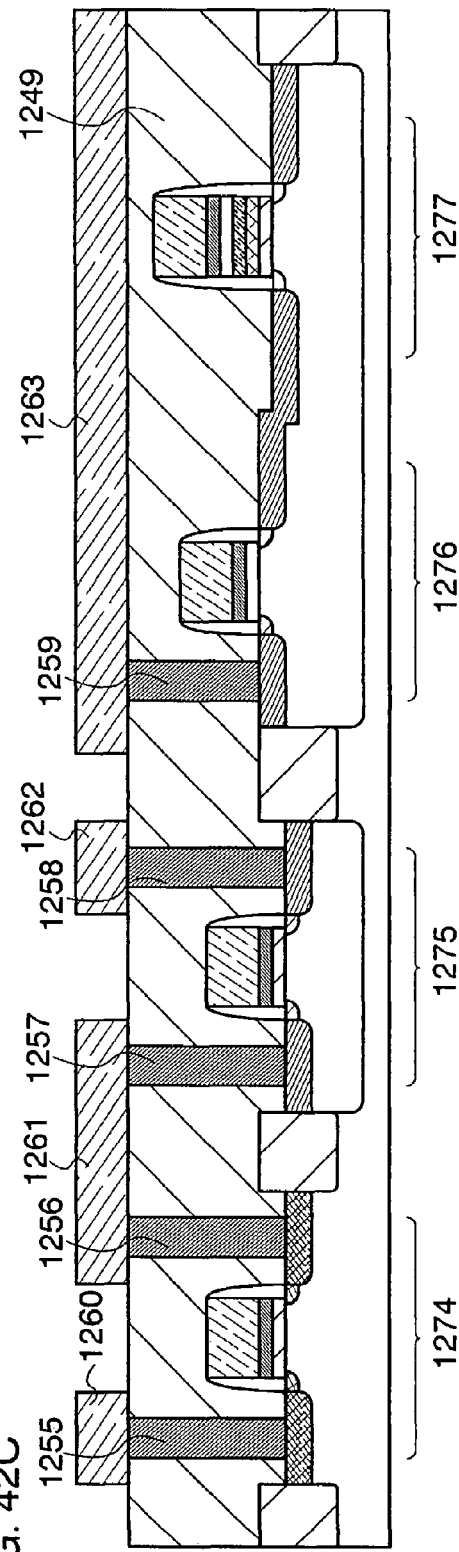

FIG. 46
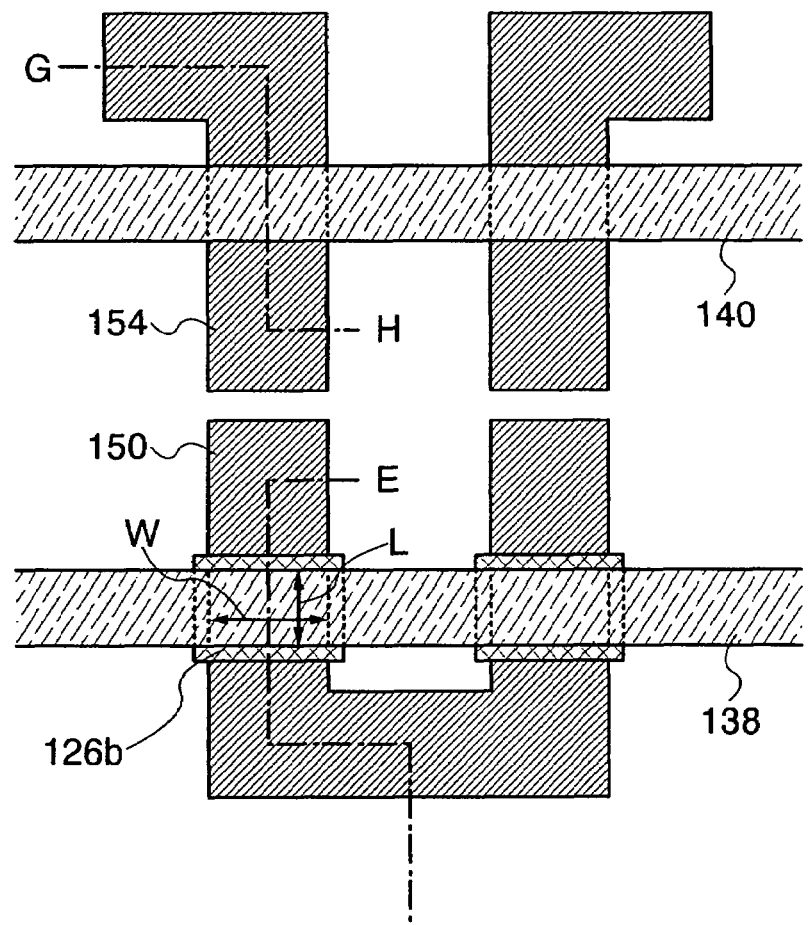
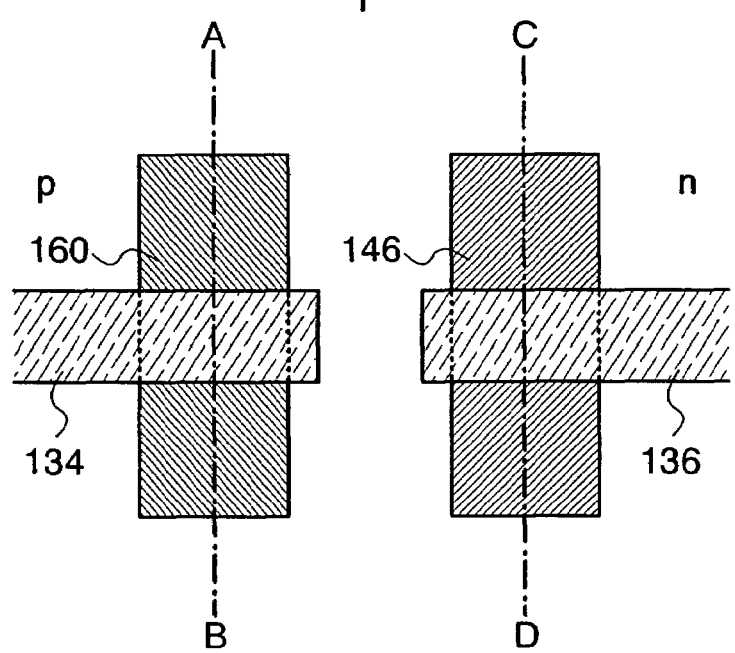

NONVOLATILE SEMICONDUCTOR MEMORY DEVICE

BACKGROUND OF THE INVENTION

1. Field of the Invention

The present invention relates to a nonvolatile semiconductor memory device capable of electrical writing, reading, and erasing, and a manufacturing method thereof. In particular, the present invention relates to a structure of a charge storage layer in the nonvolatile semiconductor memory device.

2. Description of the Related Art

A market of nonvolatile memory capable of electrically rewriting data and storing data even when power is turned off has been expanded. The nonvolatile memory has a similar structure to that of MOSFET (Metal Oxide Semiconductor Field Effect Transistor) and has a feature in that a region capable of storing charge for a long period of time is provided over a channel formation region. This charge storage region is formed over an insulating layer and is insulated and isolated from a peripheral region; accordingly, the charge storage region is referred to as a floating gate. A control gate is provided over the floating gate with another insulating layer interposed therebetween.

In so-called floating gate type nonvolatile memory having such a structure, an operation in which charge is stored in a floating gate and the charge is discharged is performed by voltage applied to a control gate. That is, when the charge which is to be retained in the floating gate is taken in and out, data is stored. Specifically, the charge is injected into or extracted from the floating gate by application of high voltage between a semiconductor layer in which a channel formation region is formed and the control gate. It is said that, at this time, Fowler-Nordheim (F-N) type tunnel current (NAND type) or a thermoelectron (NOR type) flows through an insulating layer formed over the channel formation region. Accordingly, the insulating layer is also referred to as a tunnel insulating layer.

It is necessary for the floating gate type nonvolatile memory to have a characteristic of being able to retain charge stored in the floating gate for more than ten years in order to assure reliability. Therefore, it is necessary for the tunnel insulating layer to be formed to be thick enough to make tunnel current flow and to have a high insulating property so that the charge is not leaked.

In addition, the floating gate formed over the tunnel insulating layer is formed of silicon that is the same semiconductor material as that used for the semiconductor layer in which the channel formation region is formed. Specifically, a method in which the floating gate is formed of polycrystalline silicon has been common, and for example, a floating gate formed in such a manner that a polysilicon film is deposited to a thickness of 400 nm has been known (see Patent Document 1: Japanese Published Patent Application No. 2000-58685 (Page 7, FIG. 7)).

SUMMARY OF THE INVENTION

Since a floating gate of nonvolatile memory is formed of polycrystalline silicon, energy level at a bottom of the conduction band is the same as that of a semiconductor layer (a channel formation region) formed of the same silicon material. When the thickness of polycrystalline silicon of the floating gate is made thin, the energy level at the bottom of the conduction band is higher than that of the semiconductor layer for forming the channel formation region. When such a difference in the energy level is generated, injection of electrons into the floating gate from the semiconductor layer becomes difficult, and accordingly, writing voltage is increased.

A thickness of a tunnel insulating layer provided between the floating gate and the semiconductor layer may be thin for writing at low voltage. On the other hand, it is necessary for the thickness of the tunnel insulating layer to be thick to prevent charge from leaking and prevent impurities from entering, in order to stably retain the charge for a long period of time.

From such the present condition, in conventional nonvolatile memory, high writing voltage is necessary for writing of information. In addition, with respect to deterioration of a charge retention property due to repeated rewriting, a response such as error detection or error correction is made by installation of a redundant memory cell and device of a controller, and thus, reliability is ensured.

It is an object of the present invention to provide a nonvolatile semiconductor memory device which is excellent in a writing property and a charge retention property. In addition, it is another object of the present invention to provide a nonvolatile semiconductor memory device capable of reducing writing voltage.

One feature of the present invention is a nonvolatile semiconductor memory device having a semiconductor layer or a semiconductor substrate including a channel formation region between a pair of impurity regions that are formed apart from each other, and a first insulating layer, a plurality of layers formed of different nitride compounds, a second insulating layer, and a control gate that are formed in a position which is over the semiconductor layer or the semiconductor substrate and overlaps with the channel formation region. In the present invention, when at least one or more of the plurality of layers formed of different nitride compounds is formed of a layer which has an insulating property and is capable of trapping charge, a plurality of sites (traps) for retaining charge is included in at least one of the different nitride compound layers or at an interface between the different nitride compound layers; accordingly, charge can be retained in the region and the region can serve as a charge storage layer.

As at least one of the materials for the plurality of layers formed of different nitride compounds, the following is given: germanium nitride, germanium nitride to which oxygen is added, germanium nitride to which oxygen and hydrogen are added, or the like. In addition, a germanium compound such as germanium oxide, germanium oxide to which nitrogen is added, or germanium oxide to which nitrogen and hydrogen are added, or the like can be selected.

In addition, as at least one of materials for the plurality of layers formed of different nitride compounds, the following is given: silicon nitride, silicon nitride to which oxygen is added, silicon nitride to which oxygen and hydrogen are added, or the like. In addition, a silicon nitride compound such as silicon oxide to which nitrogen is added or silicon oxide to which nitrogen and hydrogen are added, or the like can be selected.

Moreover, as at least one of materials for the plurality of layers formed of different nitride compounds, the following can be selected: an aluminum nitride compound such as aluminum nitride, aluminum nitride to which oxygen is added, or aluminum nitride to which oxygen and hydrogen are added, or the like.

It is preferable that the first insulating layer be formed by solid-phase oxidation or solid-phase nitridation by plasma treatment performed to a surface of the semiconductor layer or the semiconductor substrate. Since the insulating layer formed by the method is dense, has high withstand voltage, and is excellent in reliability, the thickness of the insulating layer can be made thin, and is suitable for the first insulating layer that is a tunnel insulating layer for injecting charge into a charge storage layer.

It is preferable that, in the nonvolatile semiconductor memory device of the present invention, the semiconductor layer be formed over an insulating surface and be separated into island-shapes. It is preferable that at least a semiconductor layer for forming a memory element and a semiconductor layer for forming a logic circuit be separated. That is, one feature of the present invention is a nonvolatile semiconductor memory device having a semiconductor layer including a channel formation region between a pair of impurity regions that are formed apart from each other, and a first insulating layer, a charge storage layer, a second insulating layer, and a control gate that are formed in a position which is over the semiconductor layer and overlaps with the channel formation region, where the semiconductor layer is formed over an insulating surface.

When different nitride compound layers are stacked over a semiconductor region (a semiconductor layer or a semiconductor substrate) with a first insulating layer serving as a tunnel insulating layer interposed therebetween and at least one or more of the nitride compound layers serve as charge storage layers, a plurality of sites (traps) for retaining charge is included in at least one of the different nitride compound layers or at an interface between the different nitride compound layers; accordingly, charge is easily retained. In addition, when a layer formed of a germanium compound, silicon nitride compound, aluminum nitride compound, or the like having an insulating property is used as one of the different nitride compound layers, a charge storage layer has an insulating property; therefore, even if the first insulating layer has defects, leak of charge retained in the charge storage layer into the semiconductor layer can be reduced. Consequently, a charge retention property of the charge storage layer can be improved and the thickness of the first insulating layer can be made thin, and thus, writing can be performed at low voltage.

BRIEF DESCRIPTION OF DRAWINGS

In the accompanying drawings:

FIG. 10 is a diagram showing an example of a NAND type nonvolatile memory cell array;

FIGS. 16A to 16C are each a view for showing an example of a manufacturing method of a nonvolatile semiconductor memory device of the present invention;

FIGS. 17A to 17C are each a view for showing an example of a manufacturing method of a nonvolatile semiconductor memory device of the present invention;

FIGS. 18A to 18C are each a view for showing an example of a manufacturing method of a nonvolatile semiconductor memory device of the present invention;

FIGS. 20A to 20C are each a view for showing an example of a manufacturing method of a nonvolatile semiconductor memory device of the present invention;

FIGS. 21A and 21B are each a view for showing an example of a manufacturing method of a nonvolatile semiconductor memory device of the present invention;

FIG. 23 is a view for showing an example of a top surface of a nonvolatile semiconductor memory device of the present invention;

FIGS. 26A to 26C are each a view for showing an example of a manufacturing method of a nonvolatile semiconductor memory device of the present invention;

FIGS. 27A to 27C are each a view for showing an example of a manufacturing method of a nonvolatile semiconductor memory device of the present invention;

FIGS. 29A to 29C are each a view for showing an example of a manufacturing method of a nonvolatile semiconductor memory device of the present invention;

FIGS. 30A to 30C are each a view for showing an example of a manufacturing method of a nonvolatile semiconductor memory device of the present invention;

FIGS. 31A to 31C are each a view for showing an example of a manufacturing method of a nonvolatile semiconductor memory device of the present invention;

FIGS. 32A to 32C are each a view for showing an example of a manufacturing method of a nonvolatile semiconductor memory device of the present invention;

FIGS. 34A to 34C are each a view for showing an example of a manufacturing method of a nonvolatile semiconductor memory device of the present invention;

FIGS. 35A to 35C are each a view for showing an example of a manufacturing method of a nonvolatile semiconductor memory device of the present invention;

FIGS. 42A to 42C are each a view for showing an example of a manufacturing method of a nonvolatile semiconductor memory device of the present invention;

FIG. 46 is a view for showing an example of a top surface of a nonvolatile semiconductor memory device of the present invention;

DETAILED DESCRIPTION OF THE INVENTION

Figure 1A:
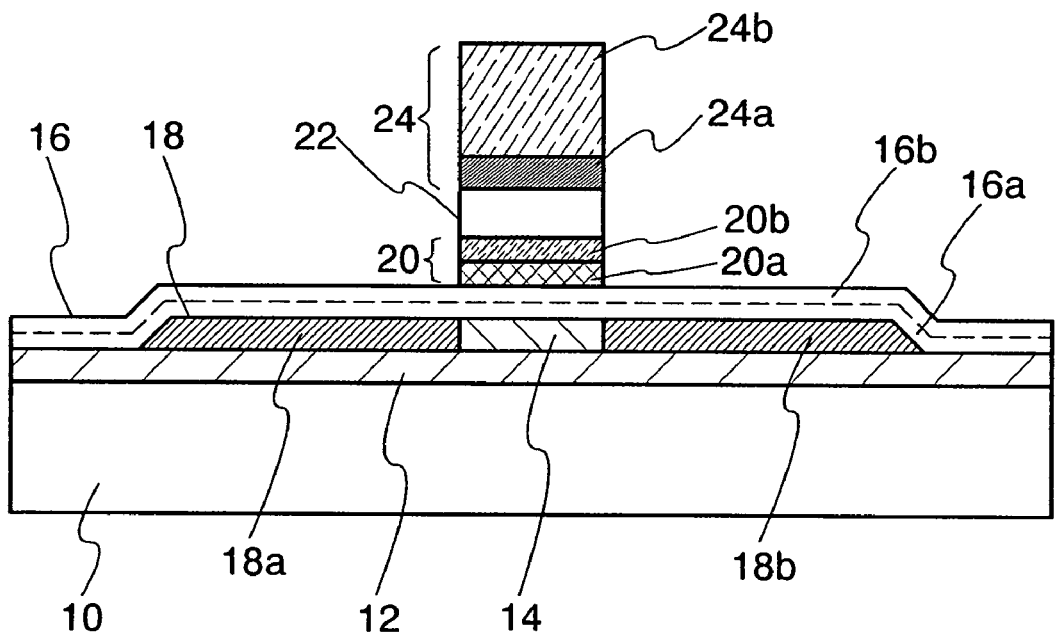
FIGS. 1A and 1B are each a cross-sectional view for describing a main structure of a nonvolatile semiconductor memory device of the present invention.

Hereinafter, embodiment modes of the present invention will be explained with reference to the drawings. However, the present invention is not limited to the explanation below, and it is easily understood by those skilled in the art that modes and details of the present invention can be modified in various ways without departing from the purpose and the scope of the present invention. Therefore, the present invention is not interpreted as being limited to the description of the embodiment modes to be given below. It is to be noted that, in structures of the present invention explained below, the same reference numeral is used in common to denote the same component in different drawings.

Embodiment Mode 1

Figure 1B:
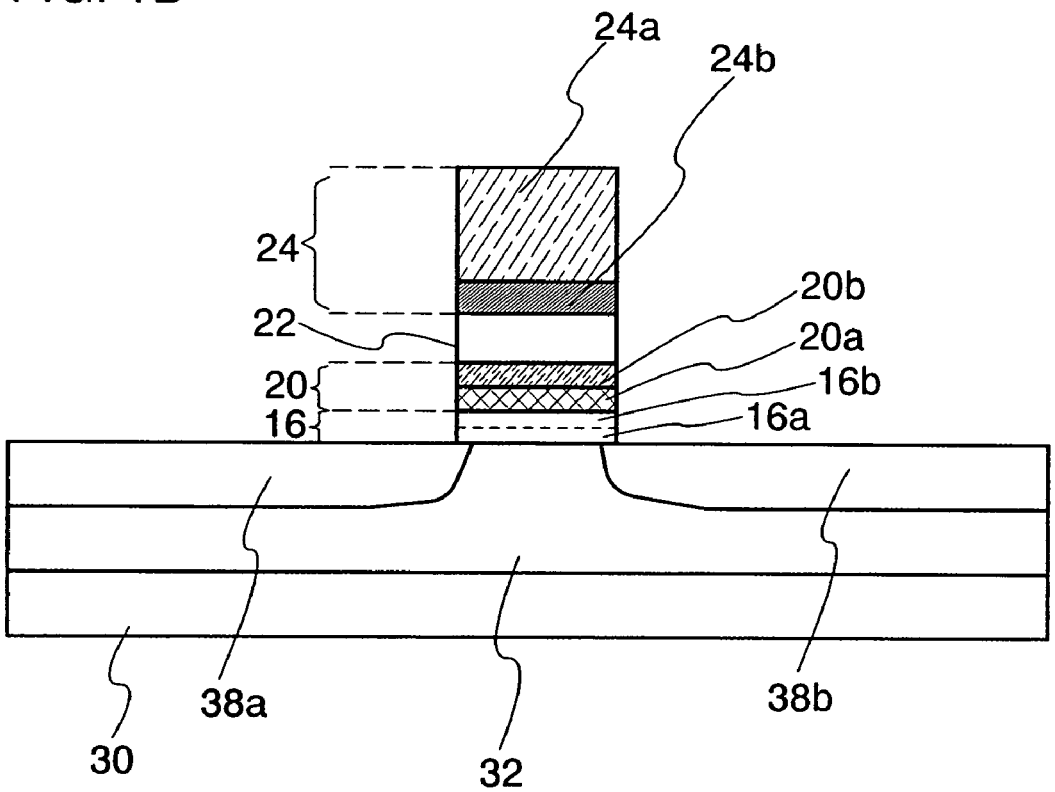

FIGS. 1A and 1B are each a cross-sectional view for explaining a main structure of a nonvolatile semiconductor memory device of the present invention. In particular, FIG. 1A shows a main portion of a nonvolatile memory element. This nonvolatile memory element is formed using a substrate 10 having an insulating surface. As the substrate 10 having the insulating surface, a glass substrate, a quartz substrate, a sapphire substrate, a ceramic substrate, a metal substrate over which an insulating layer is formed, or the like can be used.

A semiconductor layer 18 is formed over the substrate 10 having the insulating surface. An insulating layer 12 serving as a base film may be provided between the substrate 10 and the semiconductor layer 18. This insulating layer 12 prevents an impurity such as alkali metal from diffusing into the semiconductor layer 18 from the substrate 10 and contaminating the semiconductor layer 18, and may be appropriately provided as a blocking layer.

The insulating layer 12 is formed using an insulating material such as silicon oxide, silicon nitride, or silicon containing oxygen and nitrogen (silicon oxynitride) by a CVD method, a sputtering method, or the like. For example, in the case where the insulating layer 12 has a two-layered structure, a silicon oxynitride layer may be formed as a first insulating layer and a silicon oxynitride layer having a different composition from that of the first silicon oxynitride layer may be formed as a second insulating layer. Alternatively, a silicon nitride layer may be formed as the first insulating layer and a silicon oxide layer may be formed as the second insulating layer.

It is preferable that the semiconductor layer 18 be formed of a single-crystal semiconductor or a polycrystalline semiconductor. For example, a semiconductor layer formed over an entire surface of the substrate 10 by a sputtering method, a plasma CVD method, or a low-pressure CVD method is crystallized, and then, the semiconductor layer is selectively etched, whereby a plurality of semiconductor layers 18 can be formed. That is, for the purpose of element separation, it is preferable that a plurality of island-shaped semiconductor layers be formed over an insulating surface and one or a plurality of nonvolatile memory elements be formed using the semiconductor layers. As a semiconductor material, silicon is preferably used, and besides, a silicon germanium semiconductor can also be used. As a crystallization method of the semiconductor film, the following method can be used: a laser crystallization method; a crystallization method by heat treatment using rapid thermal annealing (RTA) or an annealing furnace; a crystallization method using a metal element that promotes crystallization; or a method in which these methods are combined.

In this way, by separation of the semiconductor layer formed over the insulating surface into island shapes, elements can be separated effectively even in the case where a memory element array and a peripheral circuit are formed over the same substrate. That is, even if a memory element array that needs voltage of approximately 10 to 20 V for writing and erasing and a peripheral circuit, mainly used for inputting and outputting data and controlling commands, that is operated at voltage of 3 to 7 V are formed over the same substrate, mutual interference due to a difference in the voltage applied to each element can be prevented.

A p-type impurity may be injected into the semiconductor layer 18. For the p-type impurity, for example, boron may be used and added at a concentration of approximately $5\times10^{15}$ atoms/cm$^3$ to $1\times10^{16}$ atoms/cm$^3$. This p-type impurity is used to control threshold voltage of a transistor, and by addition of the p-type impurity to a channel formation region 14, the transistor operates effectively. The channel formation region 14 is formed in a region which roughly overlaps with a control gate electrode 24 and is interposed between a pair of impurity regions of the semiconductor layer 18.

The pair of impurity regions 18a and 18b are regions each of which serves as a source region or drain region. The pair of impurity regions 18a and 18b are formed by doping of phosphorus or arsenic, which is an n-type impurity, at approximately $1\times10^{19}$ atoms/cm$^3$ to $1\times10^{21}$ atoms/cm$^3$.

A first insulating layer 16 serves as a tunnel insulating layer in a nonvolatile memory element. A second insulating layer 22 serves as a control insulating layer in the nonvolatile memory element. The first insulating layer 16 is formed of silicon oxide or a stacked-layer structure including silicon oxide and silicon nitride. The first insulating layer 16 may be formed by deposition of an insulating layer by a plasma CVD method or a low-pressure CVD method; however, the first insulating layer 16 is preferably formed by solid-phase oxidation or solid-phase nitridation by plasma treatment. This is because the insulating layer formed using the semiconductor layer (typically, a silicon layer) to which oxidation or nitridation by plasma treatment is performed has denseness, high withstand voltage, and excellent reliability. Since the first insulating layer 16 is used as a tunnel insulating layer for injecting charge into a charge storage layer 20, the first insulating layer 16 is strong enough that an insulating property can be maintained even when the thickness is reduced, which is preferable. It is preferable that this first insulating layer 16 be formed to a thickness of greater than or equal to 1 nm and less than or equal to 10 nm, more preferably, greater than or equal to 1 nm and less than or equal to 5 nm. For example, in the case where gate length is set to be 600 nm, the first insulating layer 16 can be formed to a thickness of greater than or equal to 1 nm and less than or equal to 3 nm.

It is preferable that plasma that has an electron density of greater than or equal to $1\times10^{11}$ cm$^{-3}$ and less than or equal to $1\times10^{13}$ cm$^{-3}$ and an electron temperature of greater than or equal to 0.5 eV and less than or equal to 1.5 eV and that has been excited by a microwave (typically, a microwave with a frequency of 2.45 GHz) be used for solid-phase oxidation treatment or solid-phase nitridation treatment by plasma treatment. This is for obtaining practical reaction rate as well as forming a dense insulating layer in the solid-phase oxidation treatment or solid-phase nitridation treatment at a temperature of less than or equal to 500° C.

In the case where the surface of the semiconductor layer 18 is oxidized by this plasma treatment, the plasma treatment is performed under an oxygen atmosphere (for example, an atmosphere containing oxygen ($O_2$) or dinitrogen monoxide ($N_2O$) and a rare gas (containing at least one of He, Ne, Ar, Kr, and Xe), or an atmosphere containing oxygen or dinitrogen monoxide, hydrogen ($H_2$), and a rare gas). In addition, in the case where nitridation is performed by plasma treatment, the plasma treatment is performed under a nitrogen atmosphere (for example, an atmosphere containing nitrogen ($N_2$) and a rare gas (containing at least one of He, Ne, Ar, Kr, and Xe), an atmosphere containing nitrogen, hydrogen, and a rare gas, or an atmosphere containing $NH_3$ and a rare gas). As the rare gas, for example, Ar can be used. Alternatively, a mixed gas of Ar and Kr may be used.

Figure 15:
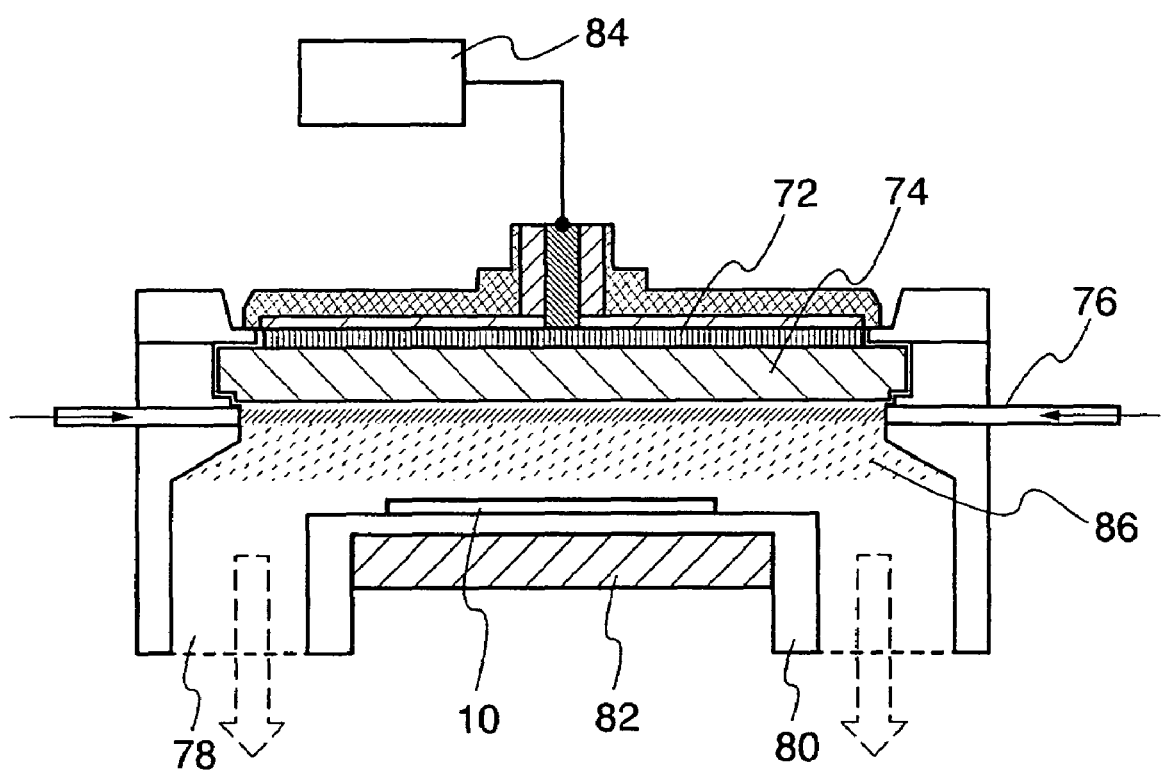
FIG. 15 is a view for describing a structure of a plasma treatment apparatus.

A structural example of an apparatus for performing plasma treatment is shown in FIG. 15. This plasma treatment apparatus includes a supporting base 80 for placing a substrate 10, a gas supply portion 76 for introducing a gas, an exhaust port 78 to be connected to a vacuum pump for exhausting a gas, an antenna 72, a dielectric plate 74, and a microwave supply portion 84 for supplying a microwave for plasma generation. When the supporting base 80 is provided with a temperature control portion 82, a temperature of the substrate 10 can be controlled.

The plasma treatment will be explained below. It is to be noted that the plasma treatment includes oxidation treatment, nitridation treatment, oxynitridation treatment, hydrogenation treatment, and a surface modification treatment to a semiconductor substrate, an insulating layer, and a conductive layer. In such treatment, a gas supplied from the gas supply portion 76 may be selected depending on the purpose.

The oxidation treatment or the nitridation treatment may be performed as follows. First, a treatment chamber is evacuated, and a gas for plasma treatment containing oxygen or nitrogen is introduced from the gas supply portion 76. The substrate 10 is set to be a room temperature, or heated at 100 to 550° C. by the temperature control portion 82. It is to be noted that a space between the substrate 10 and the dielectric plate 74 is approximately 20 to 80 mm (preferably, 20 to 60 mm). Next, a microwave is supplied to the antenna 72 from the microwave supply portion 84. Then, the microwave is introduced into the treatment chamber from the antenna 72 through the dielectric plate 74, whereby plasma 86 is generated. When the plasma is excited by introduction of the microwave, plasma with a low electron temperature (less than or equal to 3 eV, preferably, less than or equal to 1.5 eV) and a high electron density (greater than or equal to $1\times10^{11}$ cm$^{-3}$) can be generated. By an oxygen radical (there is a case where an OH radical is included) and/or a nitrogen radical (there is a case where an NH radical is included) generated by this high density plasma, the surface of the semiconductor layer can be oxidized or nitrided. When a rare gas such as argon is mixed with a gas for plasma treatment, an oxygen radical or a nitrogen radical can be efficiently generated by excited species of the rare gas. In this method, an active radical which is excited by plasma is effectively used, whereby oxidation or nitridation by solid-phase reaction can be performed at a low temperature of less than or equal to 500° C.

An example of a preferable first insulating layer 16 formed by plasma treatment in FIGS. 1A and 1B is as follows. A silicon oxide layer 16a is formed to a thickness of greater than or equal to 3 nm and less than or equal to 6 nm over the surface of the semiconductor layer 18 by plasma treatment under an oxygen atmosphere, and thereafter, the surface of the silicon oxide layer is processed by nitridation plasma under a nitrogen atmosphere, whereby a nitrogen plasma-treated layer 16b is formed. Specifically, first, the silicon oxide layer 16a is formed to a thickness of greater than or equal to 3 nm and less than or equal to 6 nm over the semiconductor layer 18 by plasma treatment under an oxygen atmosphere. After that, plasma treatment is performed under a nitrogen atmosphere, whereby the nitrogen plasma-treated layer 16b with high nitrogen concentration is provided over the surface of the silicon oxide layer or near the surface thereof. It is to be noted that "near the surface" means a depth of approximately greater than or equal to 0.5 nm and less than or equal to 1.5 nm from the surface of the silicon oxide layer. For example, plasma treatment is performed under a nitrogen atmosphere, whereby a structure in which nitrogen is contained at a ratio of 20 to 50 atomic % in a portion of approximately 1 nm deep from the surface of the silicon oxide layer 16a is obtained.

A surface of a silicon layer that is a typical example of the semiconductor layer 18 is oxidized by plasma treatment, whereby a dense oxide layer with no distortion at an interface can be formed. In addition, when the oxide layer is nitrided by plasma treatment and nitrogen is substituted for oxygen at the surface part to form a nitride layer, the layer can be denser. Accordingly, an insulating layer with high withstand voltage can be formed.

In any event, when the solid-phase oxidation treatment or solid-phase nitridation treatment by the plasma treatment as described above is used, an insulating layer that is equivalent to a thermal oxide film formed at 950 to 1050° C. can be obtained even when a glass substrate having allowable temperature limit of less than or equal to 700° C. is used. That is, a tunnel insulating layer with high reliability can be formed as the tunnel insulating layer of the nonvolatile memory element, and the insulating layer can be formed to be thinner. In addition, nitridation by plasma treatment gives an advantage in that hole mobility is increased in the nonvolatile memory element and erasing is easily performed.

Different nitride layers are stacked over the first insulating layer 16. It is preferable that at least one or more of the different nitride layers have an insulating property and be a layer having a trap for retaining charge. It is to be noted that one of the different nitride layers may not necessarily have a trap for retaining charge and only the other nitride layer may have a trap for retaining charge. In addition, a trap for retaining charge may be provided between the different nitride layers. With such a structure, the different nitride layers serve as charge storage layers.

It is to be noted that the different nitride layers may be formed of a plurality of nitride layers that is three or more layers. As one of the materials for the different nitride layers, a germanium compound is given. As the germanium compound, nitride germanium, nitride germanium to which oxygen is added, nitride germanium to which oxygen and hydrogen are added, or the like is given. In addition, germanium oxide, germanium oxide to which nitrogen is added, germanium oxide to which nitrogen and hydrogen are added, or the like can be used.

In the case where the germanium compound such as germanium nitride, germanium nitride to which oxygen is added, germanium nitride to which oxygen and hydrogen are added, germanium oxide, germanium oxide to which nitrogen is added, or germanium oxide to which nitrogen and hydrogen are added are used for the charge storage layer, the charge storage layer can be formed by a plasma CVD method in an atmosphere containing a germanium element (for example, an atmosphere containing $GeH_4$ and $N_2$; $GeH_4$ and $NH_3$; $GeH_4$ and $N_2O$; or the like). In addition, a charge storage layer using germanium nitride can be formed by deposition of a sintered body after germanium oxide is heated in an ammonia atmosphere.

In addition, as one of materials for the different nitride layers, a silicon nitride compound is given. As the silicon nitride compound, silicon nitride, silicon nitride to which oxygen is added, silicon nitride to which oxygen and hydrogen are added, or the like is given. In addition, silicon oxide to which nitrogen is added, silicon oxide to which nitrogen and hydrogen are added, or the like can be used.

In the case where the silicon nitride compound, silicon oxide to which nitrogen is added, silicon oxide to which nitrogen and hydrogen are added, or the like is used for the charge storage layer, the charge storage layer can be formed by a plasma CVD method in an atmosphere containing a silicon element (for example, an atmosphere containing $SiH_4$ and $N_2$; $SiH_4$ and $NH_3$; $SiH_4$ and $N_2O$; or the like). In addition, the charge storage layer can be formed by a reactive sputtering method in which silicon is used as a target and nitrogen is used as a reactive gas.

In addition, as one of materials for the different nitride layers, an aluminum nitride compound is given. As the aluminum nitride compound, aluminum nitride, aluminum nitride to which oxygen is added, aluminum nitride to which oxygen and hydrogen are added, or the like is given.

In the case where the aluminum nitride compound is used for the charge storage layer, the charge storage layer can be formed by a thermal CVD method in an atmosphere containing an aluminum element (for example, an atmosphere containing $AlCl_3$ and $NH_3$; $AlBr_3$ and $NH_3$; $AlCl_3$ and $3NH_3$; or the like). In addition, the charge storage layer can be formed by a reactive sputtering method in which an aluminum metal is used as a target and nitrogen is used as a reactive gas.

Here, the different nitride layers are referred to as the charge storage layer 20, and one of the different nitride layers is referred to as a first charge storage layer 20a and the other is referred to as a second charge storage layer 20b. The first charge storage layer 20a is formed of germanium nitride by a plasma CVD method and the second charge storage layer 20b is formed of silicon nitride by a plasma CVD method.

The second insulating layer 22 is formed of one layer of silicon oxide, silicon nitride, silicon oxynitride, aluminum oxide, or the like or a plurality of layers thereof by a low-pressure CVD method, a plasma CVD method, or the like. The second insulating layer 22 is formed to a thickness of greater than or equal to 1 nm and less than or equal to 20 nm, preferably, greater than or equal to 5 nm and less than or equal to 10 nm. For example, a silicon oxynitride layer deposited to a thickness of 10 nm can be used for the second insulating layer 22. Alternatively, a layer in which a silicon nitride layer is deposited to a thickness of 3 nm over the charge storage layer 20 and a silicon oxide layer is deposited to a thickness of 5 nm over the silicon nitride layer can be used.

It is preferable that the control gate electrode 24 be formed of a metal selected from tantalum (Ta), tungsten (W), titanium (Ti), molybdenum (Mo), chromium (Cr), niobium (Nb), and the like, or an alloy material or compound material containing the elements as its main component. Alternatively, polycrystalline silicon to which an impurity element such as phosphorus is added can be used. Alternatively, the control gate electrode may be formed of a stacked layer structure including one or a plurality of metal nitride layers 24a and one or a plurality of metal layer 24b containing the above-described metal. As the metal nitride, tungsten nitride, molybdenum nitride, or titanium nitride can be used. When the metal nitride layer 24a is provided, adhesiveness of the metal layer 24b can be increased; accordingly, separation can be prevented. In addition, since the work function of a metal nitride such as tantalum nitride is high, the thickness of the first insulating layer 16 can be increased due to the synergistic effect with the second insulating layer 22.

Alternatively, as shown in FIG. 1B, the nonvolatile memory element may be manufactured using a semiconductor substrate 30. It is preferable that a single-crystal silicon substrate (a silicon wafer) be used as the semiconductor substrate 30. Alternatively, an SOI (Silicon-On-Insulator) substrate can be used. As the SOI substrate, a so-called SIMOX (Separation by IMplanted OXygen) substrate may be used, which is formed in such a manner that after oxygen ions are injected into a mirror-polished wafer, an oxide layer is formed to a certain depth from the surface by high-temperature annealing as well as eliminating defects generated in a surface layer.

In the case where the semiconductor substrate 30 is of n-type, a p-well 32 into which a p-type impurity is injected is formed. For the p-type impurity, for example, boron is used and added at a concentration of approximately $5 \times 10^{15}$ cm$^{-3}$ to $1 \times 10^{16}$ cm$^{-3}$. When the p-well 32 is formed, an n-channel transistor can be formed in this region. In addition, the p-type impurity added to the p-well 32 also has a function of controlling the threshold voltage of the transistor. A channel formation region to be formed in the semiconductor substrate 30 is formed in a region that roughly coincides with the control gate electrode 24 and is placed between a pair of impurity regions 38a and 38b formed in the semiconductor substrate 30.

Each of the pair of impurity regions 38a and 38b serves as a source region or drain region in the nonvolatile memory element. The pair of impurity regions 38a and 38b are formed by addition of phosphorus or arsenic, which is an n-type impurity, at approximately $1 \times 10^{19}$ atoms/cm$^3$ to $1 \times 10^{21}$ atoms/cm$^3$.

Over the semiconductor substrate 30, similarly to the nonvolatile memory element shown in FIG. 1A, the first insulating layer 16, the charge storage layer 20, the second insulating layer 22, and the control gate electrode 24 are formed. Further, a surface of the semiconductor substrate 30 may be oxidized by thermal oxidation to form the first insulating layer 16.

In each of the nonvolatile memory elements shown in FIGS. 1A and 1B, edges of the charge storage layer 20 and edges of the control gate electrode 24 coincide with each other. That is, the charge storage layer 20, the second insulating layer 22, and the control gate electrode 24 are etched using one mask. Consequently, the number of etching steps can be reduced, and thus, throughput can be improved.

Figure 2A:
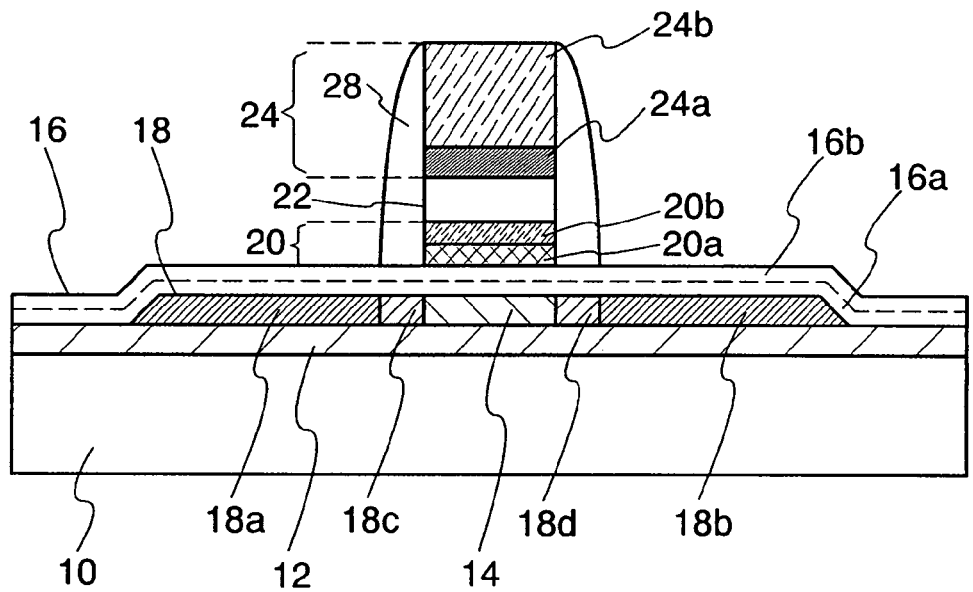
FIGS. 2A and 2B are each a cross-sectional view for describing a main structure of a nonvolatile semiconductor memory device of the present invention.
Figure 2B:
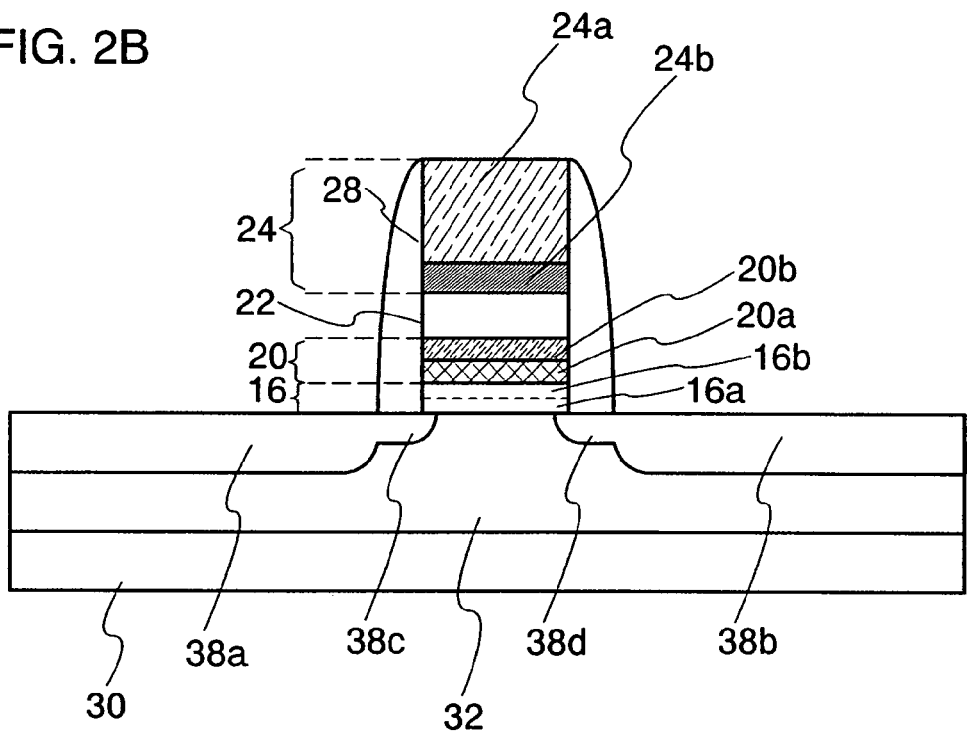

In nonvolatile memory elements shown in FIGS. 2A and 2B, spacers 28 are formed on sidewalls of the charge storage layer 20, the second insulating layer 22, and the control gate electrode 24. Further, the spacers 28 may be formed on sidewalls of the first insulating layer 16. When the spacers 28 are formed, an effect is obtained in that leak current at edges of the charge storage layer 20 or the control gate electrode 24 (for example, current that flows between the charge storage layer 20 and the control gate electrode 24) is prevented. In addition, with the use of the spacers 28, low concentration impurity regions 18c and 18d (FIG. 2A) and 38c and 38d (FIG. 2B) can be formed under both edges of the control gate electrode 24 in a channel length direction. Each of the low concentration impurity regions 18c, 18d, 38c, and 38d serves as a lightly doped drain (LDD). The low concentration impurity regions 18c and 18d are not necessarily formed; however, when these regions are provided, an electric field of an edge of a drain can be moderated and deterioration due to repeated writing and erasing can be suppressed.

Figure 3A:
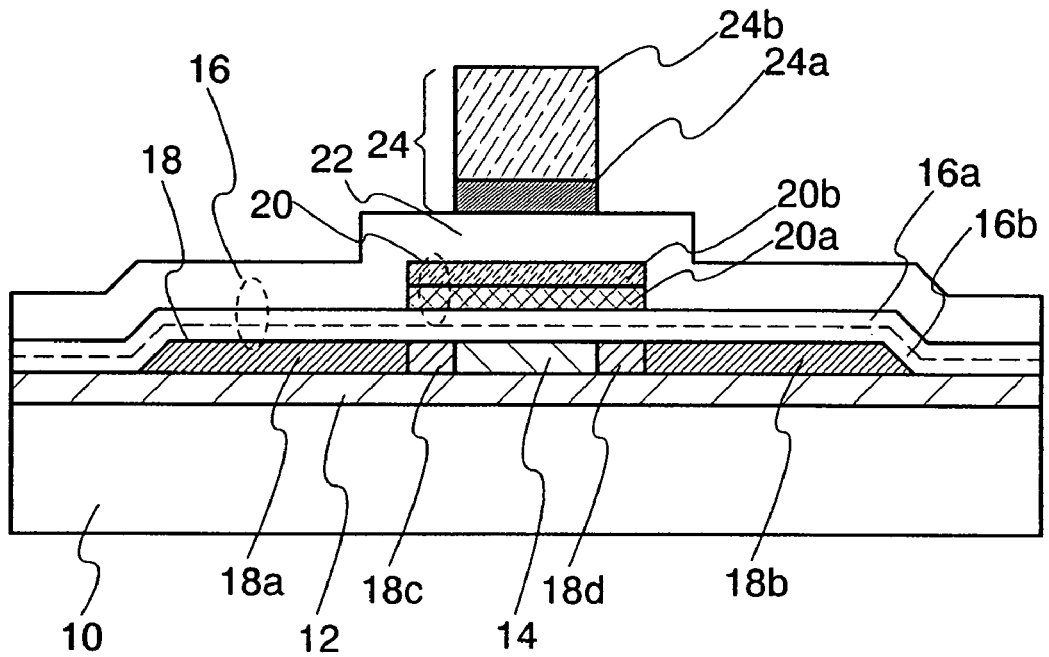
FIGS. 3A and 3B are each a cross-sectional view for describing a main structure of a nonvolatile semiconductor memory device of the present invention.
Figure 3B:
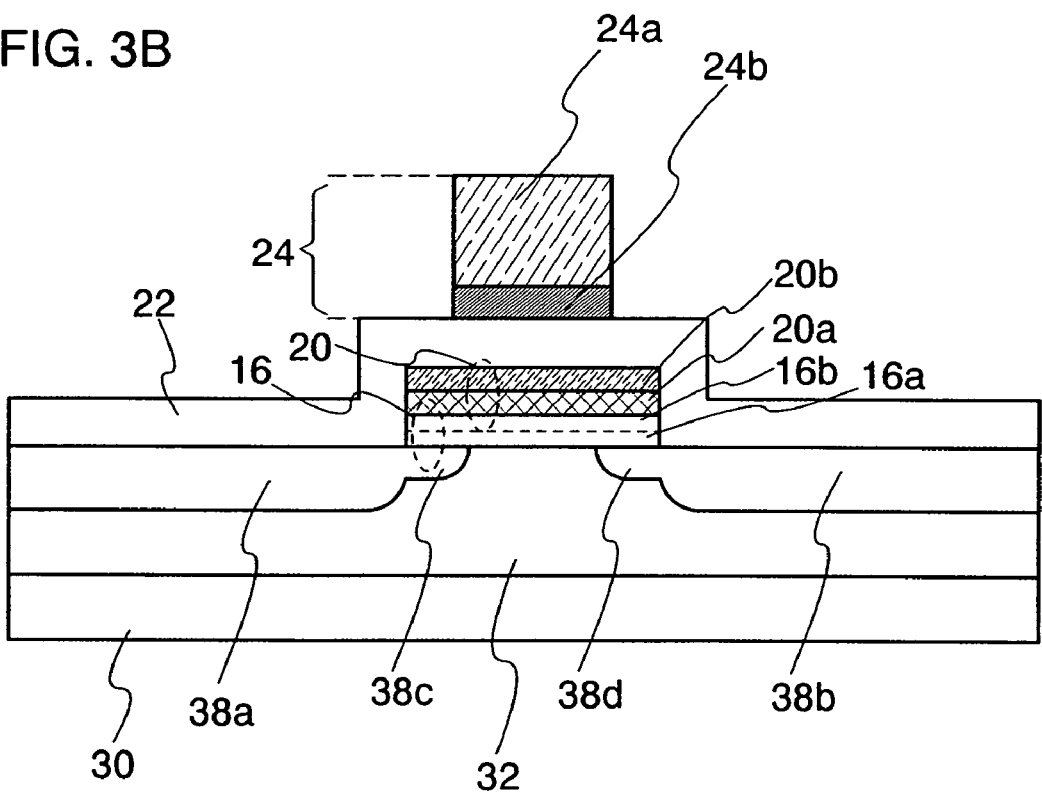

Nonvolatile memory elements shown in FIGS. 3A and 3B each have a structure in which an area of an upper surface of the charge storage layer 20 is bigger than that of an upper surface of the control gate electrode 24. That is, the edges of the charge storage layer 20 extend outward. The regions, in the charge storage layer 20, which are formed outside the control gate electrode 24 overlap with the low concentration impurity regions 18c and 18d (FIG. 3A) and 38c and 38d (FIG. 3B) with the first insulating layer 16 interposed therebetween. When the charge storage layer 20 and the control gate electrode 24 are formed to have such shapes, an impurity can be added to a semiconductor layer through the regions in the charge storage layer 20 which are formed outside the control gate electrode 24. That is, the channel formation region 14, the high concentration impurity regions 18a and 18b, and the low concentration impurity regions 18c and 18d can be formed at the same time in the semiconductor layer 18 by a step of adding an impurity. In addition, in the p-well 32, the high concentration impurity regions 38a and 38b and the low concentration impurity regions 38c and 38d can be formed at the same time. Therefore, throughput can be improved.

Figure 4A:
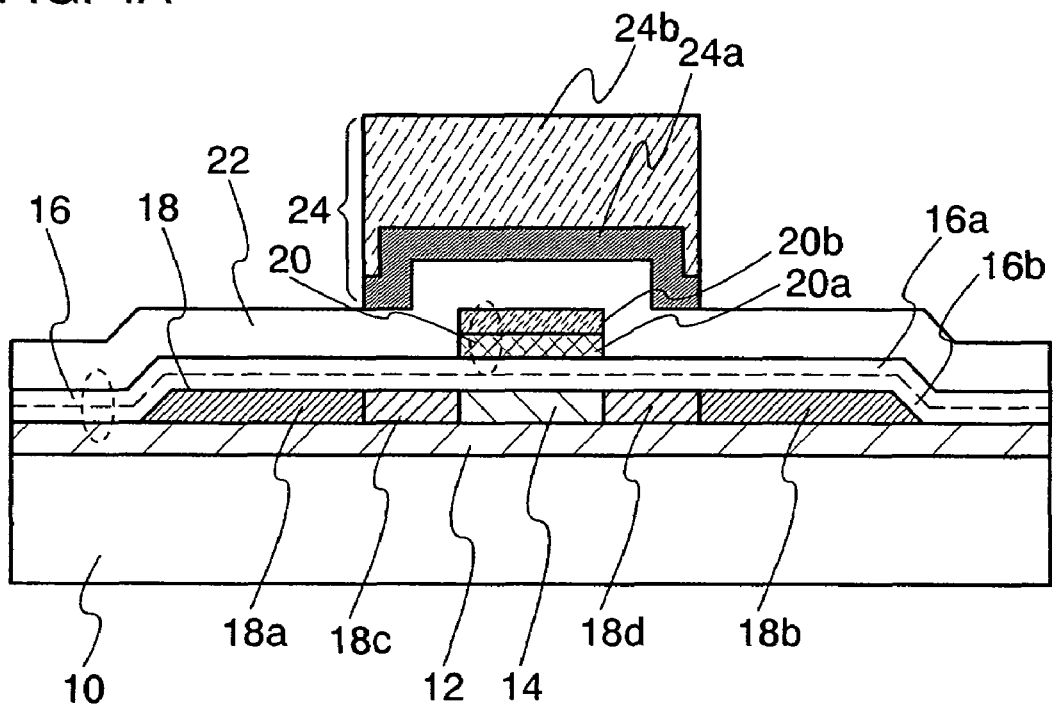
FIGS. 4A and 4B are each a cross-sectional view for describing a main structure of a nonvolatile semiconductor memory device of the present invention.
Figure 4B:
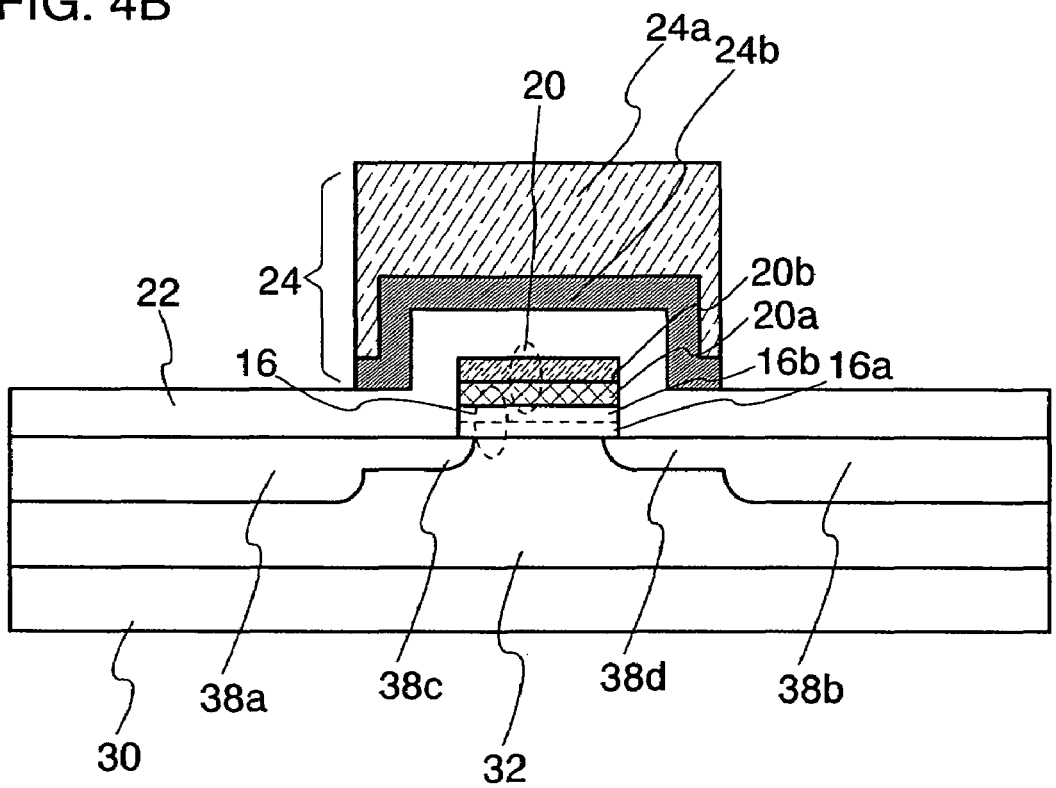

Nonvolatile memory elements shown in FIGS. 4A and 4B each have a structure in which an area of the upper surface of the charge storage layer 20 is smaller than that of the upper surface of the control gate electrode 24.

In a thin film transistor having such a structure, before forming the control gate electrode 24, an impurity is added at low concentration to the semiconductor layer 18, so that the low concentration impurity regions 18c and 18d are formed, and then, the control gate electrode 24 is formed. Next, an impurity is added at high concentration to the semiconductor layer 18 with the use of the control gate electrode 24 as a mask, whereby the high concentration impurity regions 18a and 18b can be formed. In addition, in a similar manner, before forming the control gate electrode 24, an impurity is added at low concentration to the p-well 32, so that the low concentration impurity regions 38c and 38d are formed, and then, the control gate electrode 24 is formed. Then, an impurity is added at high concentration to the p-well 32 with the use of the control gate electrode 24 as a mask, whereby the high concentration impurity regions 38a and 38b can be formed.

Figure 5A:
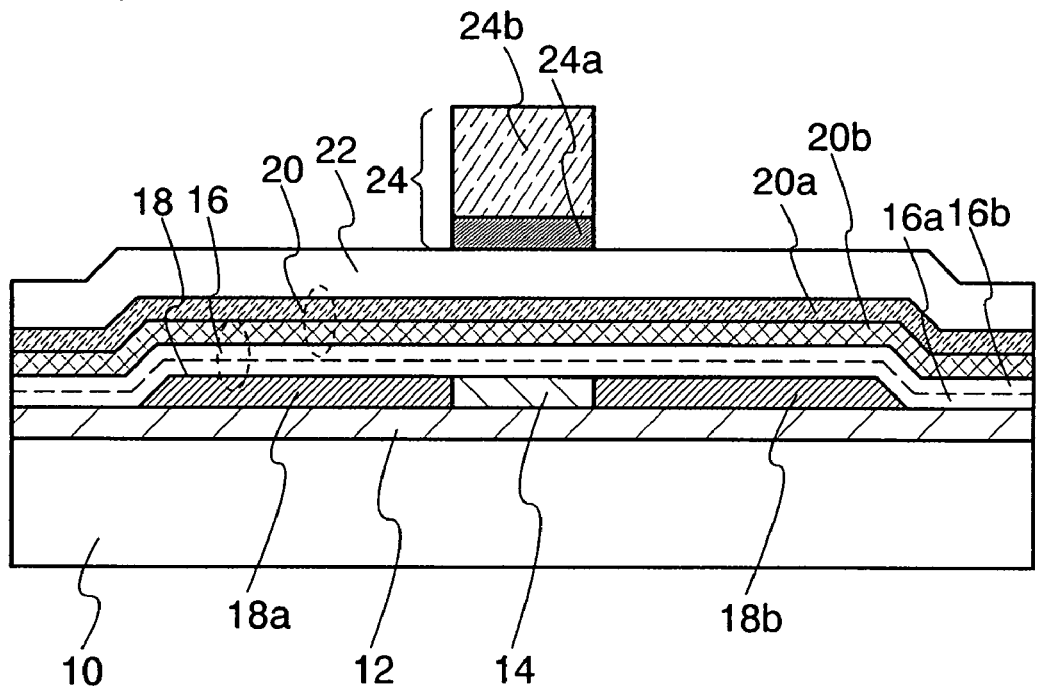
FIGS. 5A and 5B are each a cross-sectional view for describing a main structure of a nonvolatile semiconductor memory device of the present invention.
Figure 5B:
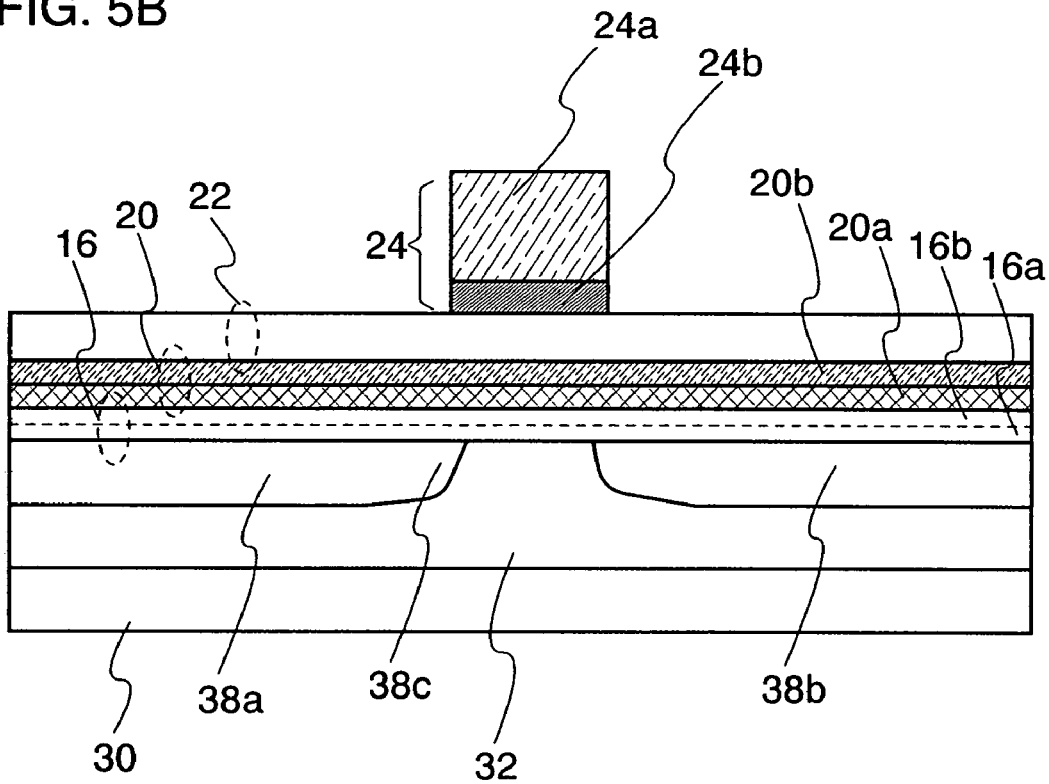

Nonvolatile memory elements shown in FIGS. 5A and 5B each have a shape in which the charge storage layer 20 is not etched to be a predetermined shape so as to correspond to the control gate electrode 24 and the semiconductor layer 18 like the charge storage layer 20 of the nonvolatile semiconductor element shown in each of FIGS. 1A and 1B, FIGS. 2A and 2B, FIGS. 3A and 3B, and FIGS. 4A and 4B. That is, the nonvolatile memory element has a structure in which the charge storage layer 20 is used in common in adjacent nonvolatile memory elements. In addition, the nonvolatile memory element has a structure in which the charge storage layer 20 is formed so as to cover the high concentration impurity regions 18a, 18b, 38a, and 38b. In this case, in a manufacturing process, it is not necessary for the semiconductor layer 18 or the p-well 32 to be exposed by etching; accordingly, damages to the semiconductor layer 18 or the p-well 32 can be reduced. In addition, throughput can be improved.

An operation mechanism of the nonvolatile memory elements shown in FIGS. 1A and 1B will be explained with reference to a band diagram. In the band diagram shown in FIGS. 47 to 50, components that are the same as those shown in FIGS. 1A and 1B are denoted by the same reference numerals. Here, the operation mechanism will be explained using a nonvolatile memory element having a thin film semiconductor layer as shown in FIG. 1A; however, the operation mechanism can be applied to a nonvolatile memory element using a single-crystal semiconductor substrate as shown in FIG. 1B. In addition, a mode in which a germanium nitride layer is used for the charge storage layer 20a, a silicon nitride layer is used for the charge storage layer 20*b*, and electrons are trapped in a trap level in the charge storage layer 20*a* will be described below.

Figure 47:
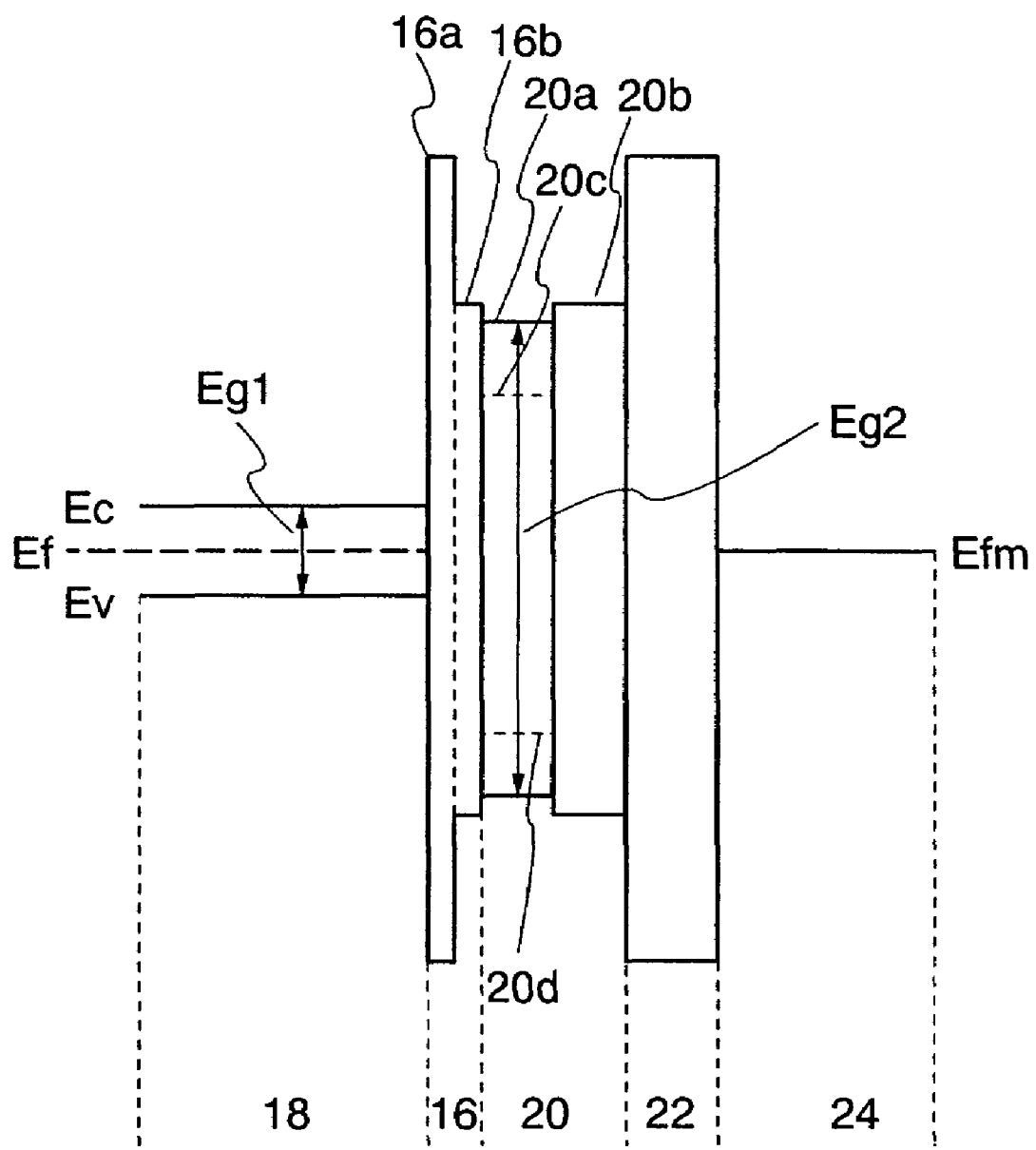
FIG. 47 is a band diagram of nonvolatile memory during an initial state (charge emission state)
Figure 48:
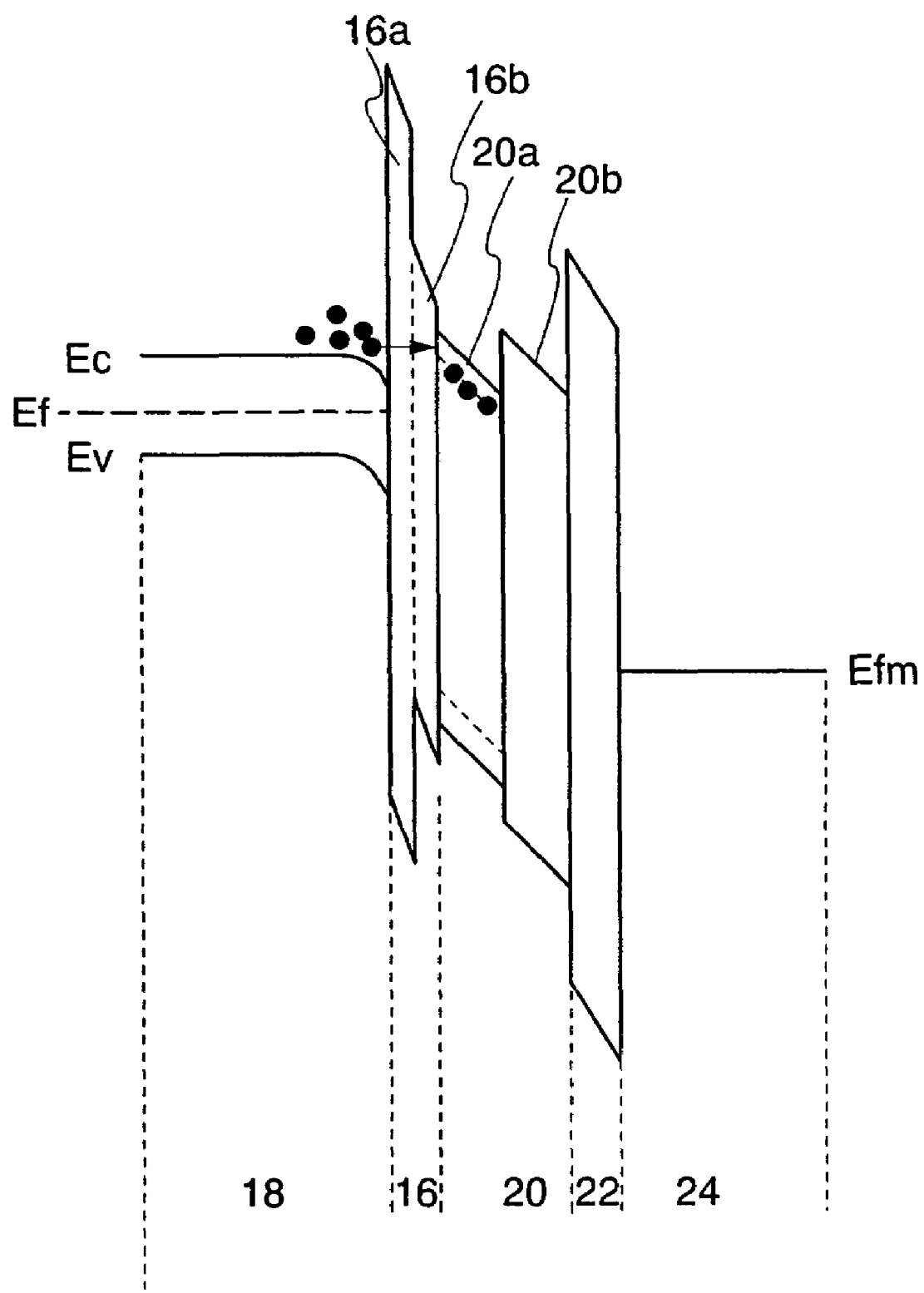
FIG. 48 is a band diagram of nonvolatile memory during a writing state.

FIG. 47 shows a state in which the semiconductor layer 18, the first insulating layer 16, the charge storage layer 20, the second insulating layer 22, and the control gate electrode 24 are stacked. FIG. 47 shows the case where voltage is not applied to the control gate electrode 24, and also shows the case where a Fermi level Ef of the semiconductor layer 18 and a Fermi level Efm of the control gate electrode 24 are equal to each other.

The semiconductor layer 18 and the charge storage layer 20 are formed of different materials from each other with the first insulating layer 16 interposed therebetween. A band gap Eg1 (a difference between energy of a bottom edge Ec of a conduction band and an upper edge Ev of a valence band) of the semiconductor layer 18 and a band gap Eg2 of the charge storage layer 20*a* are different from each other, and materials are combined so that the latter band gap becomes large. For example, silicon (1.12 eV) as the semiconductor layer 18 and germanium nitride (3 to 5 eV) as the charge storage layer 20*a* can be combined. Germanium nitride may be hydrogenated. At this time, hydrogen may be contained in germanium at 1 to 30 atomic %. When the charge storage layer 20*a* is formed of germanium nitride containing hydrogen, a recombination center at an interface with the first insulating layer 16 can be reduced. In addition, the charge storage layer 20*a* has trap levels 20*c* and 20*d*.

It is to be noted that the first insulating layer 16 includes a silicon oxide layer 16*a* (about 8 eV) and a nitrogen plasma-treated layer 16*b* (about 5 eV) formed by nitridation of the silicon oxide by plasma treatment. In addition, the second insulating layer 22 is a silicon oxide layer.

Electrons are injected into the charge storage layer 20 by a method utilizing thermoelectrons or a method utilizing F-N type tunnel current. In the case of utilizing thermoelectrons, voltage of positive polarity is applied to the control gate electrode 24 and high voltage is applied to a drain, whereby thermoelectrons are generated. Accordingly, thermoelectrons can be injected into the charge storage layer 20. In the case of utilizing F-N type tunnel current, voltage of positive polarity is applied to the control gate electrode 24, and electrons are injected into the charge storage layer 20 from the semiconductor layer 18 by F-N type tunnel current.

Figure 6A:
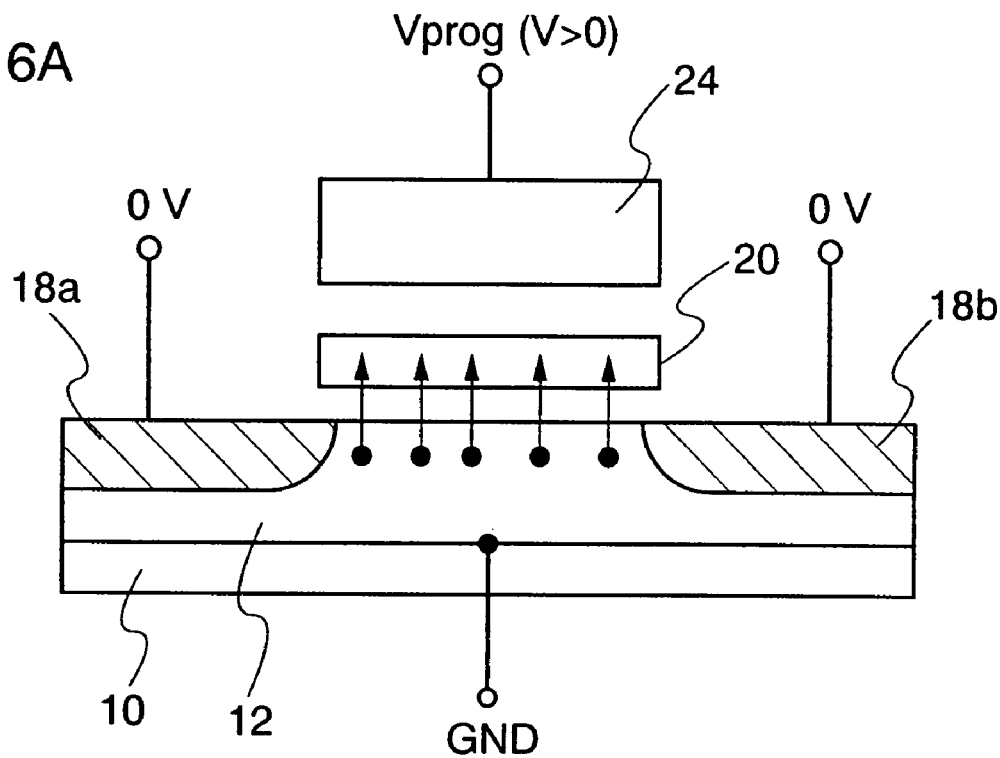
FIGS. 6A and 6B are a view for explaining writing operation of nonvolatile memory and a view for explaining reading operation of nonvolatile memory, respectively.
Figure 55A:
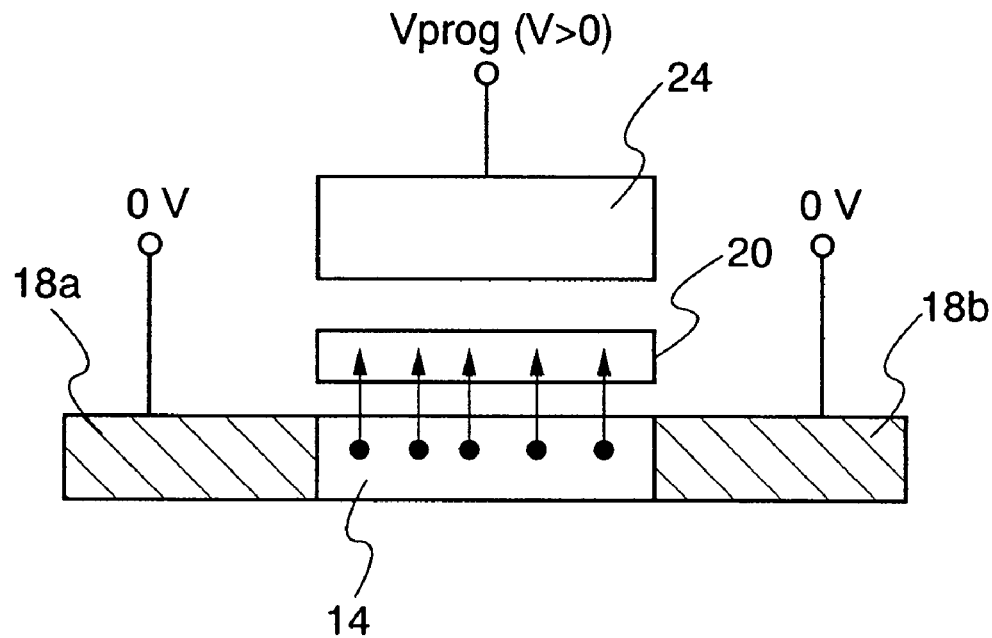
FIGS. 55A and 55B are a view for explaining writing operation of nonvolatile memory and a view for explaining reading operation of nonvolatile memory, respectively.

FIG. 55A shows applied voltage when electrons are injected into the charge storage layer 20 by F-N type tunnel current. In addition, FIG. 6A shows an example when nonvolatile memory is formed using the semiconductor substrate 30 instead of the semiconductor layer 18 as shown in FIG. 1B. High potential of positive polarity (10 to 20 V) is applied to the control gate electrode 24 while 0 V is applied to the source region 18*a* and the drain region 18*b*. A band diagram at this time is the one shown in FIG. 48. Part of electrons of the semiconductor layer 18 injected into the first insulating layer 16 by a high electric field is captured in a trap level of the charge storage layer 20*a*. The trap that has captured electrons is charged negatively and shifts threshold voltage to a direction of positive polarity.

Figure 49:
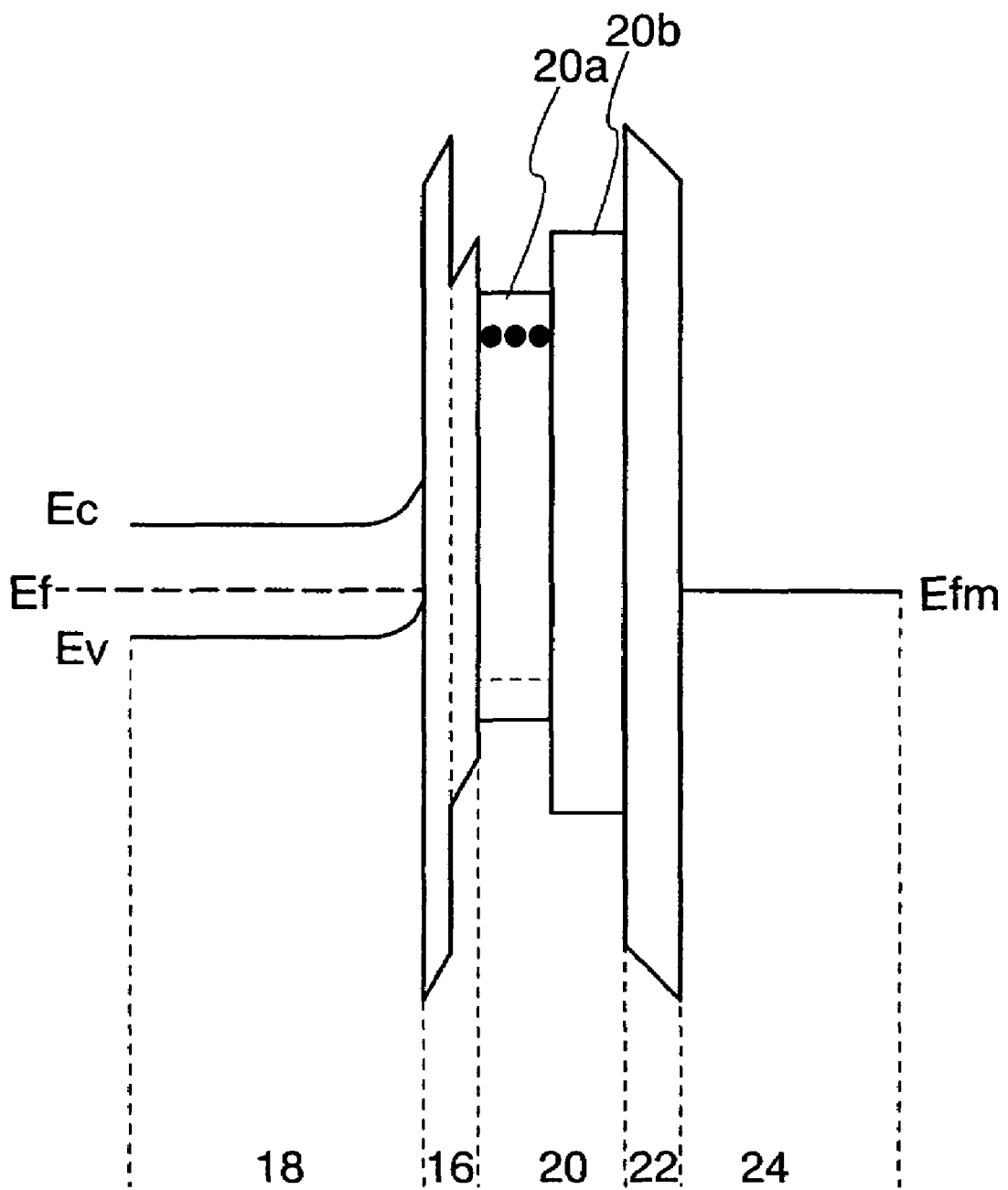
FIG. 49 is a band diagram of nonvolatile memory during a charge retention state.

While electrons are retained in the charge storage layer 20, threshold voltage of a nonvolatile memory element shifts in a positive direction. This state can be regarded as a state in which data "0" has been written. FIG. 49 shows a band diagram of a charge retention state. Since electrons of the charge storage layer 20*a* are interposed between the first insulating layer 16 and the second insulating layer 22, the electrons are in a state of being trapped in terms of energy. Although potential is increased due to carries (electrons) stored in the charge storage layer 20*a*, the electrons are not discharged from the charge storage layer 20*a* unless energy that is higher than barrier energy is given to the electrons.

Figure 6B:
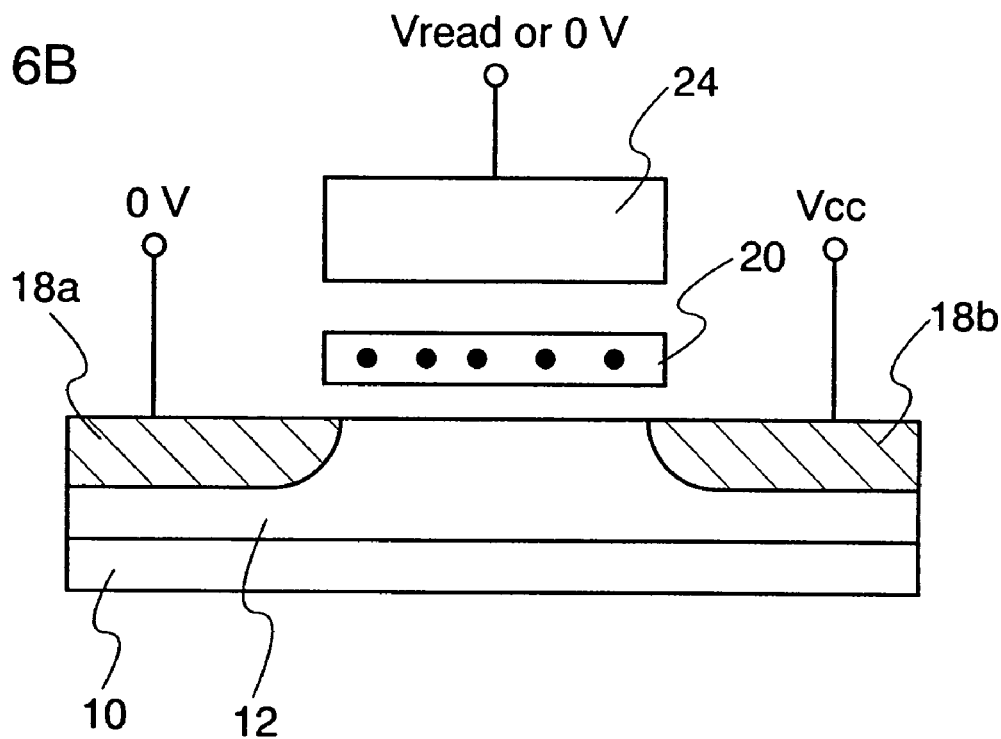
Figure 55B:
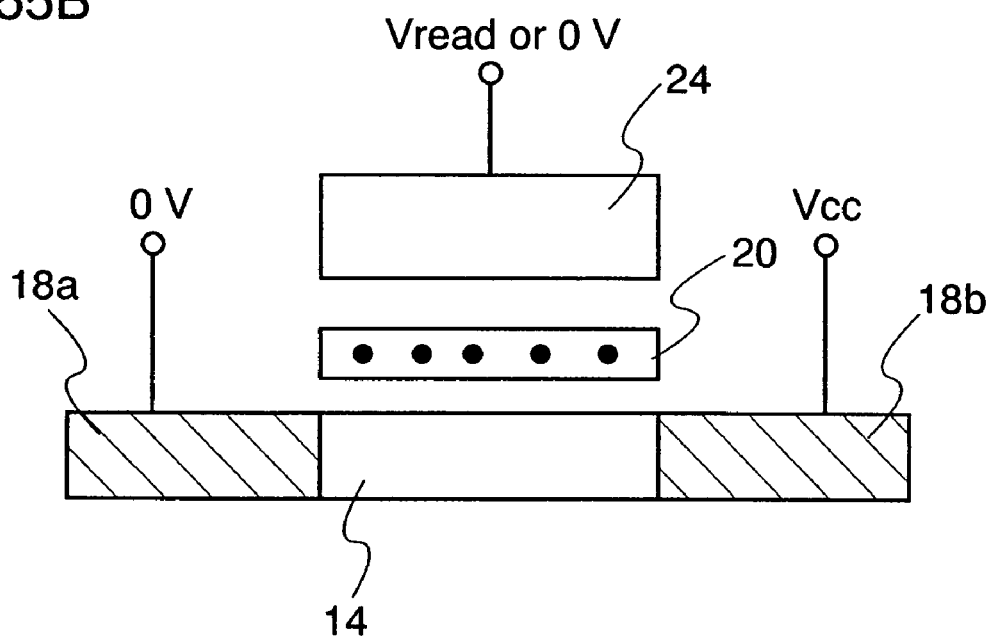

A state where data "0" is written is detected as follows: it is detected by a circuit that a transistor is not turned on when an intermediate potential Vread is applied to the control gate electrode 24. The intermediate potential is a potential between the threshold voltage Vth1 in data "1" and the threshold voltage Vth2 in the data "0" (in this case, Vth1<Vread<Vth2). Alternatively, as shown in FIG. 6B or FIG. 55B, the data "0" can be judged by whether or not the nonvolatile memory element is conductive when bias voltage is applied between the source region 18*a* and the drain region 18*b* so that 0 V is applied to the control gate electrode 24.

Figure 7A:
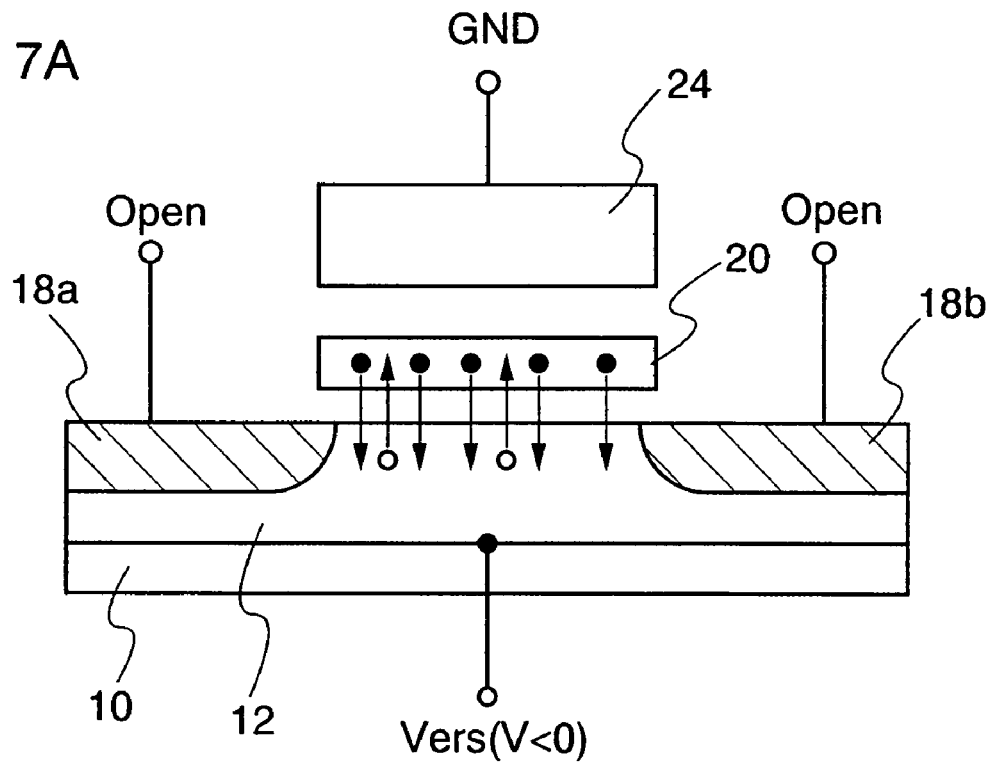
FIGS. 7A and 7B are each a view for explaining erasing operation of nonvolatile memory.
Figure 7B:
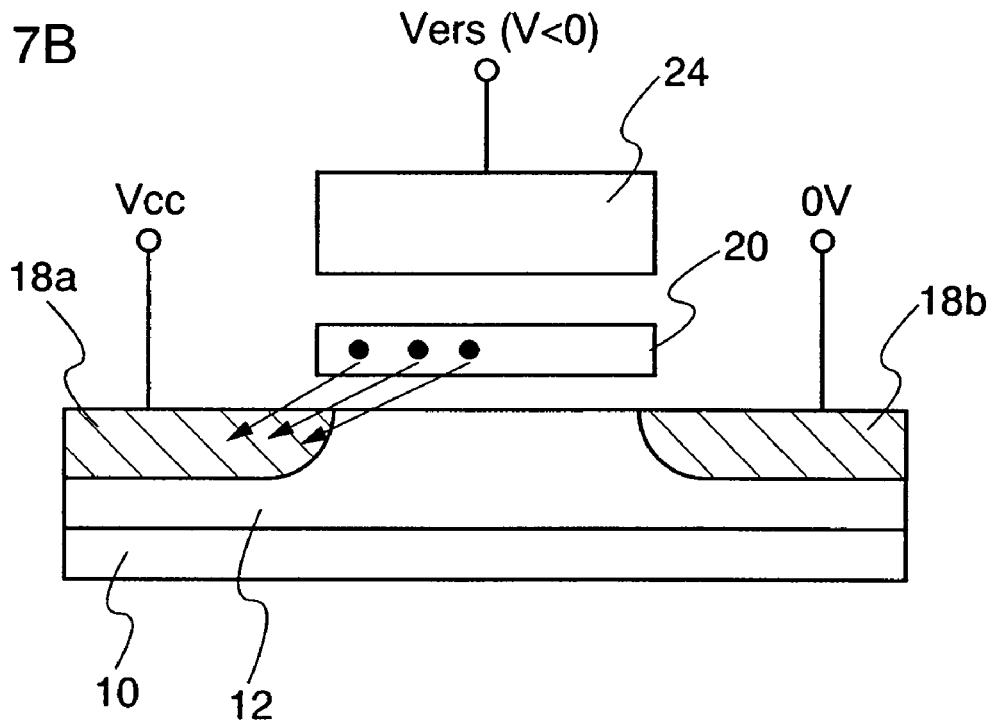
Figure 56A:
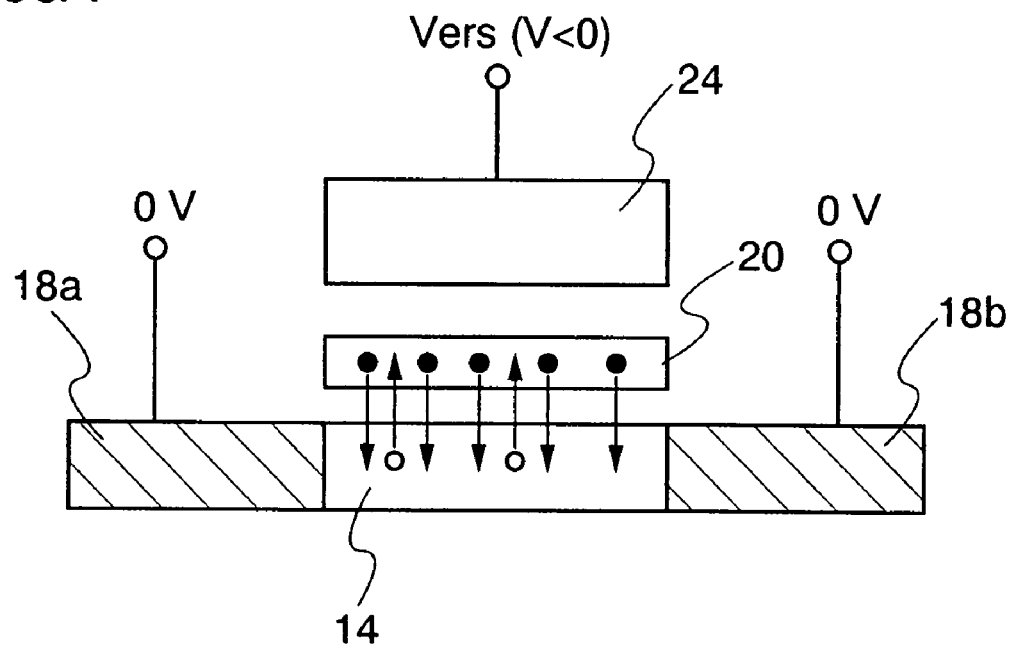
FIGS. 56A and 56B are views for explaining erasing operation of nonvolatile memory.
Figure 56B:
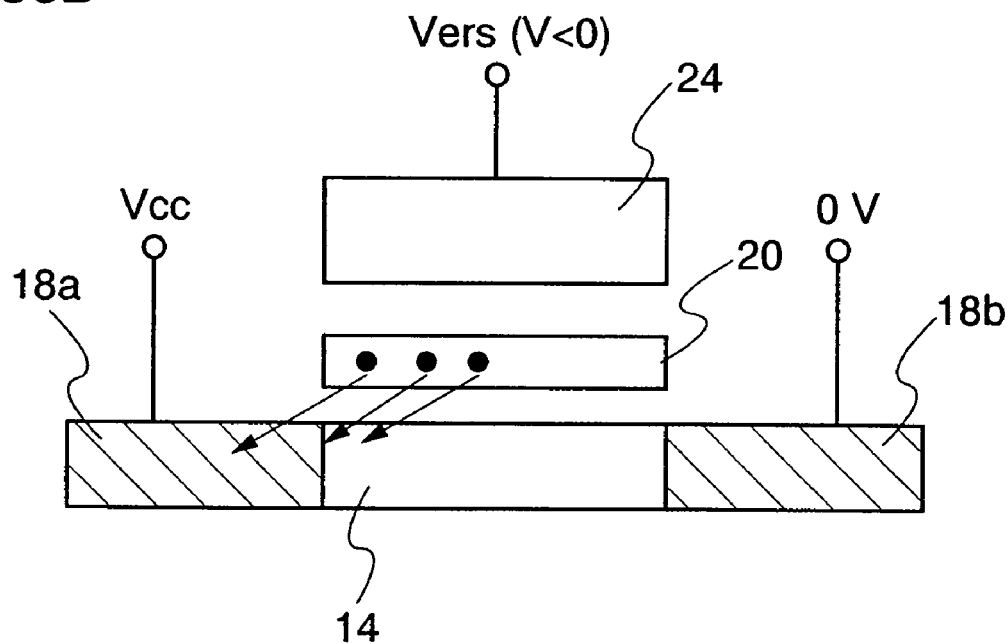

FIG. 56A shows a state in which charge is discharged from the charge storage layer 20 and data is erased from a nonvolatile memory element. In this case, erasing is performed by a method in which bias voltage of negative polarity is applied to the control gate electrode 24 and F-N type tunnel current is fed between the semiconductor layer 18 and the charge storage layer 20. Alternatively, as shown in FIG. 7B, by application of bias voltage of negative polarity to the control gate electrode 24 and application of high potential of positive polarity to the source region 18*a*, F-N type tunnel current may be generated and electrons may be extracted to a source region 18*a* side.

It is to be noted that in the case where the nonvolatile memory is formed using the semiconductor substrate as shown in FIG. 1B instead of the semiconductor layer 18, erasing is performed in such a manner that the control gate electrode 24 is grounded, bias voltage of negative polarity is applied to the p-well 32 of the semiconductor substrate 30, and F-N type tunnel current is fed between the channel formation region of the semiconductor substrate 30 and the charge storage layer 20. Alternatively, as shown in FIG. 7B, by application of bias voltage of negative polarity to the control gate electrode 24 and application of high potential of positive polarity to the source region 18*a*, F-N tunnel current may be generated and electrons may be extracted to the source region 18*a* side.

Figure 50:
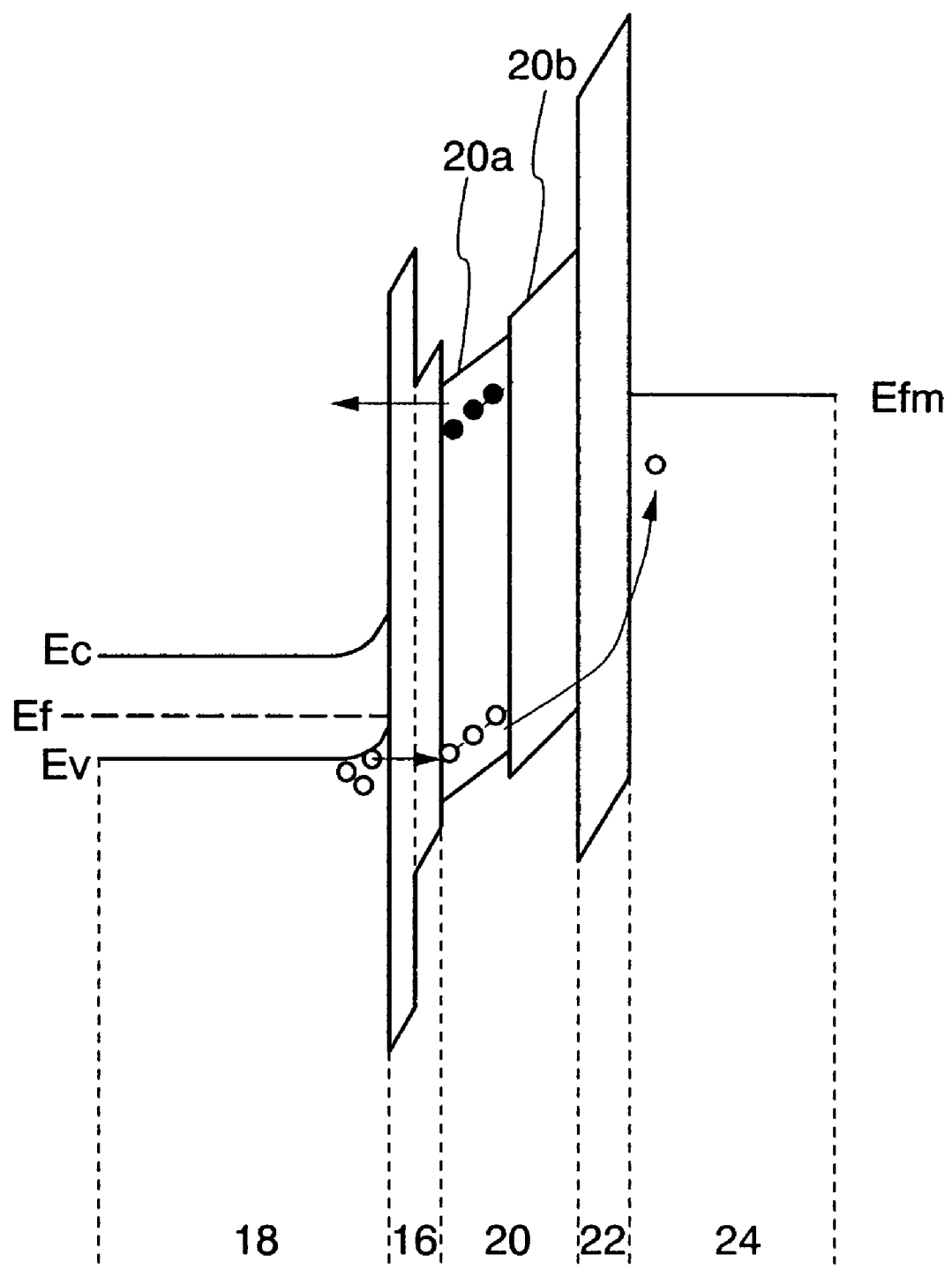
FIG. 50 is a band diagram of nonvolatile memory during an erasing state.

FIG. 50 shows a band diagram of this erasing state. In the erasing operation, since the first insulating layer 16 can be formed to be thin, electrons of the charge storage layer 20 can be discharged to the semiconductor 18 side by F-N type tunnel current. In addition, holes are easily injected from the channel formation region of the semiconductor layer 18, and the holes are injected into the charge storage layer 20; accordingly, a substantial erasing operation can be performed.

Here, the mode in which electrons are trapped in the trap level in the charge storage layer 20*a* is explained; however, the present invention is not limited thereto. For example, electrons can be trapped in a trap level in the charge storage layer 20*b* formed of silicon nitride. Alternatively, electrons can be trapped at an interface between the charge storage layer 20*a* formed of germanium nitride and the charge storage layer 20*b* formed of silicon nitride.

As described above, by the nonvolatile memory element of the present invention, charge can be easily injected into the charge storage layer 20 from the semiconductor layer and charge can be prevented from disappearing. That is, in the case where the nonvolatile memory element is operated as memory, high-efficient writing can be performed at low voltage and a charge retention property can be improved.

Figure 8:
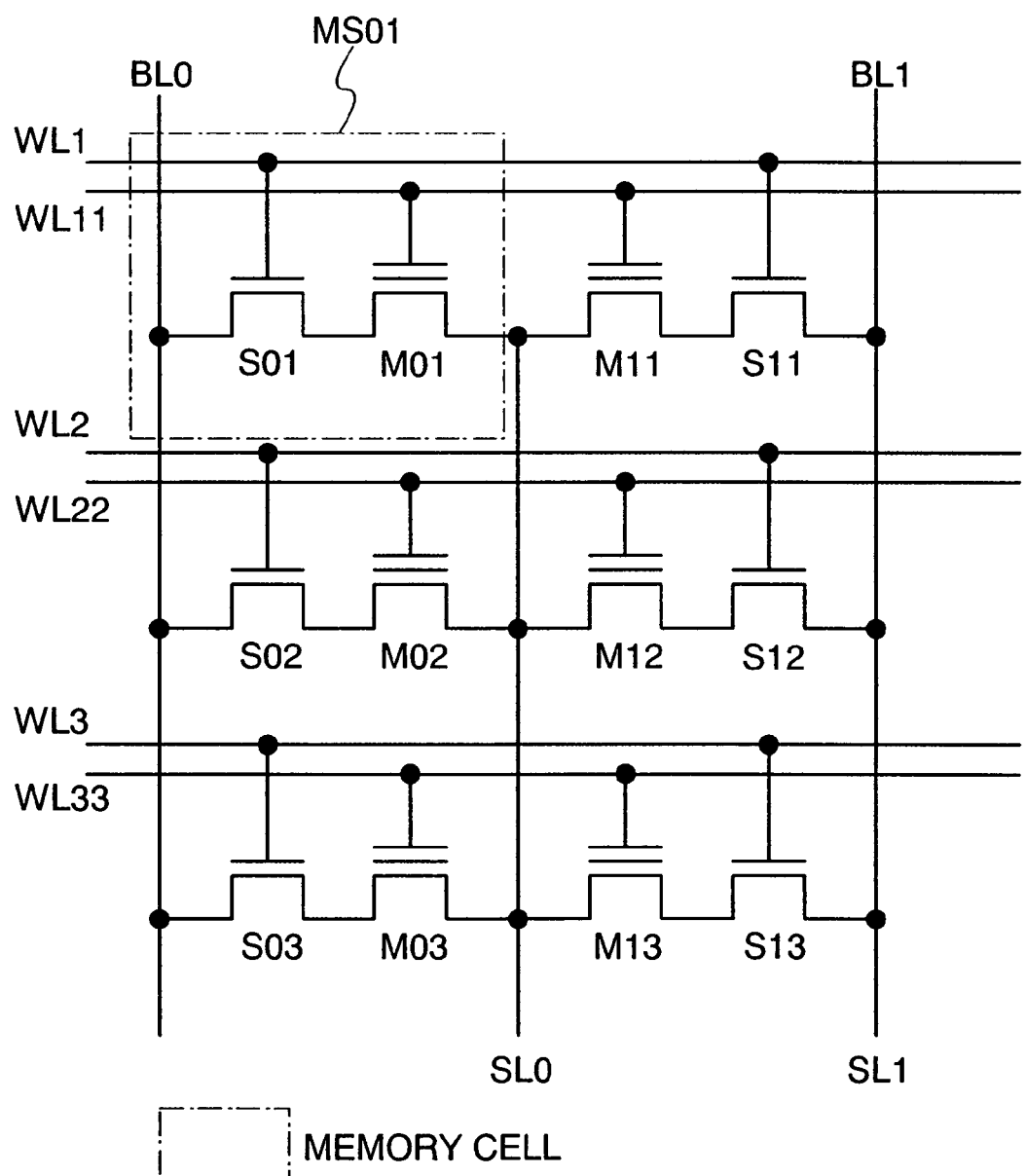
FIG. 8 is a diagram showing an example of an equivalent circuit of a nonvolatile memory cell array.

With the use of such a nonvolatile memory element, a nonvolatile semiconductor memory device of various modes can be obtained. An example of an equivalent circuit of a nonvolatile memory cell array is shown in FIG. 8. A memory cell MS01 for storing 1 bit of information includes a selection transistor S01 and a nonvolatile memory element M01. The selection transistor S01 is inserted between a bit line BL0 and the nonvolatile memory element M01 in series, and a gate is connected to a word line WL1. A gate of the nonvolatile memory element M01 is connected to a word line WL11. Data is written in the nonvolatile memory element M01 by a method in which H level is applied to the word line WL1 and the bit line BL0 and L level is applied to BL1, and high potential is applied to the word line WL11, whereby charge is stored in the charge storage layer 20 as described above. In order to erase data, H level potential may be applied to the word line WL1 and the bit line BL0 and high potential of negative polarity may be applied to the word line WL11.

In this memory cell MS01, the selection transistor S01 and the nonvolatile memory element M01 are formed of semiconductor layers which are formed separately into island-shapes over an insulating surface, whereby interference with other selection transistors or nonvolatile memory elements can be prevented without particularly providing an element separation region. In addition, both the selection transistor S01 and the nonvolatile memory element M01 in the memory cell MS01 are of n-channel type; therefore, a wiring for connecting the two elements to each other can be omitted when both the selection transistor S01 and the nonvolatile memory element M01 are formed of one semiconductor layer which is separated into an island shape.

Figure 9:
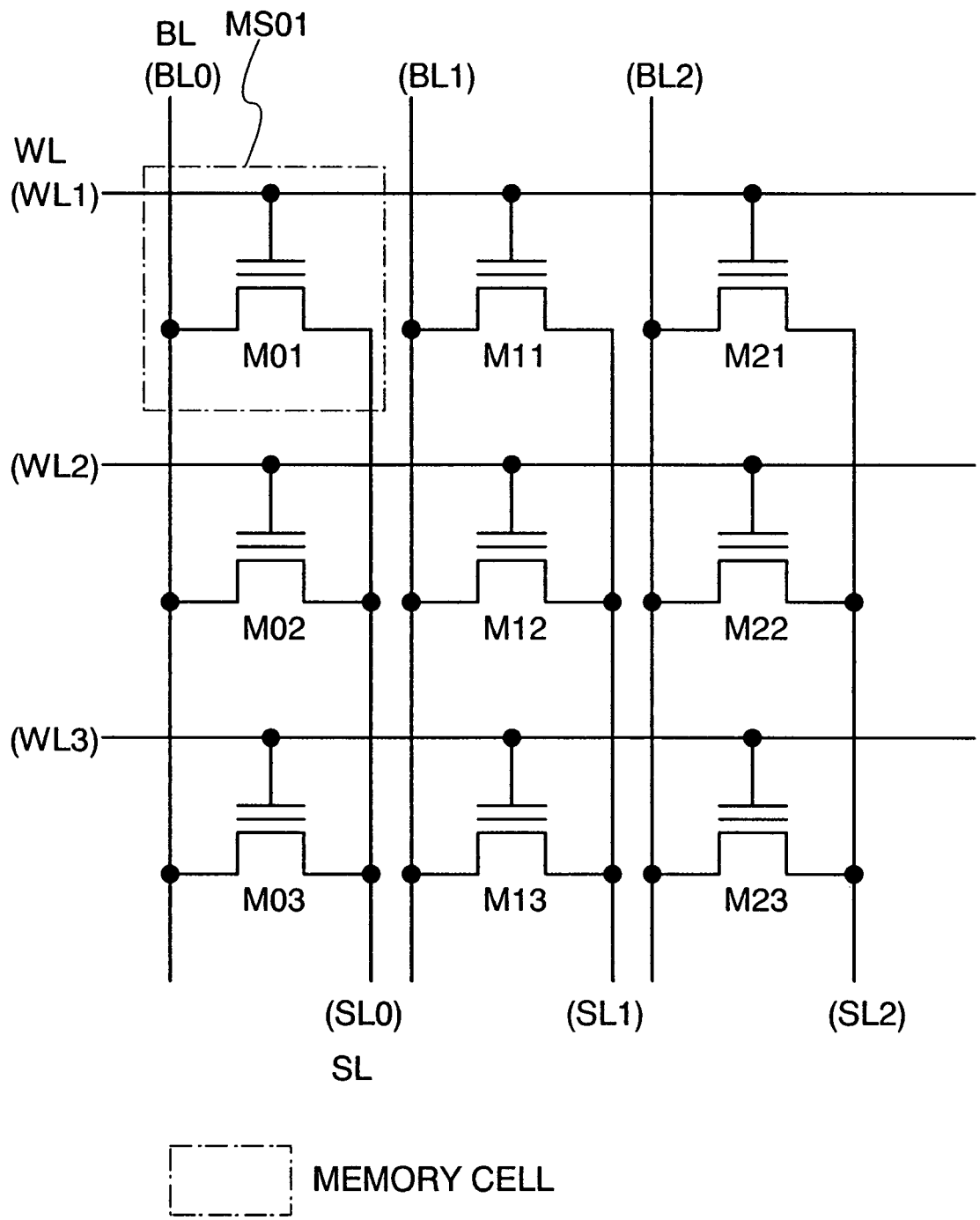
FIG. 9 is a diagram showing an example of a NOR type nonvolatile memory cell array.

FIG. 9 shows a NOR type equivalent circuit in which a nonvolatile memory element is directly connected to a bit line. In this memory cell array, a word line WL and a bit line BL are provided to intersect with each other, and a nonvolatile memory element is arranged at each intersection portion. In the NOR type, a drain of each nonvolatile memory element is connected to the bit line BL. Sources of the nonvolatile memory elements are commonly connected to a source line SL.

Also in this case, in this memory cell MS01, a nonvolatile memory element M01 is formed of a semiconductor layer which is formed separately into an island shape over an insulating surface, whereby interference with other nonvolatile memory elements can be prevented without particularly providing an element separation region. In addition, when a plurality of nonvolatile memory elements (for example, M01 to M23 shown in FIG. 9) is treated as one block and these nonvolatile memory elements are formed of one semiconductor layer which is separated into an island shape, whereby erasing operation of one block can be performed at the same time.

The operation of the NOR type is as follows, for example. In order to write data, 0 V is applied to a source line SL, high potential is given to a word line WL selected for writing data, and potentials corresponding to data "0" and data "1" are given to a bit line BL. For example, potentials of H level and L level for the data "0" and the data "1", respectively, are given to the bit line BL. In a nonvolatile memory element to which H level potential has been given, in order to write data "0", hot electrons are generated near a drain and the hot electrons are injected into a floating gate. In the case of writing the data "1", such electron injection does not occur.

In a memory cell to which data "0" has been given, hot electrons are generated near the drain by a high lateral electric field between the drain and the source, and the hot electrons are injected into the charge storage layer. A state in which threshold voltage is high by the injection of electrons into the charge storage layer is "0". In the case where data "1" has been given, hot electrons are not generated and a state in which electrons are not injected into the charge storage layer, and threshold voltage is low, that is, an erasing state is retained.

When the data is erased, potential of positive polarity of approximately 10 V is applied to the source line SL and the bit line BL is made to be in a floating state. Then, high potential of negative polarity is applied to the word line (high voltage of negative polarity is applied to a control gate), so that electrons are extracted from the charge storage layer. Accordingly, an erasing state of data "1" is obtained.

Data is read in the following manner: 0 V is applied to the source line SL and approximately 0.8 V is applied to the bit line BL; reading voltage set as an intermediate value of threshold voltages of the data "0" and the data "1" is given to a selected word line W; and a sense amplifier connected to the bit line BL judges whether or not current changes in the nonvolatile memory element.

FIG. 10 shows an equivalent circuit of a NAND type memory cell array. A NAND cell NS1 in which a plurality of nonvolatile memory elements is connected in series is connected to a bit line BL. A block BLK1 includes a plurality of NAND cells. The block BLK1 shown in FIG. 10 has 32 word lines (word lines WL0 to WL31). To nonvolatile memory elements arranged in the same row in the block BLK1, a word line corresponding to this row is commonly connected.

In this case, since selection transistors S1 and S2 and nonvolatile memory elements M0 to M31 are connected in series, these may be formed of a semiconductor layer as one group. Accordingly, a wiring for connecting the nonvolatile memory elements can be omitted, and thus, integration can be achieved. In addition, adjacent NAND cells can be separated easily. Alternatively, a semiconductor layer of the selection transistors S1 and S2 and a semiconductor layer of the NAND cell NS1 may be formed separately. When an erasing operation in which charge is extracted from charge storage layers of the nonvolatile memory elements M0 to M31 is performed, the erasing operation of one NAND cell can be performed at the same time. Alternatively, nonvolatile memory elements commonly connected to one word line (for example, the row of M30) may be formed of one semiconductor layer.

Writing operation is carried out after the NAND cell NS1 is made in an erasing state, that is, threshold voltage of each nonvolatile memory element of the NAND cell NS1 is made in a state of voltage of negative polarity. The writing is performed sequentially from the nonvolatile memory element M0 at a source line SL side. An example of writing to the nonvolatile memory element M0 is as follows.

Figure 11A:
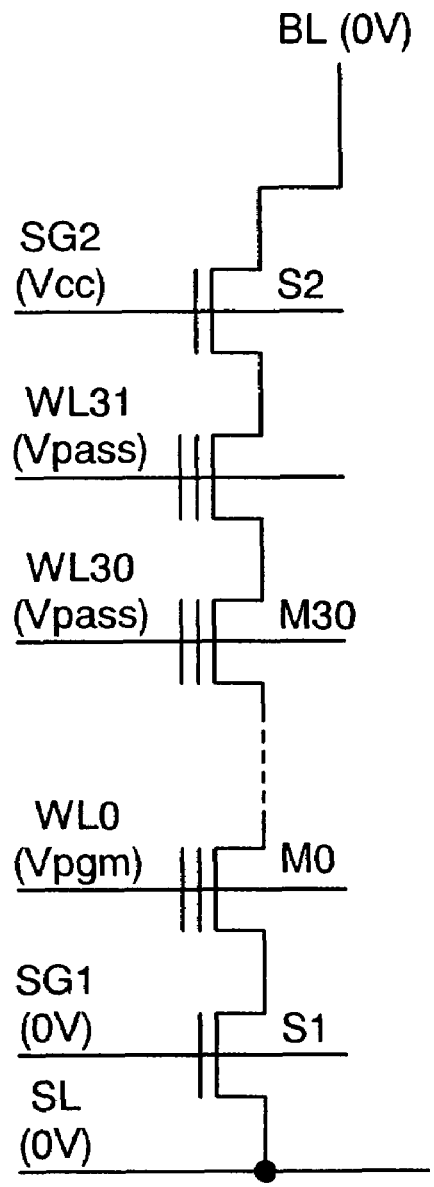
FIGS. 11A and 11B are each a diagram for explaining writing operation of NAND type nonvolatile memory.

As shown in FIG. 11A, in the case where "0" is written, for example, Vcc (power supply voltage) is applied to a selection gate line SG2 to turn a selection transistor S2 on and 0 V (ground voltage) is applied to a bit line BL. 0 V is applied to a selection gate line SG1 to turn a selection transistor S1 off. Next, high potential Vpgm (approximately 20 V) is applied to a word line WL0 of a nonvolatile memory element M0 and intermediate potential Vpass (approximately 10 V) is applied to the other word lines. Since the voltage of the bit line BL is 0 V, potential of a channel formation region of the selected nonvolatile memory element M0 becomes 0 V. A potential difference between the word line WL0 and the channel formation region is large; therefore, electrons are injected into a charge storage layer of the nonvolatile memory element M0 by F-N type tunnel current as described above. Consequently, the nonvolatile memory element M0 is in a state where threshold voltage is positive polarity (a state in which "0" has been written).

Figure 11B:
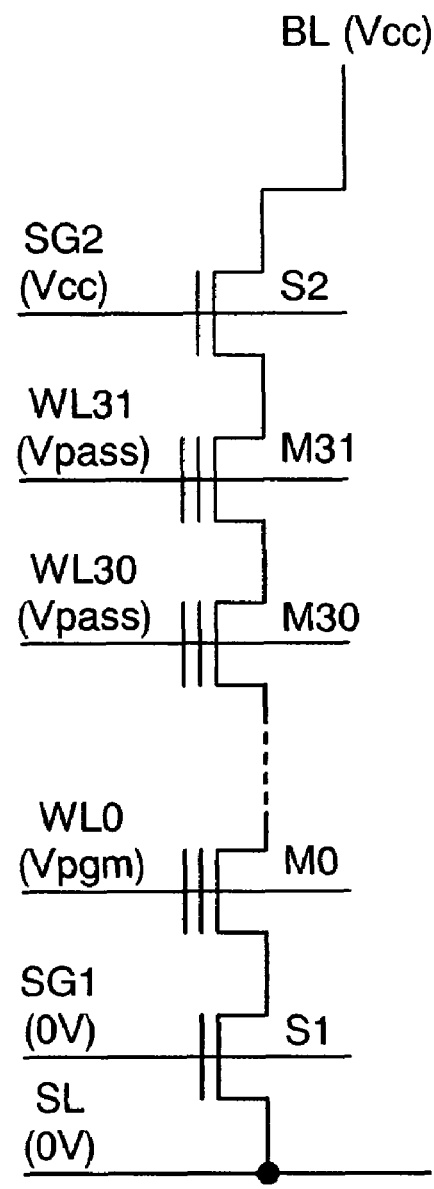

On the other hand, in the case where "1" is written, as shown in FIG. 11B, Vcc (power supply voltage) is applied to a bit line BL. Since potential of a selection gate line SG2 is Vcc, in the case of Vcc-Vth (Vth is threshold voltage of a selection transistor S2), the selection transistor S2 is cut off. Therefore, a channel formation region of a nonvolatile memory element M0 is in a floating state. Next, when high potential Vpgm (20 V) is applied to a word line WL0 and intermediate potential Vpass (10 V) is applied to the other word lines, voltage of a channel formation region rises from Vcc-Vth and becomes, for example, approximately 8 V, due to capacitance coupling of each word line and the channel formation region. Since the voltage of the channel formation region is boosted, a potential difference between the word line WL0 and the channel formation region is small, which differs from the case where "0" is written. Therefore, electron injection into a charge storage layer of the nonvolatile memory element M0 by F-N type tunnel current does not occur. Accordingly, the nonvolatile memory element M0 is kept in a state where threshold voltage is negative polarity (a state in which "1" has been written).

Figure 57:
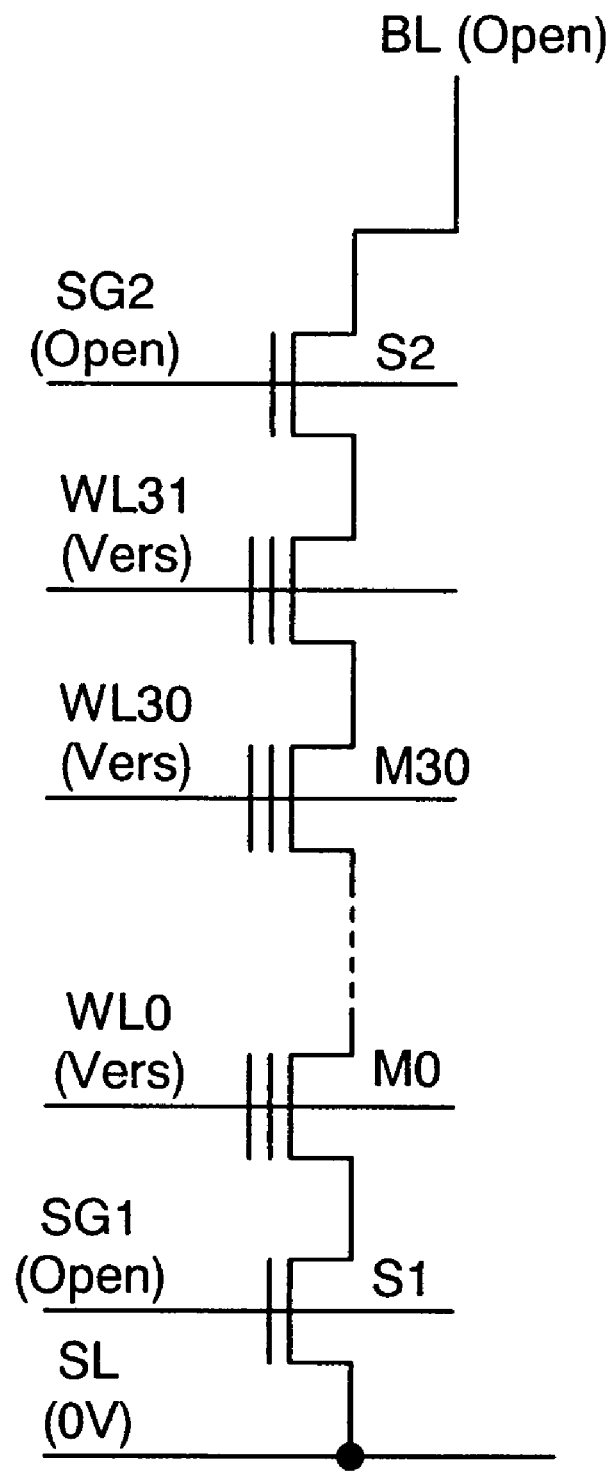
FIG. 57 is a view for explaining erasing operation of NAND type nonvolatile memory.

In the case where an erasing operation is performed, as shown in FIG. 57, high potential of negative polarity (Vers) is applied to all word lines in a selected block. A bit line BL and a source line SL are made in a floating state. Accordingly, in all memory cells in the block, electrons in a charge storage layer are discharged to a semiconductor layer by tunnel current. As a result, threshold voltage of these memory cells shifts in a negative direction.

Figure 12A:
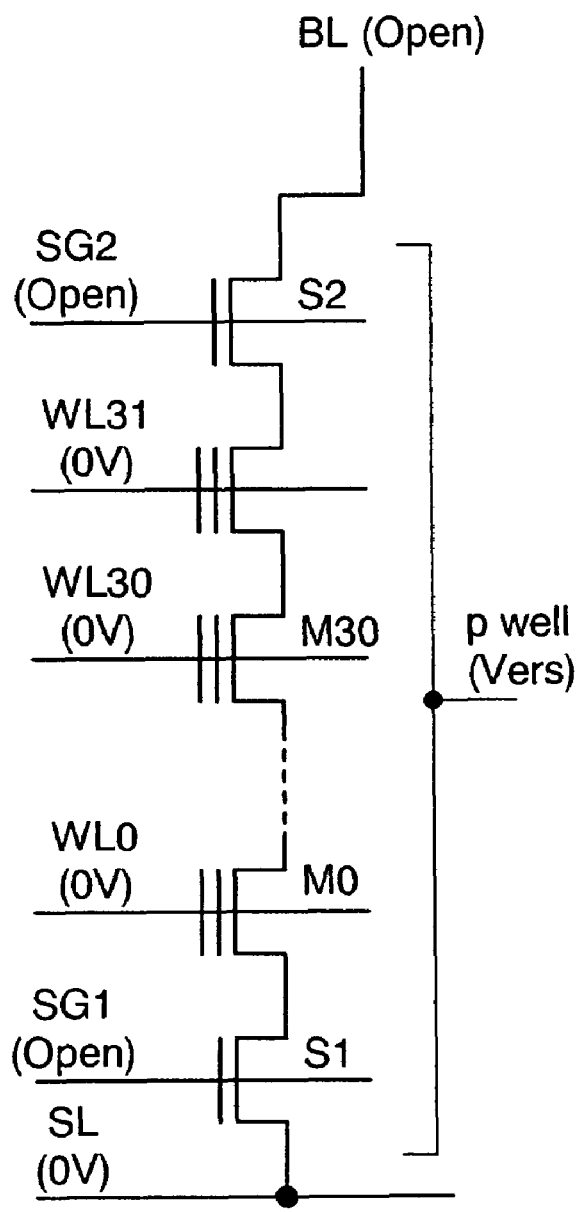
FIGS. 12A and 12B are a diagram for explaining erasing operation of NAND type nonvolatile memory and a diagram for explaining reading operation of NAND type nonvolatile memory, respectively.

In addition, in the case where the nonvolatile memory is formed using the semiconductor substrate 30 instead of the semiconductor layer 18, 0 V is applied to all word lines in a selected block and high potential of negative polarity (Vers) is applied to a p-well as shown in FIG. 12A. A bit line BL and a source line SL are made in a floating state. Consequently, in all memory cells in the block, electrons in a floating gate are discharged to a semiconductor substrate by tunnel current. As a result, threshold voltages of these memory cells shift in a negative direction.

Figure 12B:
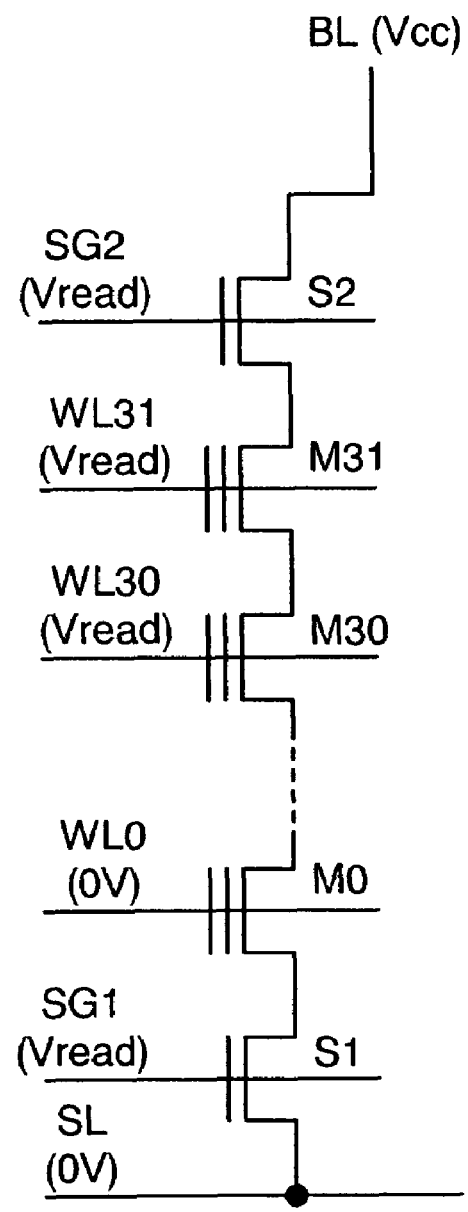
Figure 13:
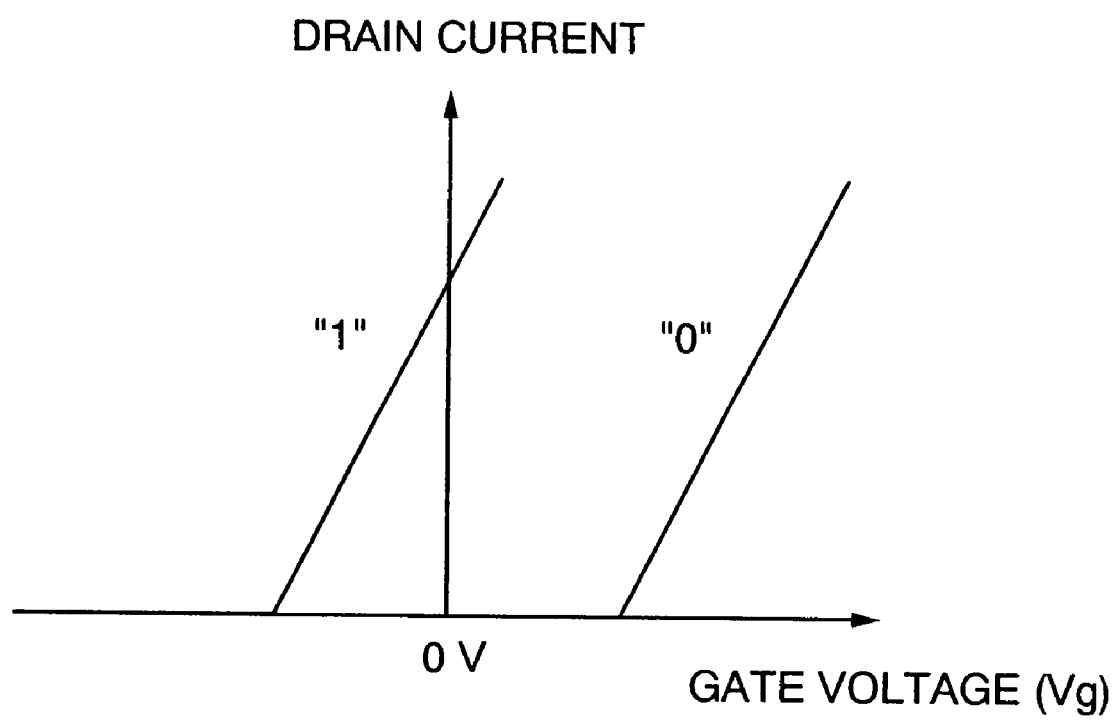
FIG. 13 is a diagram for explaining change in threshold voltage of nonvolatile memory in the case of "0" where charge is stored and the case of "1" where charge is erased.

In reading operation shown in FIG. 12B, potential Vr (such as 0 V) is applied to a word line WL0 of a nonvolatile memory element M0 selected for reading and intermediate potential Vread for reading which is slightly higher than power supply potential is applied to word lines WL1 to WL31 and selection gate lines SG1 and SG2 which are not selected for reading. That is, as shown in FIG. 13, a memory element other than the selected memory element operates as a transfer transistor. Accordingly, the transfer transistor detects whether or not current flows through the nonvolatile memory element M0 selected for reading. In other words, in the case where data stored in the nonvolatile memory element M30 is "0", the nonvolatile memory element M0 is turned off; accordingly, a bit line BL does not discharge electricity. On the other hand, in the case where data stored in the nonvolatile memory element M0 is "1", the nonvolatile memory element M0 is turned on; accordingly, the bit line BL discharges electricity.

Figure 14:
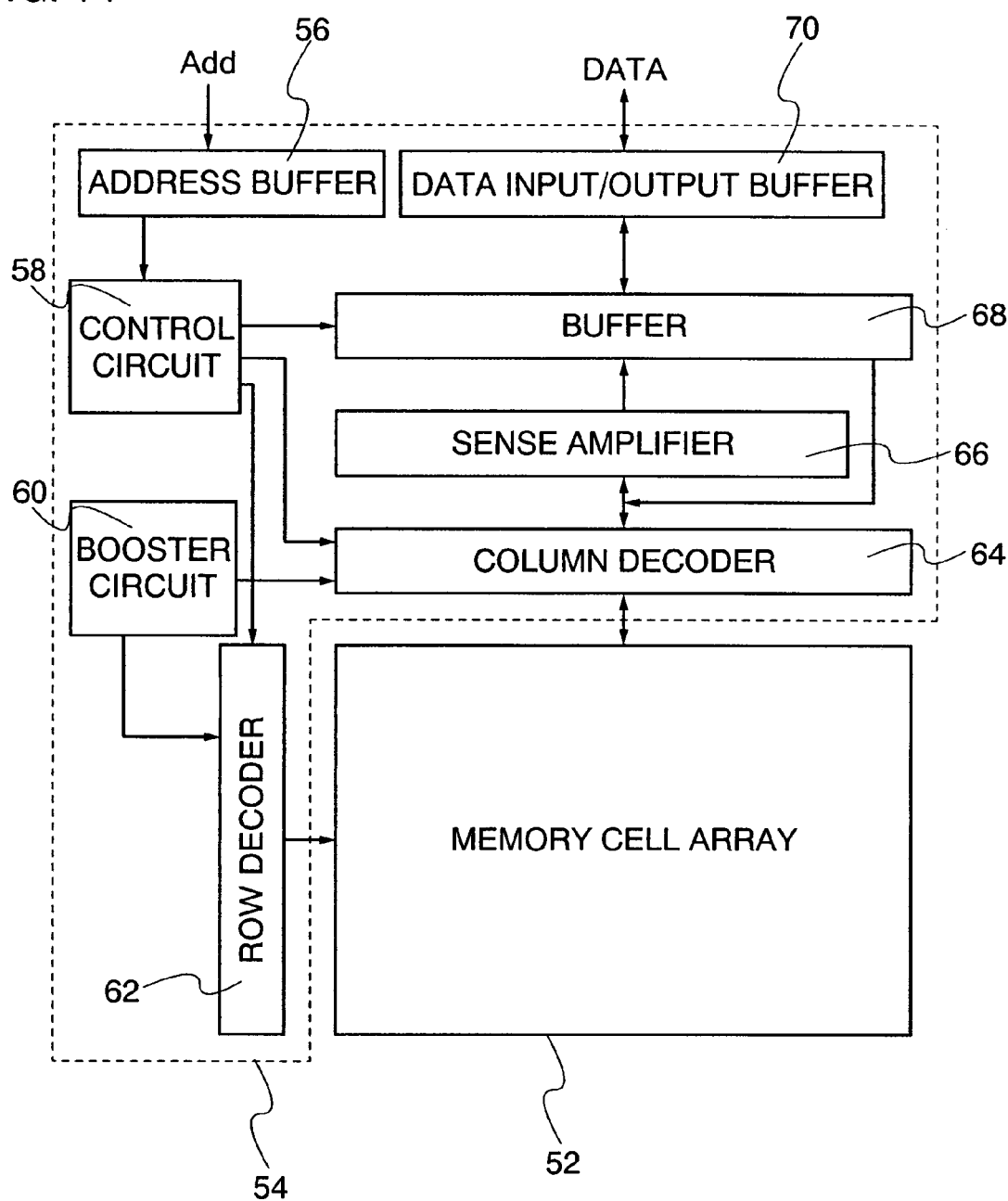
FIG. 14 is a diagram for showing an example of a circuit block diagram of a nonvolatile semiconductor memory device.

FIG. 14 shows an example of a circuit block diagram of a nonvolatile semiconductor memory device. The nonvolatile semiconductor memory device includes a memory cell array 52 and a peripheral circuit 54 which are formed over the same substrate. The memory cell array 52 has a structure like the structure shown in FIGS. 8, 9, and 10. A structure of the peripheral circuit 54 is explained below.

A row decoder 62 for selecting a word line and a column decoder 64 for selecting a bit line are provided around the memory cell array 52. An address is sent to a control circuit 58 through an address buffer 56, and an inner row address signal and an inner column address signal are transferred to the row decoder 62 and the column decoder 64, respectively.

Potential obtained by boosting power supply potential is used for writing and erasing of data. Therefore, a booster circuit 60 controlled by the control circuit 58 according to an operation mode is provided. Output of the booster circuit 60 is supplied to a word line WL or a bit line BL through the row decoder 62 and the column decoder 64. Data output from the column decoder 64 is input to a sense amplifier 66. Data read by the sense amplifier 66 is retained in a data buffer 68. Data retained in the data buffer 68 is accessed randomly by control by the control circuit 58, and is output through a data input/output buffer 70. Writing data is once retained in the data buffer 68 through the data input/output buffer 70 and is transferred to the column decoder 64 by control by the control circuit 58.

As described above, in the nonvolatile semiconductor memory device, potential that differs from the power supply potential is necessary to be used in the memory cell array 52. Therefore, it is desirable that at least the memory cell array 52 and the peripheral circuit 54 be electrically insulated and isolated. In this case, as in embodiments 1 to 3 hereinafter explained, when a nonvolatile memory element and a transistor of a peripheral circuit are formed using a semiconductor layer formed over an insulating surface, insulation and isolation can be easily performed. Accordingly, a nonvolatile semiconductor memory device with no malfunction and low power consumption can be obtained.

Embodiment Mode 2

In this embodiment mode, a structure of the nonvolatile memory element of the above-described embodiment mode will be hereinafter explained, in which effects on the characteristics of the nonvolatile memory element due to a coverage defect of a first insulating layer 16 at edges of a semiconductor layer 18, storage of charge in a manufacturing process, or the like, especially, effects on the characteristics of the nonvolatile memory element due to a coverage defect when the first insulating layer 16 is thin, storage of charge in a manufacturing process, or the like can be reduced.

Figure 51A:
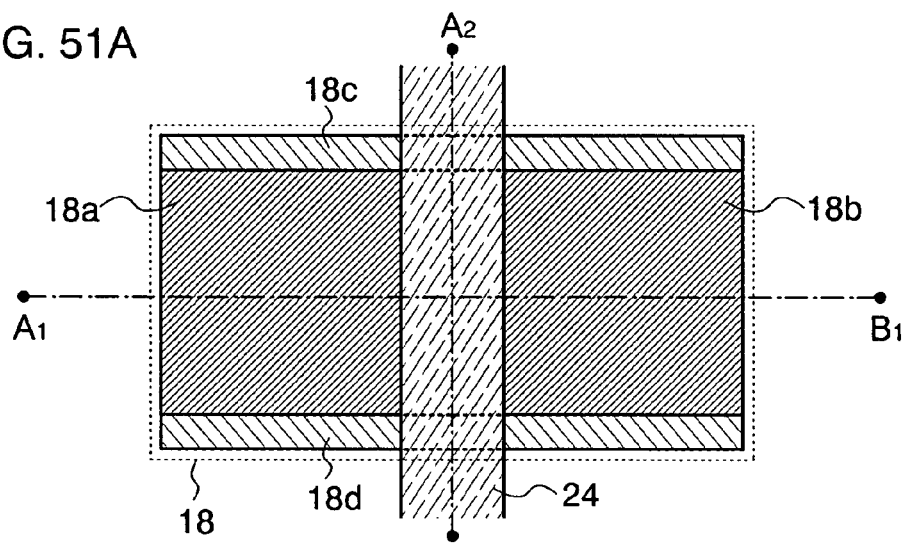
FIGS. 51A to 51C are a top view and cross-sectional views for describing a main structure of a nonvolatile semiconductor memory device of the present invention.
Figure 51B:
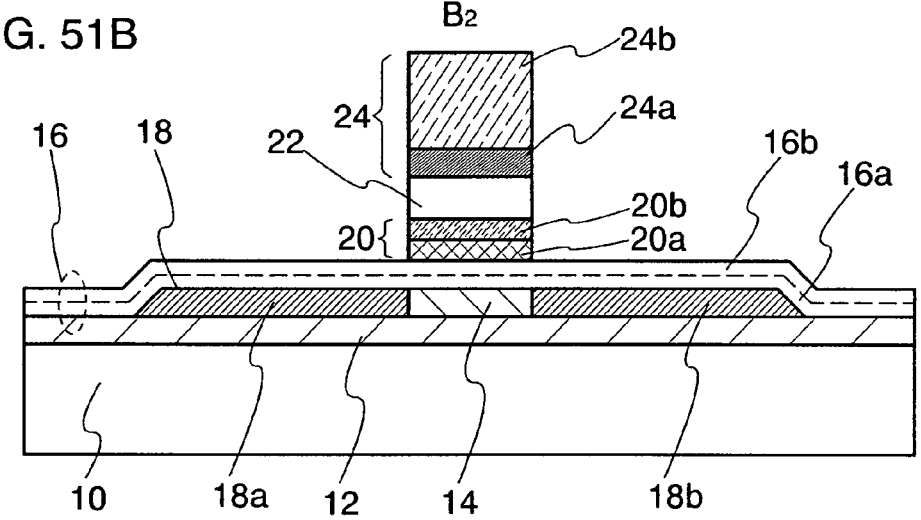
Figure 51C:
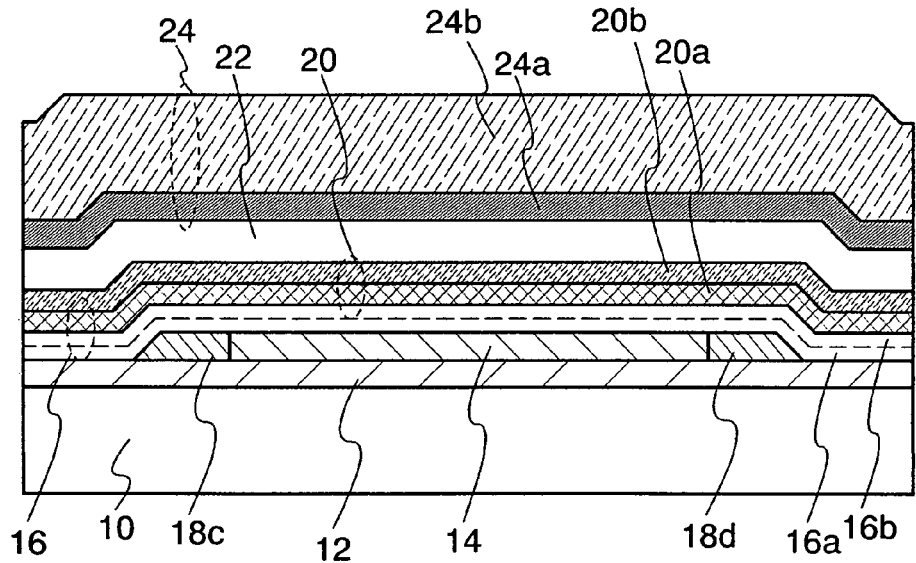

FIG. 51A shows a top view of a nonvolatile memory element, and FIG. 51B and FIG. 51C are schematic cross-sectional views taken along a line $A_1$-$B_1$ and a line $A_2$-$B_2$ of FIG. 51A, respectively.

In the structure shown in FIGS. 51A to 51C, the island-shaped semiconductor layer 18 includes the channel formation region 14 which is provided in a region overlapping with the control gate electrode 24, the first impurity regions 18a and 18b for forming a source region and a drain region which are formed adjacent to the channel formation region 14 and are formed in regions which do not overlap with the control gate electrode, and second impurity regions 18c and 18d provided in regions that are edges of the semiconductor layer 18 and are partly overlapped with the control gate electrode 24. The second impurity regions 18c and 18d are formed adjacent to the channel formation region 14 and the first impurity regions 18a and 18b.

The first impurity regions 18a and 18b and the second impurity regions 18c and 18d are provided so as to have different conductivity types. For example, in the case where the first impurity regions 18a and 18b are provided to have n-type conductivity, the second impurity regions 18c and 18d are provided to have p-type conductivity. In the case where the first impurity regions 18a and 18b are provided to have p-type conductivity, the second impurity regions 18c and 18d are provided to have n-type conductivity. Here, the first impurity regions 18a and 18b each of which serves as a source region or drain region are provided to have n-type conductivity and the second impurity regions 18c and 18d are provided to have p-type conductivity. In addition, in the case where channel-dope is performed in advance to the channel formation region 14 of the semiconductor layer 18, the second impurity regions 18c and 18d and the channel formation region 14 may be p-type impurity regions with the same concentration.

As described above, the second impurity regions 18c and 18d that have a different conductivity type from that of the first impurity regions 18a and 18b are provided to be adjacent to the channel formation region 14 and the first impurity regions 18a and 18b, in the regions that are the edges of the semiconductor layer 18 and are partly overlapped with the control gate electrode 24, whereby portions where the first impurity regions 18a and 18b and the second impurity regions 18c and 18d are adjacent to each other have high resistance by pn-junction. As a result, an influence on the characteristics of the nonvolatile memory element due to leak current caused by a coverage defect of the first insulating layer 16 at the edges of the semiconductor layer 18, storage of charge in a manufacturing process, or the like can be suppressed.

Figure 52A:
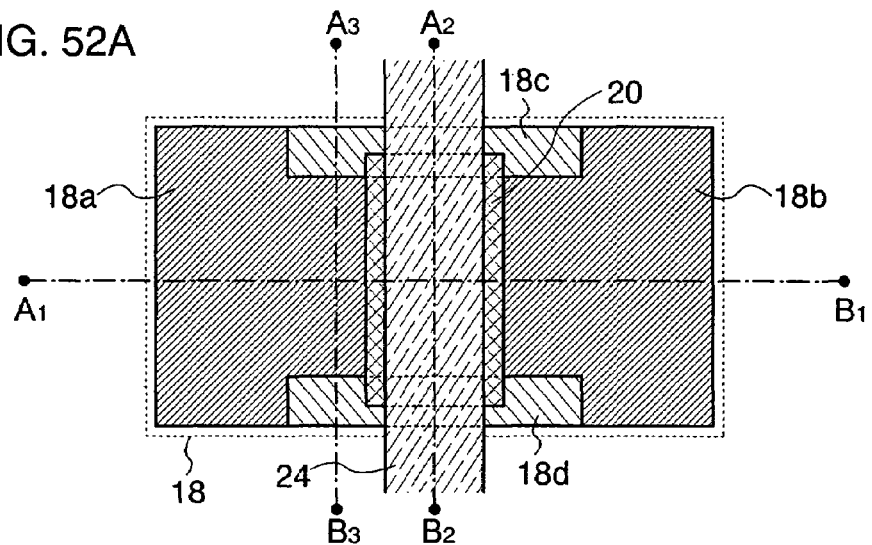
FIGS. 52A to 52C are a top view and cross-sectional views for describing a main structure of a nonvolatile semiconductor memory device of the present invention.
Figure 52B:
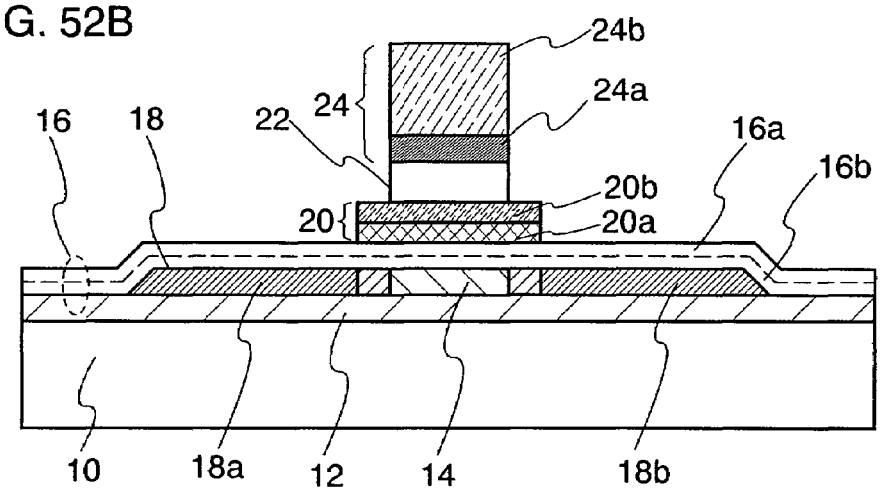
Figure 52C:
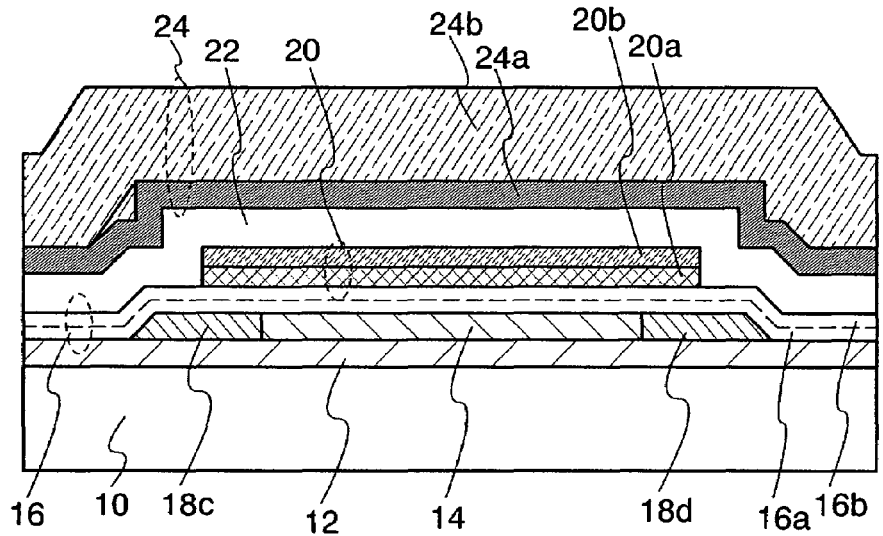

In addition, the second impurity regions 18c and 18d may be provided in regions where the semiconductor layer 18 and the control gate electrode 24 overlap with each other. Therefore, as shown in FIGS. 52A to 52C, the second impurity regions 18c and 18d may be provided only in regions which are adjacent to the regions where the semiconductor 18 and the control gate electrode 24 overlap with each other. Thus, a structure may also be employed, in which the impurity regions 18c and 18d are selectively provided in the semiconductor layer 18 to overlap with each pair of edges of the charge storage layer 20 (here, the edges of the charge storage layer 20 roughly perpendicular to a flowing direction of carriers in a channel formation region (a direction connecting a source region and a drain region)) and in an adjacent region thereof (see FIG. 52A). It is to be noted that FIG. 52A shows a top view of the nonvolatile memory element and FIGS. 52B and 52C show schematic cross-sectional views taken along lines $A_1$-$B_1$ and $A_2$-$B_2$ of FIG. 52A, respectively.

Figure 53A:
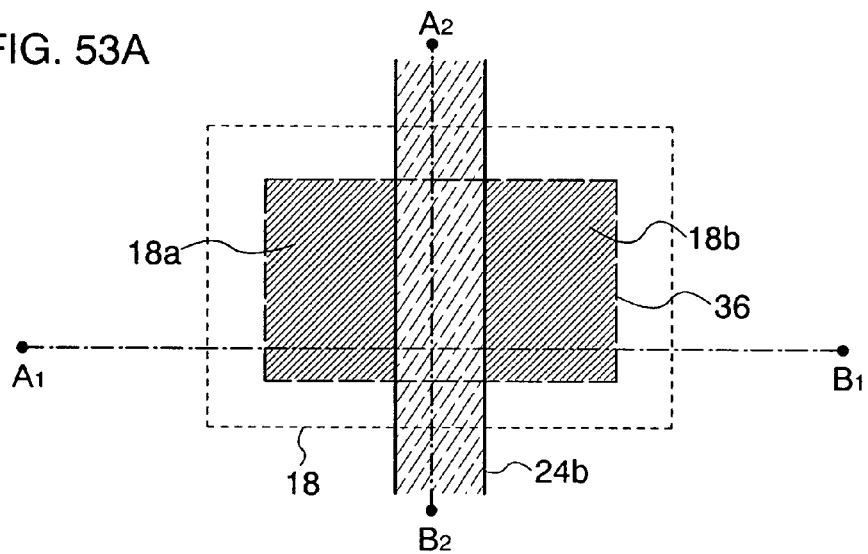
FIGS. 53A to 53C are a top view and cross-sectional views for describing a main structure of a nonvolatile semiconductor memory device of the present invention.
Figure 53B:
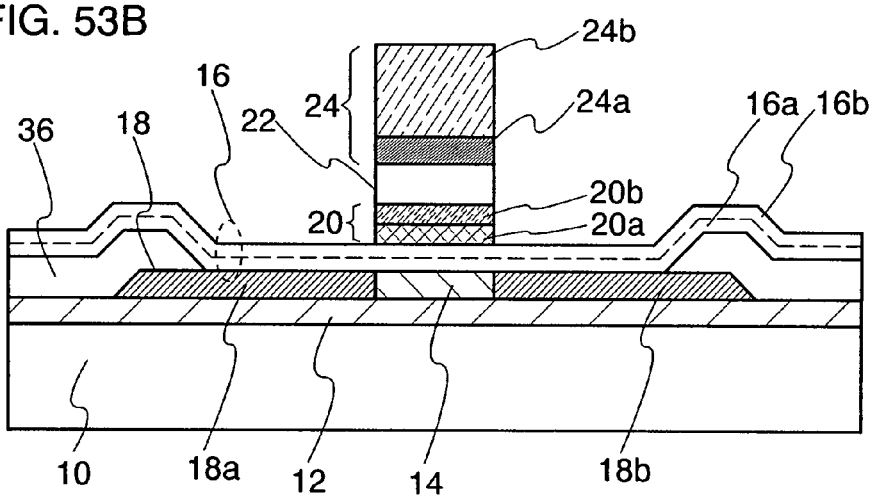
Figure 53C:
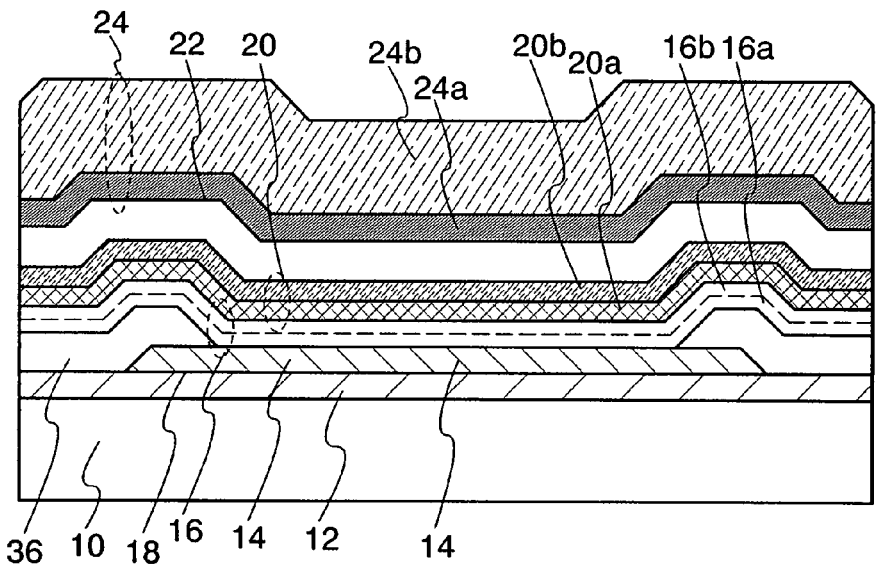

In addition, an insulating layer 36 for covering edges of the semiconductor layer 18 may also be formed (see FIG. 53A). It is to be noted that FIG. 53A shows a top view of a nonvolatile memory element and FIGS. 53B and 53C show schematic cross-sectional views taken along lines $A_1$-$B_1$ and $A_2$-$B_2$ of FIG. 53A, respectively. The insulating layer 36 is provided in order to prevent a short-circuit between the semiconductor layer 18 and the control gate electrode 24 or the charge storage layer 20. Therefore, it is preferable that the insulating layer 36 be formed over the semiconductor layer 18 in a region where the edges of the semiconductor layer 18 and the control gate electrode or the charge storage layer overlap with each other.

In FIG. 53A, dashed lines denotes edges of the insulating layer 36. The insulating layer 36 is not formed inside the dashed lines, and the insulating layer 36 is formed outside the dashed lines to cover the edges of the semiconductor layer 18. That is, the insulating layer 36 has an opening over the semiconductor layer 18.

Here, after the insulating layer 36 for covering the edges of the semiconductor layer 18 is formed, an insulating layer 16 serving as a tunnel oxide film is formed; however, the present invention is not limited to this structure. The insulating layer 36 may be formed after the insulating layer 16 serving as the tunnel oxide film is formed.

It is to be noted that, since the insulating layer 36 for covering the edges of the semiconductor layer 18 is provided in order to prevent a short-circuit between the edges of the semiconductor layer 18 and the control gate electrode 24 or the charge storage layer 20, the insulating layer 36 may be formed in a region where the edges of the semiconductor layer 18 and the control gate electrode 24 or the charge storage layer 20 overlap with each other.

Figure 54A:
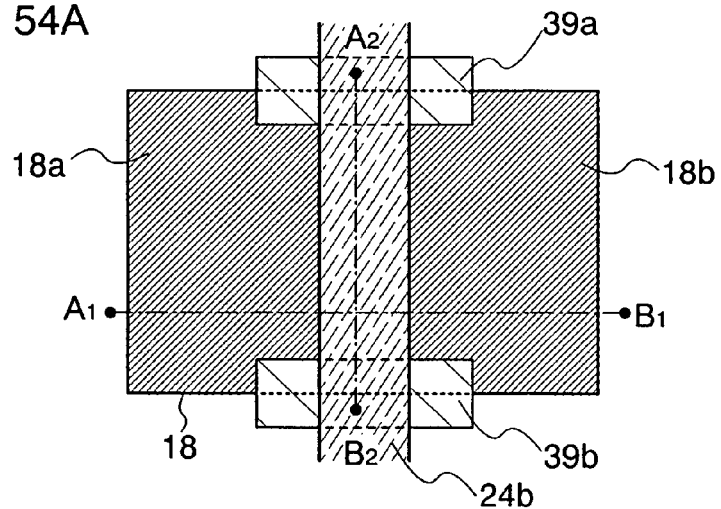
FIGS. 54A to 54C are a top view and cross-sectional views for describing a main structure of a nonvolatile semiconductor memory device of the present invention.
Figure 54B:
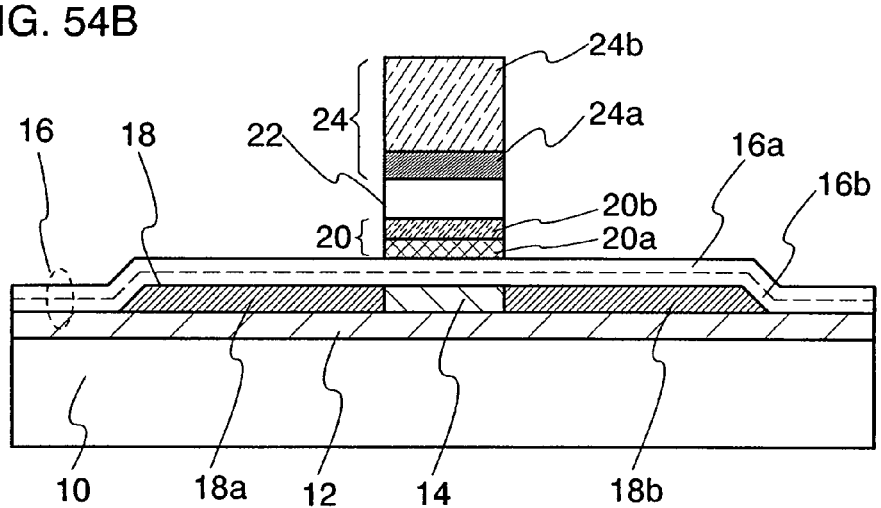
Figure 54C:
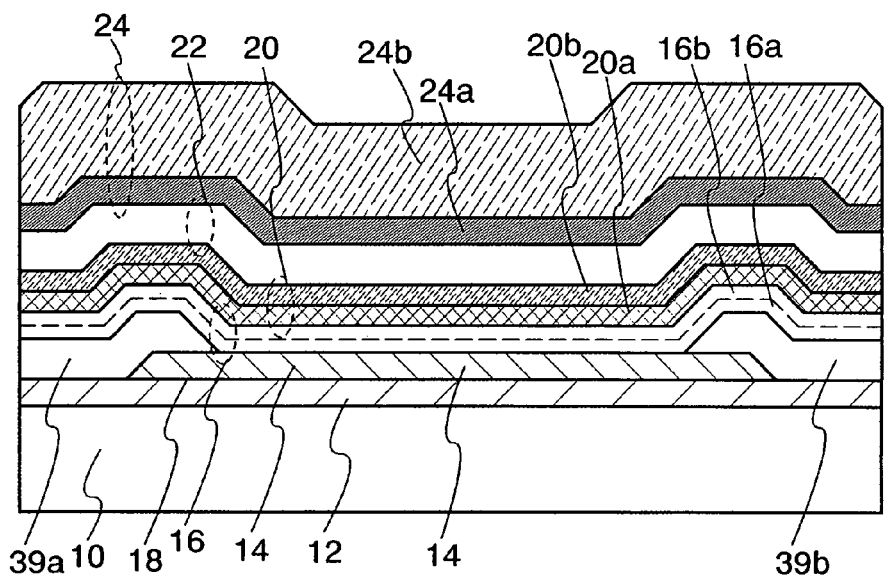

Typically, as shown in FIGS. 54A to 54C, insulating layers 39a and 39b may be formed in regions where the edges of the semiconductor layer 18 and the control gate electrode 24 or the charge storage layer 20 overlap with each other. That is, the insulating layers 39a and 39b are discontinuous layers which are formed discontinuously over the substrate. Therefore, as shown in FIG. 54B, the insulating layers 39a and 39b are not formed in a cross-sectional view taken along a line $A_1$-$A_1$, but formed only in the regions, in the edges of the semiconductor layer 18, where the control gate electrode 24 or the charge storage layer 20 is formed, as shown in a cross-sectional view shown in FIG. 54C taken along a line $A_2$-$B_2$.

The length of each of the insulating layers 39a and 39b in the channel length direction of the control gate electrode is greater than or equal to 3 μm and less than or equal to 10 μm, preferably, greater than or equal to 3 μm and less than or equal to 5 μm.

Each of the insulating layers 36, 39a, and 39b is formed of silicon oxide, aluminum nitride, silicon nitride, a stacked-layer structure formed from silicon oxide and silicon nitride, a stacked-layer structure formed from silicon oxide and aluminum nitride, or the like. Alternatively, the insulating layers 36, 39a, and 39b each can be provided as a single-layer structure or a stacked-layer structure formed from an organic material such as an epoxy resin, polyimide, polyamide, polyvinyl phenol, benzocyclobutene, or an acrylic resin, or a siloxane material such as a siloxane resin. It is to be noted that the siloxane material corresponds to a material containing a Si—O—Si bond. Siloxane has a skeleton structure of a bond of silicon (Si) and oxygen (O). As a substituent, an organic group containing at least hydrogen (for example, an alkyl group or an aryl group) is used. As the substituent, a fluoro group may be used. Alternatively, as the substituent, an organic group containing at least hydrogen and a fluoro group may be used.

It is preferable that the thicknesses of the insulating layers 36, 39a, and 39b be thicknesses which can prevent the semiconductor layer 18, the insulating layers 36, 39a, and 39b, and the control gate electrode 24 from operating as a transistor. Alternatively, it is preferable that the thicknesses of the insulating layers 36, 39a, and 39b be thicknesses which can prevent the semiconductor layer 18, the insulating layers 36, 39a, an 39b, the charge storage layer 20, and the control gate electrode 24 from operating as a nonvolatile memory element.

In this manner, the formation of the insulating layers 36, 39a, and 39b for covering the edges of the semiconductor layer 18 makes it possible to prevent a short-circuit between the edges of the semiconductor layer 18 and the control gate electrode 24 or the charge storage layer 20. In particular, this is effective in the case where the thickness of the insulating layer serving as the gate insulating film is thinner than that of the semiconductor layer 18, for example, several nanometers to several tens of nanometers. In addition, in the case where the insulating layer formed over the semiconductor layer 18 is removed entirely by etching, a depression might be formed in a portion where the edges of the semiconductor layer 18 and the insulating layer 12 are in contact with each other; however, the depression can be filled with the insulating layer by the formation of the insulating layers 36, 39a, and 39b. Therefore, in the case where the first insulating layer or the like serving as the tunnel oxide film is formed, a coverage defect or the like can be reduced. As a result, reliability of a semiconductor element to be formed later can be improved.

Embodiment 1

In this embodiment, an example of a nonvolatile semiconductor memory device will be explained with reference to drawings. Here, the case where, in the nonvolatile semiconductor memory device, a nonvolatile memory element for forming a memory portion and an element such as a transistor for forming a logic portion, which is formed over the same substrate as the memory portion and performs control of the memory portion, or the like are formed at the same time will be explained.

First, a schematic view of the memory portion in the nonvolatile semiconductor memory device is shown in FIG. 8.

In the memory portion shown in this embodiment, a plurality of memory cells each of which have a controlling transistor S and a nonvolatile memory element M is provided. In FIG. 8, one memory cell is formed of a controlling transistor S01 and a nonvolatile memory element M01. In addition, similarly, a memory cell is formed of a controlling transistor S02 and a nonvolatile memory element M02, another memory cell is formed of a controlling transistor S03 and a nonvolatile memory element M03, another memory cell is formed of a controlling transistor S11 and a nonvolatile memory element M11, another memory cell is formed of a controlling transistor S12 and a nonvolatile memory element M12, and another memory cell is formed of a controlling transistor S13 and a nonvolatile memory element M13.

A gate electrode of the controlling transistor S01 is connected to a word line WL1, one of a source and a drain is connected to a bit line BL0, and the other is connected to a source or drain of the nonvolatile memory element M01. In addition, a gate electrode of the nonvolatile memory element M01 is connected to a word line WL11, one of the source and the drain is connected to the source or drain of the controlling transistor S0, and the other is connected to a source line SL0.

It is to be noted that, since driving voltage of the controlling transistor provided in the memory portion is higher than that of the transistor provided in the logic portion, it is preferable that a gate insulating film or the like of the transistor provided in the memory portion and a gate insulating film or the like of the transistor provided in the logic portion be formed with different thicknesses. For example, when low driving voltage and reduction in variations in threshold voltage are desired, it is preferable that a thin film transistor having a thin gate insulating film be formed. When high driving voltage and withstand voltage of a gate insulating film are necessary, it is preferable that a thin film transistor having a thick gate insulating film be formed.

Accordingly, in this embodiment, the case where a thin insulating layer is formed in the transistor of the logic portion where low driving voltage and reduction in variations in threshold voltage are desired and the case where a thick insulating layer is formed in the transistor of the memory portion where high driving voltage and withstand voltage of the gate insulating film are necessary are explained with reference to drawings. It is to be noted that FIGS. 22 to 24 each show a top view, and FIGS. 16A to 16C, FIGS. 17A to 17C, FIGS. 18A to 18C, FIGS. 19A and 19B, FIGS. 20A to 20C, and FIGS. 21A and 21B show cross-sectional views taken along lines A-B, C-D, E-F, and G-H of FIGS. 22, 23, and 24. In addition, each of portions taken along the lines A-B and C-D shows a thin film transistor provided in a logic portion, a portion taken along the line E-F shows a nonvolatile memory element provided in a memory portion, and a portion taken along the line G-H shows a thin film transistor provided in the memory portion. In this embodiment, the case where the thin film transistor provided in the portion taken along the line A-B is of p-channel type, the case where the thin film transistors provided in the portions taken along the lines C-D and G-H are of n-channel type, and the case where storage of charge of the nonvolatile memory element provided in the portion taken along the line E-F is performed by electrons are explained; however, the nonvolatile semiconductor memory device of the present invention is not limited thereto.

Figure 22:
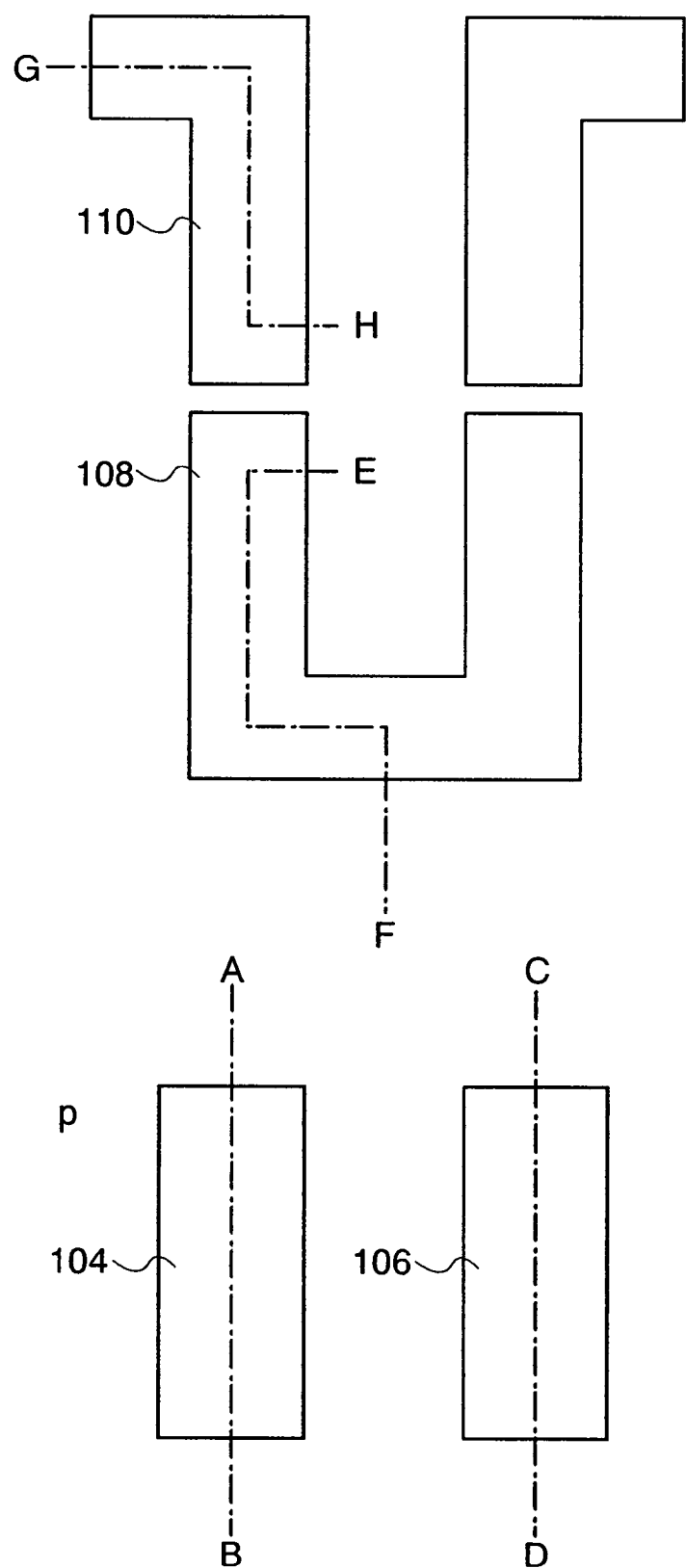
FIG. 22 is a view for showing an example of a top surface of a nonvolatile semiconductor memory device of the present invention.

First, island-shaped semiconductor layers 104, 106, 108, and 110 are formed over a substrate 100 with an insulating layer 102 interposed therebetween, and a first insulating layer 112 is formed so as to cover the island-shaped semiconductor layer 104, 106, 108, and 110 (see FIG. 16A and FIG. 22).

The island-shaped semiconductor layers 104, 106, 108, and 110 can be provided by a method in which an amorphous semiconductor layer is formed using a material containing silicon (Si) as its main component, or the like over the insulating layer 102 which has been formed over the substrate 100 in advance, by a sputtering method, an LPCVD method, a plasma CVD method, or the like, and the amorphous semiconductor layer is crystallized, and then, is selectively etched. Further, crystallization of the amorphous semiconductor layer can be performed by a laser crystallization method, a thermal crystallization method using RTA or an annealing furnace, a thermal crystallization method using a metal element that promotes crystallization, a method in which these methods are combined, or the like.

In the case of performing crystallization or recrystallization of the semiconductor layer by laser light irradiation, an LD-pumped continuous wave (CW) laser (for example, $YVO_4$ with a second harmonic (wavelength of 532 nm)) can be used as a laser light source. Although the wavelength is not specifically limited to the second harmonic, the second harmonic is superior to harmonics higher than that in terms of energy efficiency. When a semiconductor layer is irradiated with a CW laser, energy can be continuously given to the semiconductor layer. Therefore, once the semiconductor layer is made into a molten state, the molten state can be retained. Furthermore, by scanning the semiconductor layer with the CW laser, a solid-liquid interface of the semiconductor layer can be moved, and crystal grains which are long in one direction can be formed along the moving direction. The reason for using a solid-state laser is to obtain more stable output than the case of using a gas laser or the like, and thus more stable treatment can be expected. It is to be noted that the laser light source is not limited to the CW laser and a pulsed laser with a repetition rate of 10 MHz or higher can be used as well. When a pulsed laser with a high repetition rate is used, a semiconductor layer can be constantly retained in the molten state on the condition that a pulse interval of laser is shorter than a time interval from the point when the semiconductor layer is melted to the point when the semiconductor layer becomes solidified. Thus, the semiconductor layer with crystal grains which are long in one direction can be formed by move of the solid-liquid interface. It is also possible to employ other types of CW lasers or pulsed lasers with a repetition rate of 10 MHz or higher. For example, gas lasers such as an Ar laser, a Kr laser, and a $CO_2$ laser can be used, or solid-state lasers such as a YAG laser, a YLF laser, a $YAlO_3$ laser, a $GdVO_4$ laser, a KGW laser, a KYW laser, an alexandrite laser, a Ti:sapphire laser, a $Y_2O_3$ laser, and a $YVO_4$ laser can be used. In addition, ceramic lasers such as a YAG laser, a $Y_2O_3$ laser, a $GdVO_4$ laser, and a $YVO_4$ laser can also be used. As a metal vapor laser, a helium-cadmium laser and the like can be given as examples. Laser light is preferably emitted from a laser oscillator with $TEM_{00}$ (single transverse mode), which can increase the energy uniformity of a linear beam spot that is obtained on the surface to be irradiated. Besides, a pulsed excimer laser can be used.

An SOI (Silicon-On-Insulator) substrate can be used instead of the above methods. As the SOI substrate, a so-called SIMOX (Separation by IMplanted OXygen) substrate may be used, which is formed in such a manner that after oxygen ions are injected into a mirror-polished wafer, an oxide layer is formed to a certain depth from a surface by high-temperature annealing as well as eliminating defects generated in a surface layer. A semiconductor layer of SOI can be used as the semiconductor layers 104, 106, 108, and 110.

The substrate 100 is selected from a glass substrate, a quartz substrate, a ceramic substrate, a metal substrate (for example, a stainless steel substrate), and a semiconductor substrate such as a Si substrate. Besides, the substrate 100 may be a plastic substrate made of polyethylene terephthalate (PET), polyethylene naphthalate (PEN), polyethersulfone (PES), or a substrate made of acrylic or the like.

The insulating layer 102 is formed using an insulating material such as silicon oxide, silicon nitride, or silicon oxynitride by a CVD method, a sputtering method, or the like. For example, in the case where the insulating layer 102 is formed of a two-layered structure, a silicon oxynitride layer is formed as a first insulating layer and a silicon oxynitride layer having a different composition from that of the first silicon oxynitride layer is formed as a second insulating layer. Alternatively, a silicon nitride layer is formed as the first insulating layer and a silicon oxide layer is formed as the second insulating layer. In this manner, the formation of the insulating layer 102 which serves as a blocking layer makes it possible to prevent an alkali metal such as Na or an alkaline earth metal from having an adverse effect on an element to be formed over the insulating layer 102 from the substrate 100. Further, in the case where quartz is used for the substrate 100, the insulating layer 102 may be omitted.

The first insulating layer 112 is formed of a single layer or a stacked layer using an insulating material such as silicon oxide, silicon nitride, or silicon oxynitride by a CVD method, a sputtering method, or the like. For example, in the case where the first insulating layer 112 is formed of a single layer, a silicon oxynitride layer is formed to a thickness of 5 to 50 nm by a CVD method. In addition, in the case where the first insulating layer 112 is formed of a three-layered structure, a silicon oxynitride layer is formed as a first insulating layer, a silicon nitride layer is formed as a second insulating layer, and a silicon oxynitride layer is formed as a third insulating layer.

The first insulating layer 112 formed over the semiconductor layer 110 serves as a gate insulating film in a thin film transistor to be completed later.

Next, the first insulating layer 112 formed over the semiconductor layers 104, 106, and 108 is selectively removed to expose surfaces of the semiconductor layers, 104, 106, and 108. Here, the semiconductor layer 110 provided in the memory portion is selectively covered with a resist 114, and the first insulating layer 112 formed over the semiconductor layers 104, 106, and 108 is selectively removed by etching as well as forming a first insulating layer 121 over the semiconductor layer 110 (see FIG. 16B).

Subsequently, second insulating layers 116, 118, and 120 are formed over the semiconductor layers 104, 106, and 108, respectively (see FIG. 16C).

The second insulating layers 116, 118, and 120 can be formed in such a manner that heat treatment, plasma treatment, or the like is performed to the semiconductor layers 104, 106, and 108. For example, oxidation treatment, nitridation treatment, or oxynitridation treatment is performed to the semiconductor layers 104, 106, and 108 by high density plasma treatment, whereby the second insulating layers 116, 118, and 120 each of which becomes an oxide layer, a nitride layer, or an oxynitride layer are formed over the semiconductor layers 104, 106, and 108, respectively. It is to be noted that the second insulating layers 116, 118, and 120 may be formed by a CVD method or a sputtering method. Alternatively, the second insulating layers 116, 118, and 120 may be formed in such a manner that high density plasma treatment is performed to a layer formed by a CVD method or a sputtering method.

For example, in the case where oxidation treatment or nitridation treatment is performed to a semiconductor layer containing Si as its main component which is used as the semiconductor layers 104, 106, and 108 by high density plasma treatment, a silicon oxide layer or a silicon nitride layer is formed as the second insulating layers 116, 118, and 120. Alternatively, after oxidation treatment is performed to the semiconductor layers 104, 106, and 108 by high density plasma treatment, nitridation treatment may be performed by another high density plasma treatment. In this case, a silicon oxide layer is formed to be in contact with the semiconductor layers 104, 106, and 108, and a nitrogen plasma-treated layer is formed over a surface of the silicon oxide layer or near the surface thereof.

Here, the second insulating layers 116, 118, and 120 are formed to a thickness of greater than or equal to 1 nm and less than or equal to 10 nm, preferably, greater than or equal to 1 nm and less than or equal to 5 nm. For example, oxidation treatment is performed to the semiconductor layers 104, 106, and 108 by high density plasma treatment to form a silicon oxide layer with a thickness of approximately 3 nm over a surface of each of the semiconductor layers 104, 106, and 108, and thereafter, nitrogen treatment is performed by high density plasma treatment to form a nitrogen plasma-treated layer over a surface of the silicon oxide layer or near the surface thereof. Specifically, first, a silicon oxide layer 16a is formed to a thickness of 3 to 6 nm over the semiconductor layers 104, 106, and 108 by plasma treatment under an oxygen atmosphere. Subsequently, plasma treatment is performed under a nitrogen atmosphere, whereby a nitrogen plasma-treated layer with high nitrogen concentration is provided over a surface of the silicon oxide layer or near the surface thereof. Here, a structure is employed, in which nitrogen is contained at 20 to 50 atomic % in approximately 1 nm deep from the surface of the silicon oxide layer by plasma treatment under a nitrogen atmosphere. Silicon containing oxygen and nitrogen (silicon oxynitride) is formed in the nitrogen plasma-treated layer. At this time, it is preferable that oxidation treatment and nitridation treatment by high density plasma treatment be continuously performed without any exposure to the air. By the continuous high density plasma treatment, contamination can be prevented from being mixed and improvement in production efficiency can be realized. In addition, at this time, a surface of the first insulating layer 121 formed over the semiconductor layer 110 is also oxidized or nitrided, so that a silicon oxynitride layer is formed in some cases.

It is to be noted that, in the case where the semiconductor layer is oxidized by high density plasma treatment, the plasma treatment is performed in an atmosphere containing oxygen (for example, an atmosphere containing oxygen ($O_2$) or dinitrogen monoxide ($N_2O$), and a rare gas (containing at least one of He, Ne, Ar, Kr, and Xe), or an atmosphere containing oxygen or dinitrogen monoxide, hydrogen ($H_2$), and a rare gas). Meanwhile, in the case where the semiconductor layer is nitrided by high density plasma treatment, the plasma treatment is performed in an atmosphere containing nitrogen (for example, an atmosphere containing nitrogen ($N_2$) and a rare gas (containing at least one of He, Ne, Ar, Kr, and Xe), an atmosphere containing nitrogen, hydrogen, and a rare gas, or an atmosphere containing $NH_3$ and a rare gas).

As the rare gas, for example, Ar can be used. Alternatively, a gas in which Ar and Kr are mixed may be used. In the case where high density plasma treatment is performed in a rare gas atmosphere, a rare gas (containing at least one of He, Ne, Ar, Kr, and Xe) used for the plasma treatment is contained in the first insulating layer 121 and the second insulating layers 116, 118, and 120 in some cases, and in the case where Ar is used, Ar is contained in the first insulating layer 121 and the second insulating layers 116, 118, and 120 in some cases.

In addition, the high density plasma treatment is performed in an atmosphere containing the above-described gas with an electron density of greater than or equal to $1\times10^{11}$ cm$^{-3}$ and an electron temperature of plasma of less than or equal to 1.5 eV. More specifically, the plasma treatment is performed with an electron density of greater than or equal to $1\times10^{11}$ cm$^{-3}$ and less than or equal to $1\times10^{13}$ cm$^{-3}$ and an electron temperature of plasma of greater than or equal to 0.5 eV and less than or equal to 1.5 eV. Since the electron density of plasma is high and the electron temperature near an object to be processed that is formed over the substrate 100 (here, the semiconductor layers 104, 106, 108, and 110) is low, damage due to plasma on the object to be processed can be prevented. Moreover, since the electron density of plasma is as high as $1\times10^{11}$ cm$^{-3}$ or more, an oxide layer or a nitride layer formed by a method in which the object to be processed is oxidized or nitrided by the plasma treatment is dense and superior in uniformity of its film thickness or the like in comparison with a layer formed by a CVD method, a sputtering method, or the like. Furthermore, since the electron temperature of plasma is as low as 1.5 eV or less, oxidation treatment or nitridation treatment can be performed at lower temperature than in conventional plasma treatment or thermal oxidation method. For example, oxidation treatment or nitridation treatment can be sufficiently performed even by plasma treatment at a temperature lower than the distortion point of a glass substrate by greater than or equal to 100° C. As a frequency for forming plasma, high frequency such as a microwave (for example, 2.45 GHz) can be used.

In this embodiment, in the case where oxidation treatment of an object to be processed is performed by high density plasma treatment, a mixed gas of oxygen ($O_2$), hydrogen ($H_2$), and argon (Ar) is introduced. The mixed gas used here may be introduced with oxygen at 0.1 to 100 sccm, hydrogen at 0.1 to 100 sccm, and argon at 100 to 5000 sccm. Further, it is preferable that the ratio for the introduced mixed gas be such that oxygen:hydrogen:argon=1:1:100. For example, oxygen may be introduced at 5 sccm, hydrogen at 5 sccm, and argon at 500 sccm.

In addition, in the case where nitridation treatment is performed by high density plasma treatment, a mixed gas of nitrogen ($N_2$) and argon (Ar) is introduced. The mixed gas used here may be introduced with nitrogen at 20 to 2000 sccm and with argon at 100 to 10000 sccm. For example, nitrogen may be introduced at 200 sccm and argon at 1000 sccm.

In this embodiment, the second insulating layer 120 formed over the semiconductor layer 108 provided in the memory portion serves as a tunnel oxide film in a nonvolatile memory element to be completed later. Therefore, when the second insulating layer 120 is thinner, tunnel current flows more easily and high speed operation as memory is possible.

In addition, when the second insulating layer 120 is thinner, charge can be stored in a charge storage layer to be formed later at lower voltage; thus, power consumption of the nonvolatile semiconductor memory device can be reduced. Therefore, it is preferable that the second insulating layers 116, 118, and 120 be formed to be thin (for example, less than or equal to 10 nm).

In general, a thermal oxidation method is given as a method for forming an insulating layer to be thin over a semiconductor layer; however, it is very difficult to form the second insulating layers 116, 118, and 120 by a thermal oxidation method in the case of using a substrate with a melting point that is not sufficiently high, such as a glass substrate, as the substrate 100. An insulating layer formed by a CVD method or a sputtering method includes a defect inside its film; accordingly, film quality is not sufficient and there is a problem in that a defect such as a pinhole occurs in the case of forming a thin insulating layer. In addition, in the case of forming an insulating layer by a CVD method or a sputtering method, coverage of edges of a semiconductor layer is not sufficient, and a conductive layer or the like to be formed over the second insulating layer 120 later and the semiconductor layer might be short-circuited. Therefore, as shown in this embodiment, when the second insulating layers 116, 118, and 120 are formed by high density plasma treatment, an insulating layer which is denser than an insulating layer formed by a CVD method, a sputtering method, or the like can be formed, and edges of the semiconductor layers 104, 106, and 108 can be sufficiently covered with the second insulating layers 116, 118, and 120, respectively. Accordingly, high-speed operation or a charge retention property can be improved as memory. It is to be noted that, in the case of forming the second insulating layers 116, 118, and 120 by a CVD method or a sputtering method, it is preferable that high density plasma treatment be performed after the insulating layer is formed and oxidation treatment, nitridation treatment, or oxynitridation treatment be performed to a surface of the insulating layer.

Next, charge storage layers 122a and 122b are formed so as to cover the first insulating layer 112 and the second insulating layers 116, 118, and 120 (see FIG. 17A). The charge storage layers 122a and 122b can be formed of an insulating layer with a defect of trapping charge inside its film. For example, as the charge storage layers 122a and 122b, a germanium nitride compound, a silicon nitride compound, an aluminum nitride compound, or the like can be stacked.

As the germanium nitride compound, germanium nitride, germanium nitride to which oxygen is added, germanium nitride to which oxygen and hydrogen are added, or the like can be added. In addition, germanium oxide, germanium oxide to which nitrogen is added, germanium oxide to which nitrogen and hydrogen are added, or the like can be used.

As the silicon nitride compound, silicon nitride, silicon nitride to which oxygen is added, silicon nitride to which oxygen and hydrogen are added, or the like can be used. In addition, silicon oxide to which nitrogen is added, silicon oxide to which nitrogen and hydrogen are added, or the like can be used. As the aluminum nitride compound, aluminum nitride, aluminum nitride to which oxygen is added, aluminum nitride to which oxygen and hydrogen are added, or the like is given.

Here, as the charge storage layer 122a, germanium nitride with a thickness of 1 to 20 nm, preferably, 1 to 10 nm, which is formed using $GeH_4$ and $NH_3$ as raw materials by a plasma CVD method is used. At this time, high-frequency power with an RF power of 100 W is applied under the following condition: a flow ratio of $GeH_4$ and $NH_3$ diluted by 5% with hydrogen is set to be 1:25; a substrate temperature is set at 300° C.; pressure is set to be 100 Pa; a distance between electrodes is set to be 21 mm; and power supply frequency is 27 MHz, whereby a germanium nitride layer containing Ge at 32.3 atomic %, N at 49.2 atomic %, and H at 18.5 atomic % can be formed.

In addition, as the charge storage layer 122b, silicon nitride with a thickness of 1 to 20 nm, preferably, 1 to 10 nm, which is formed using $SiH_4$, $N_2$, and Ar as a raw material by a plasma CVD method is used. At this time, high-frequency power with an RF power of 100 W is applied under the following condition: a flow ratio of $SiH_1$, $N_2$, and Ar is set to be 1:200:25; a substrate temperature is set at 400° C.; pressure is set to be 40 Pa; a distance between electrodes is set to be 30 mm; and power supply frequency is 60 MHz, whereby a silicon nitride layer containing Si at 44 atomic %, N at 43.5 atomic %, and H at 13.5 atomic % can be formed. It is to be noted that the charge storage layers 122a and 122b provided in the memory portion serve as layers for trapping charge in the nonvolatile memory element to be completed later.

Next, the second insulating layer 116 and the charge storage layers 122a and 122b formed over the semiconductor layer 104, the second insulating layer 118 and the charge storage layers 122a and 122b formed over the semiconductor layer 106, and the charge storage layers 122a and 122b formed over the semiconductor layer 110 are selectively removed, so that the second insulating layer 120 and the charge storage layers 122a and 122b formed over the semiconductor layer 108 are left. Here, the semiconductor layer 108 provided in the memory portion is selectively covered with a resist 124, and the second insulating layers 116 and 118, and the charge storage layers 122a and 122b which are not covered with the resist 124 are selectively removed by etching (see FIG. 17B). It is to be noted that, in FIG. 17B, an example is shown, in which the charge storage layers 122a and 122b are selectively removed by etching, so that part of the charge storage layers 122a and 122b are left, whereby charge storage layers 126a and 126b are formed.

Next, a third insulating layer 128 is formed so as to cover the semiconductor layers 104 and 106, the charge storage layers 126a and 126b formed over the semiconductor layer 108, and the first insulating layer 121 formed over the semiconductor layer 110 (see FIG. 17C).

The third insulating layer 128 is formed of a single layer or stacked layer using an insulating material such as silicon oxide, silicon nitride, or silicon oxynitride by a CVD method, a sputtering method, or the like. For example, in the case where the third insulating layer 128 is formed of a single layer, a silicon oxynitride layer is formed to a thickness of 5 to 50 nm by a CVD method. In addition, in the case where the third insulating layer 128 is formed of three-layered structure, a silicon oxynitride layer is formed as a first insulating layer, a silicon nitride layer is formed as a second insulating layer, and a silicon oxynitride layer is formed as a third insulating layer.

It is to be noted that the third insulating layer 128 formed over the semiconductor layer 108 serves as a control insulating layer in the nonvolatile memory element to be completed later, and each of the third insulating layers 128 formed over the semiconductor layers 104 and 106 serves as a gate insulating film in the transistor to be completed later.

Next, a conductive layer is formed so as to cover the third insulating layer 128 formed over the semiconductor layers 104, 106, 108, and 110 (see FIG. 18A). Here, an example in which a conductive layer 130 and a conductive layer 132 are sequentially stacked as the conductive layer is shown. Needless to say, the conductive layer may be formed of a single layer or a stacked layer including three or more layers.

The conductive layers 130 and 132 can be formed of an element selected from tantalum (Ta), tungsten (W), titanium (Ti), molybdenum (Mo), aluminum (Al), cupper (Cu), chromium (Cr), niobium (Nb), and the like, or an alloy material or compound material containing these elements as its main component. Alternatively, the conductive layers 130 and 132 can be formed of a metal nitride layer obtained by nitridation of these elements. Alternatively, the conductive layers 130 and 132 can be formed of a semiconductor material typified by polycrystalline silicon doped with an impurity element such as phosphorus.

Here, the conductive layer is formed of a stacked-layer structure in which the conductive layer 130 is formed using tantalum nitride and the conductive layer 132 is formed using tungsten thereover. Alternatively, as the conductive layer 130, a single-layer or stacked-layer using tungsten nitride, molybdenum nitride, or titanium nitride can be used, and as the conductive layer 132, a single-layer or stacked-layer using tantalum, molybdenum, or titanium can be used.

Next, the stacked conductive layers 130 and 132 are selectively etched to be removed, so that the conductive layers 130 and 132 are left over part of each of the semiconductor layers 104, 106, 108, and 110, whereby conductive layers 134, 136, 138, and 140 each of which serves as a gate electrode are formed (see FIG. 18B). It is to be noted that the conductive layer 138 formed over the semiconductor layer 108 provided in the memory portion serves as a control gate in the nonvolatile memory element to be completed later. In addition, each of the conductive layers 134, 136, and 140 serves as a gate electrode in the transistor to be completed later.

Then, a resist 142 is selectively formed so as to cover the semiconductor layer 104, and an impurity region is formed by introduction of an impurity element into the semiconductor layers 106, 108, and 110 with the use of the resist 142 and the conductive layers 136, 138, and 140 as masks (see FIG. 18C). As the impurity element, an impurity element imparting n-type conductivity or an impurity element imparting p-type conductivity is used. As the impurity element imparting n-type conductivity, phosphorus (P), arsenic (As), or the like can be used. As the impurity element imparting p-type conductivity, boron (B), aluminum (Al), gallium (Ga), or the like can be used. Here, phosphorus (P) is used as the impurity element. After that, the resist 142 is removed.

In FIG. 18C, by introduction of the impurity element, an impurity region 146 for forming a source region or drain region and a channel formation region 144 are formed in the semiconductor layer 106. In the semiconductor layer 108, an impurity region 150 for forming a source region or drain region and a channel formation region 148 are formed. In the semiconductor layer 110, an impurity region 154 for forming a source region or drain region and a channel formation region 152 are formed.

Figure 19A:
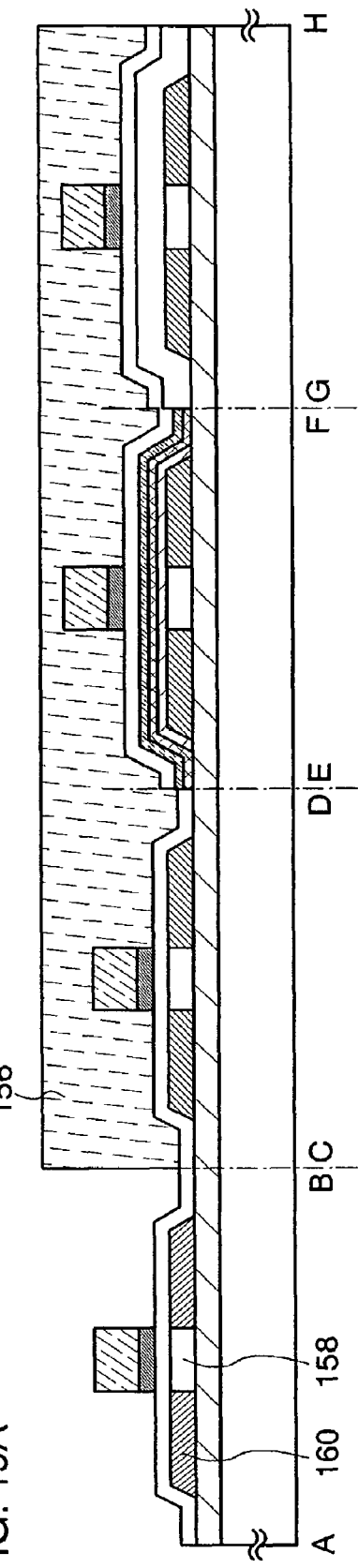
FIGS. 19A and 19B are each a view for showing an example of a manufacturing method of a nonvolatile semiconductor memory device of the present invention.

Next, a resist 156 is selectively formed so as to cover the semiconductor layers 106, 108, and 110, and an impurity region is formed by introduction of an impurity element into the semiconductor layer 104 with the use of the resist 156 and the conductive layer 134 as masks (see FIG. 19A and FIG. 23). As the impurity element, an impurity element imparting n-type conductivity or an impurity element imparting p-type conductivity is used. As the impurity element imparting n-type conductivity, phosphorus (P), arsenic (As), or the like can be used. As the impurity element imparting p-type conductivity, boron (B), aluminum (Al), gallium (Ga), or the like can be used. Here, an impurity element (for example, boron (B)) having a different conductivity from that of the impurity element introduced into the semiconductor layers 106, 108, and 110 in FIG. 18C is introduced. As a result, an impurity region 160 for forming a source region or drain region and a channel formation region 158 are formed in the semiconductor layer 104. After that, the resist 156 is removed.

Figure 19B:
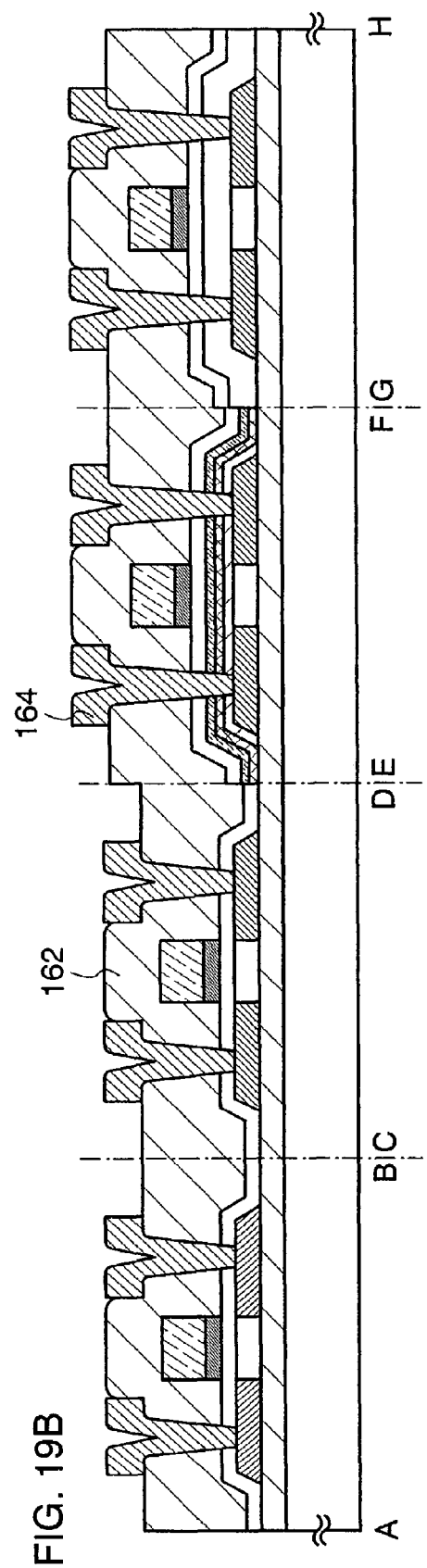
Figure 24:
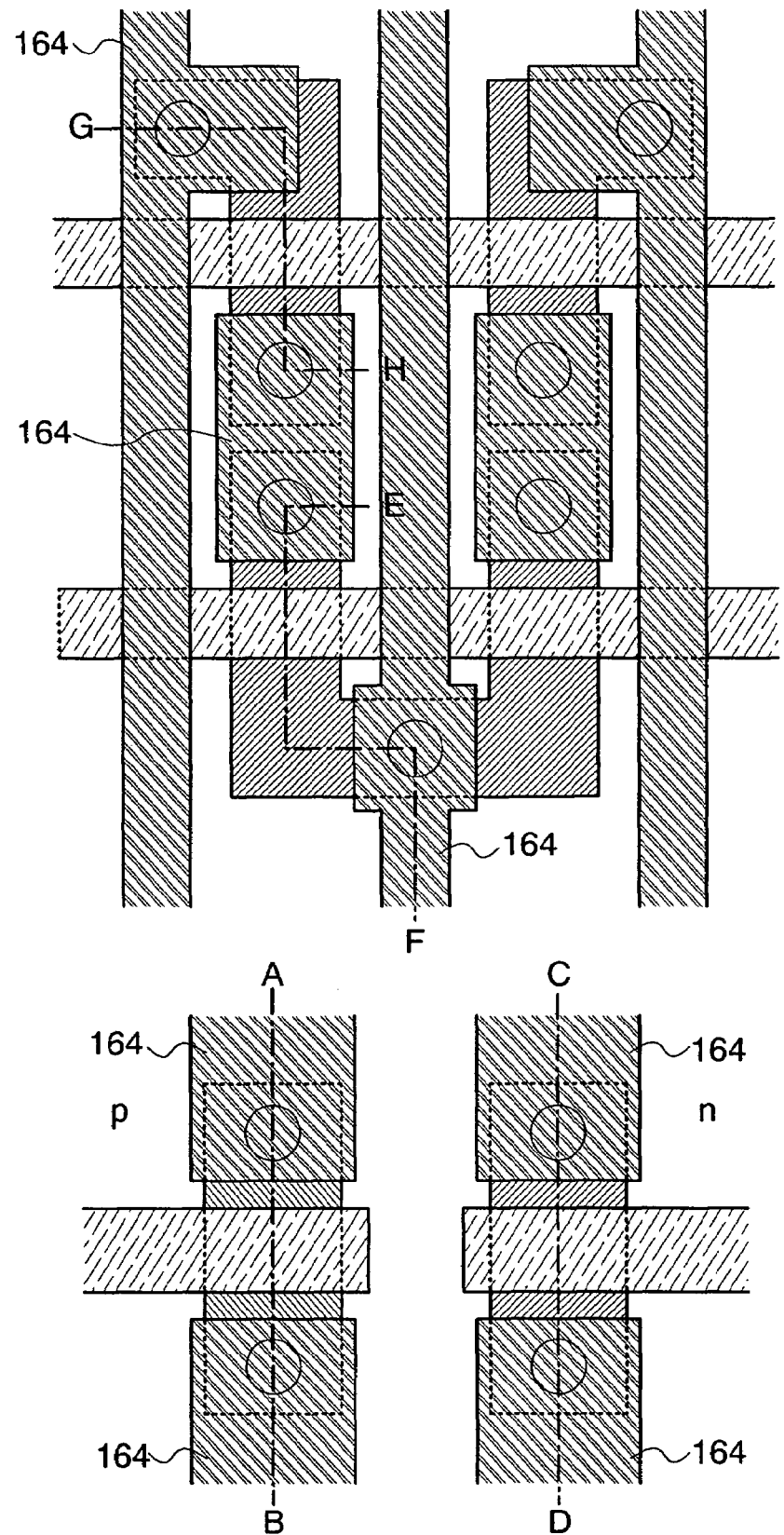
FIG. 24 is a view for showing an example of a top surface of a nonvolatile semiconductor memory device of the present invention.

Subsequently, an insulating layer 162 is formed so as to cover the third insulating layer 128 and the conductive layers 134, 136, 138, and 140, and a conductive layer 164 which is electrically connected to the impurity regions 160, 146, 150, and 154 formed in the semiconductor layers 104, 106, 108, and 110, respectively, is formed over the insulating layer 162 (see FIG. 19B and FIG. 24).

The insulating layer 162 can be formed of a single layer or stacked layer including an insulating layer containing oxygen or nitrogen, such as silicon oxide, silicon nitride, or silicon oxynitride, a layer containing carbon, such as DLC (Diamond Like Carbon), an organic material such as epoxy, polyimide, polyamide, polyvinyl phenol, benzocyclobutene, or acrylic, or a siloxane material such as a siloxane resin by a CVD method, a sputtering method, or the like. Further, the siloxane material corresponds to a material including a Si—O—Si bond. Siloxane has a skeleton structure formed by a bond of silicon (Si) and oxygen (O). As a substituent, an organic group containing at least hydrogen (for example, an alkyl group or an aryl group) is used. As the substituent, a fluoro group can be used. Alternatively, as the substituent, an organic group containing at least hydrogen and a fluoro group may be used.

The conductive layer 164 is formed of a single layer or stacked layer of an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), or silicon (Si), or an alloy material or compound material containing these elements as its main component by a CVD method, a sputtering method, or the like. For example, an alloy material containing aluminum as its main component corresponds to a material containing aluminum as its main component and nickel, or an alloy material containing aluminum as its main component, nickel, and one or both of carbon and silicon. For example, the conductive layer 164 is formed of a stacked layer including a barrier layer, an aluminum silicon (Al—Si) layer, and a barrier layer or a stacked layer including a barrier layer, an aluminum silicon (Al—Si) layer, a titanium nitride (TiN) layer, and a barrier layer. Further, the barrier layer corresponds to a thin film formed of titanium, a nitride of titanium, molybdenum, or a nitride of molybdenum. Since aluminum or aluminum silicon has a low resistance value and is inexpensive, aluminum or aluminum silicon is most suitable for the material for forming the conductive layer 164. When the barrier layers are provided for an upper layer and a bottom layer, generation of hillock of aluminum or aluminum silicon can be prevented. In addition, when the barrier layer formed of titanium that has a high reducing property, even when a thin natural oxide film is formed over a crystalline semiconductor layer, the barrier layer reduces this natural oxide film, and accordingly, favorable contact with the crystalline semiconductor layer can be obtained.

It is to be noted that, in this embodiment, the example is shown, in which the insulating layer which serves as the control insulating film of the nonvolatile memory element formed in the memory portion and the gate insulating film of the thin film transistor formed in the logic portion are formed at the same time (see FIG. 17C); however, the present invention is not limited thereto. For example, the formation as shown in FIGS. 20A to 20C may also be employed. The formation is specifically explained below.

First, after formation similar to that shown in FIG. 17A, the third insulating layer 128 is formed over the charge storage layers 122a and 122b (see FIG. 20A). Next, the resist 124 is selectively formed so as to cover the semiconductor layer 108, and thereafter, the charge storage layers 122a and 122b and the third insulating layer 128 formed over the semiconductor layers 104, 106, and 110 are selectively removed (see FIG. 20B). After that, an insulating layer 168 serving as a gate insulating film is formed over a surface of the exposed semiconductor layers 104, and an insulating layer 170 serving as a gate insulating film is formed over a surface of the exposed semiconductor layer 106 (see FIG. 20C). The insulating layers 168 and 170 may be provided by high density plasma treatment as explained for the formation of the second insulating layers 116, 118, and 120. Alternatively, the insulating layers 168 and 170 can be formed by a CVD method or a sputtering method.

With the formation as shown in FIGS. 20A to 20C, the gate insulating film of the thin film transistor formed in the logic portion and the control insulating film of the nonvolatile memory element formed in the memory portion can be formed to different thicknesses and formed of different materials from each other.

In the steps shown in this embodiment, insulating layers 172 (also referred to as sidewalls) may be formed so as to be in contact with side surfaces of each of the conductive layers 134, 136, 138, each of which serves as a gate electrode and the conductive layer 140 which serves as a control electrode (see FIGS. 21A and 21B). By introduction of an impurity element into the semiconductor layers 104, 106, 108, and 110 with the use of the insulating layers 172 as masks, low concentration impurity regions 180, 174, 176, and 118 each of which serves as an LDD are formed in the semiconductor layers 104, 106, 108, and 110, respectively.

It is to be noted that the insulating layers 172 may be formed to be directly in contact with the semiconductor layer 104 (see FIG. 21A), or a structure may be employed, in which another insulating layer or charge storage layer is formed under the insulating layers 172 (see FIG. 21B).

In this embodiment, the structure in which the charge storage layers 126a and 126b are formed over an entire surface of the semiconductor layer 108 provided in the memory portion is shown; however, the present invention is not limited thereto. For example, a structure may be employed, in which the charge storage layers 126a and 126b are selectively provided in a portion where the semiconductor layer 108 and the conductive layer 138 intersect with each other (see FIG. 46). Further, in the nonvolatile memory element, in the case where a channel length is denoted by L and a channel width is denoted by W, the charge storage layer 126 may be provided so as to be larger than the channel length L and the channel width W (see FIG. 46), the charge storage layer 126 may be provided so as to be larger than one of the channel length L and the channel width W, or the charge storage layer 126 may be provided so as to be smaller than the channel length L and the channel width W (a state in which the charge storage layer 126 is constantly provided over the semiconductor layer 108).

This embodiment can be implemented in combination with other embodiment modes and embodiments described in this specification.

Embodiment 2

In this embodiment, a manufacturing method of a nonvolatile semiconductor memory device that differs from the one explained in the above embodiment will be explained with reference to drawings. It is to be noted that the same portions as those in the above embodiment are denoted by the same reference numerals and the explanation thereof is omitted. It is to be noted that, in FIGS. 25A to 25C, FIGS. 26A to 26C, and FIGS. 27A to 27C, portions taken along lines A-B and C-D show thin film transistors provided in logic portions, a portion taken along a line E-F shows a nonvolatile memory element provided in a memory portion, and a portion taken along a line G-H shows a thin film transistor provided in the memory portion.

Figure 25A:
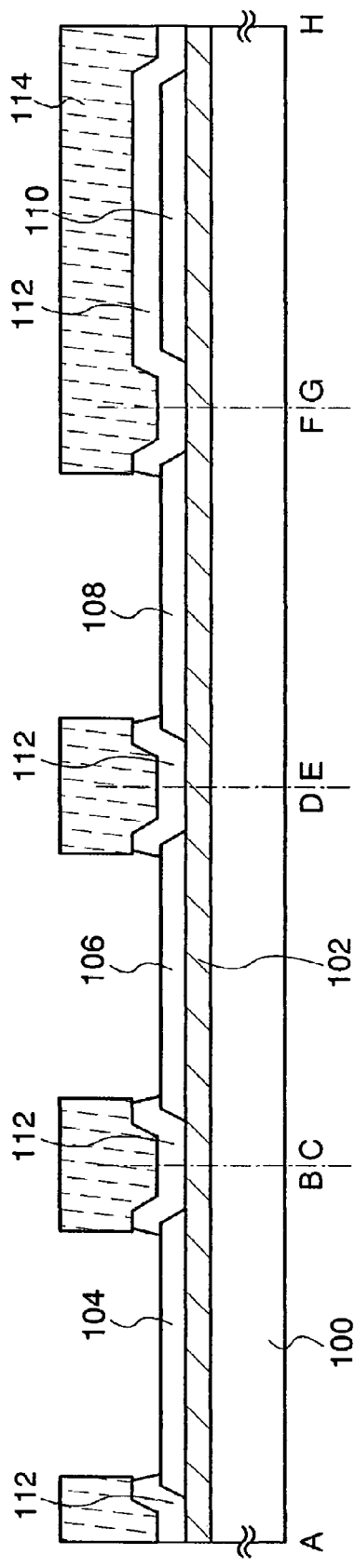
FIGS. 25A to 25C are each a view for showing an example of a manufacturing method of a nonvolatile semiconductor memory device of the present invention.

First, as shown in the above-described embodiment, after formation similar to that shown in FIG. 16A, the resist 114 is selectively formed so as to cover edges of each of the semiconductor layers 104, 106, and 108, and the semiconductor layer 110, so that the first insulating layer 112 which is not covered with the resist 114 is selectively removed (see FIG. 25A). That is, a structure is obtained here, in which the semiconductor layer 110 and the edges of each of the semiconductor layers 104, 106, and 108 are covered with the first insulating layer 112.

This structure is provided in order to prevent a depression from being formed in a portion where the edges of each of the semiconductor layers 104, 106, and 108 are in contact with the insulating layer 102, in the case where the entire first insulating layer 112 formed over each of the semiconductor layers 104, 106, and 108 is removed by etching. In the case where a depression is formed in the insulating layer 102, a problem such as leak current caused by a coverage defect occurs in the case of forming the insulating layer or the like for covering the semiconductor layers 104, 106, and 108 thereafter; therefore, it is effective to cover the edges of each of the semiconductor layers 104, 106, and 108 with the first insulating layer 112. After that, the resist 114 is removed.

Here, the first insulating layer 112 is formed in such a manner that an insulating layer is etched by a wet etching method.

Figure 25B:
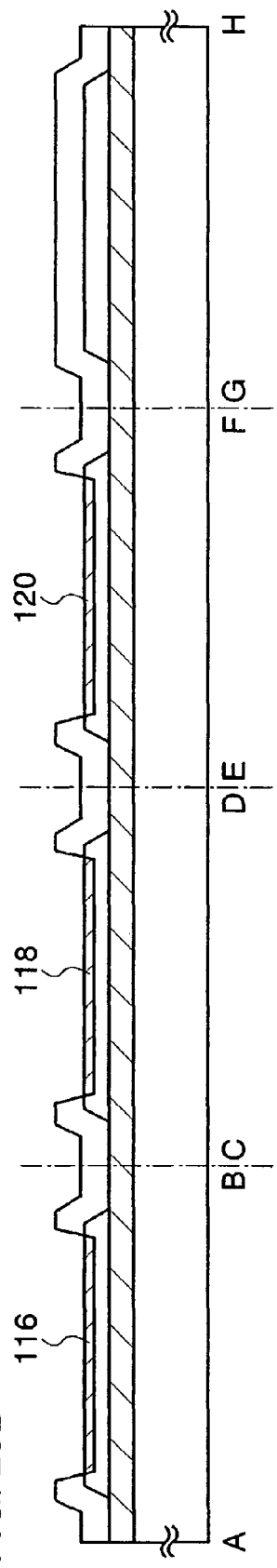
Figure 25C:
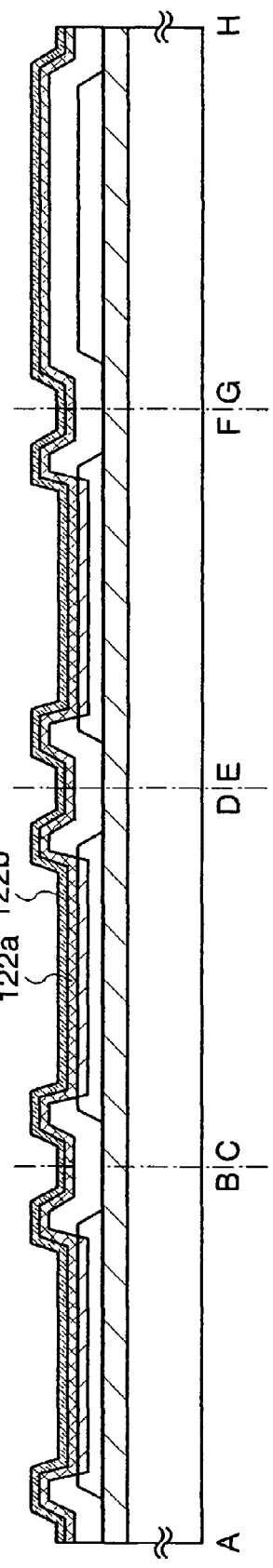

Next, the second insulating layers 116, 118, and 120 are formed over the semiconductor layers 104, 106, and 108, respectively (see FIG. 25B). The second insulating layers 116, 118, and 120 can be formed by any of the methods explained in the above-described embodiment. Here, by consecutive oxidation treatment and nitridation treatment by high density plasma treatment, a silicon oxide layer is formed as the second insulating layers 116, 118, and 120, and thereafter, a nitrogen plasma-treated layer with high nitrogen concentration is formed over a surface of the silicon oxide layer or near the surface thereof.

Subsequently, the charge storage layers 122a and 122b are formed so as to cover the first insulating layer 112 formed over the semiconductor layer 110 and the second insulating layers 116, 118, and 120 (see FIG. 5C). The charge storage layers 122a and 122b can be formed by any of the materials explained in the above-described embodiment. Here, a germanium nitride layer formed by a plasma CVD method is used for the charge storage layer 122a and a silicon nitride layer formed by a plasma CVD method is used for the charge storage layer 122b.

Next, the second insulating layers 116 and 118 formed over the semiconductor layers 104 and 106, respectively, and the charge storage layers 122a and 122b are selectively removed, so that the second insulating layer 120 and the charge storage layers 122a and 122b formed over the semiconductor layer 108, and the charge storage layers 122a and 122b formed over the semiconductor layer 110 are left. Here, the semiconductor layer 108 and the semiconductor layer 110 provided in the memory portion are selectively covered with the resist 124, and the second insulating layers 116 and 118, and the charge storage layers 122a and 122b which are not covered with the resist 124 are selectively removed by etching (see FIG. 26A). Further, in FIG. 26A, an example is shown, in which part of the charge storage layers 122a and 122b are left by a method in which the charge storage layers 122a and 122b are selectively removed by etching to form the charge storage layers 126a and 126b. It is to be noted that, as shown in the above-described embodiment, the charge storage layers 126a and 126b formed over the semiconductor layer 110 may be removed.

Subsequently, the third insulating layer 128 is formed so as to cover the semiconductor layers 104 and 106, and the charge storage layers 126a and 126b formed over each of the semiconductor layers 108 and 110 (see FIG. 26B).

The third insulating layer 128 is formed using any of the materials explained in the above-described embodiment. For example, the third insulating layer 128 is formed of a silicon oxynitride layer to a thickness of 5 to 50 nm by a CVD method.

It is to be noted that the third insulating layer 128 formed over the semiconductor layer 108 serves as a control insulating layer in the nonvolatile memory element to be completed later, and each of the third insulating layers 128 formed over the semiconductor layers 104 and 106 serves as a gate insulating film in the transistor to be completed later.

Next, the conductive layers 134, 136, 138, and 140 each of which serves as a gate electrode are formed over the semiconductor layers 104, 106, 108, and 110, respectively (see FIG. 26C). It is to be noted that the conductive layer 138 formed over the semiconductor layer 108 provided in the memory portion serves as a control gate in the nonvolatile memory element to be completed later. In addition, each of the conductive layers 134, 136, and 140 serves as a gate electrode in the transistor to be completed later.

Subsequently, the resist 142 is selectively formed so as to cover the semiconductor layer 104, and impurity regions are formed by introduction of an impurity element into the semiconductor layers 106, 108, and 110 with the use of the resist 142 and the conductive layers 136, 138, and 140 as masks (see FIG. 27A). As the impurity element, an impurity element imparting n-type conductivity or an impurity element imparting p-type conductivity is used. As the impurity element imparting n-type conductivity, phosphorus (P), arsenic (As), or the like can be used. As the impurity element imparting p-type conductivity, boron (B), aluminum (Al), gallium (Ga), or the like can be used. Here, as the impurity element, phosphorus (P) is used.

In FIG. 27A, by the introduction of an impurity element, the impurity region 146 for forming a source region or drain region and the channel formation region 144 are formed in the semiconductor layer 106. In the semiconductor layer 108, the impurity region 150 for forming a source region or drain region and the channel formation region 148 are formed. In the semiconductor layer 110, the impurity region 154 for forming a source region or drain region and the channel formation region 152 are formed.

Next, the resist 156 is selectively formed so as to cover the semiconductor layers 106, 108, and 110, and the impurity region is formed by introduction of an impurity element into the semiconductor layer 104 with the use of the resist 156 and the conductive layer 134 as masks (see FIG. 27B.) As the impurity element, an impurity element imparting n-type conductivity or an impurity element imparting p-type conductivity is used. As the impurity element imparting n-type conductivity, phosphorus (P), arsenic (As), or the like can be used. As the impurity element imparting p-type conductivity, boron (B), aluminum (Al), gallium (Ga), or the like can be used. Here, an impurity element (for example, boron (B)) having a different conductivity from that of the impurity element introduced into the semiconductor layers 106, 108, and 110 in FIG. 27A is introduced. As a result, the impurity region 160 for forming a source region or drain region and the channel formation region 158 are formed in the semiconductor layer 104. After that, the resist 156 is removed.

Next, the insulating layer 162 is formed so as to cover the third insulating layer 128 and the conductive layers 134, 136, 138, and 140, and the conductive layer 164 which is electrically connected to the impurity regions 160, 146, 150, and 154 formed in the semiconductor layers 104, 106, 108, and 110, respectively, is formed over the insulating layer 162 (see FIG. 27C).

The insulating layer 162 and the conductive layer 164 can be formed using any of the materials explained in the above-described embodiments.

It is to be noted that this embodiment can be implemented in combination with other embodiment modes and embodiments described in this specification.

Embodiment 3

In this embodiment, a manufacturing method of a nonvolatile semiconductor memory device that differs from those explained in the above embodiments will be explained with reference to drawings. It is to be noted that the same portions as those in the above embodiment are denoted by the same reference numerals and the explanation thereof is omitted. It is to be noted that, in FIGS. 28A to 28C, FIGS. 29A to 29C, and FIGS. 30A to 30C, portions taken along lines A-B and C-D show thin film transistors provided in logic portions, a portion taken along a line E-F shows a nonvolatile memory element provided in a memory portion, and a portion taken along a line G-H shows a thin film transistor provided in a memory portion.

Figure 28A:
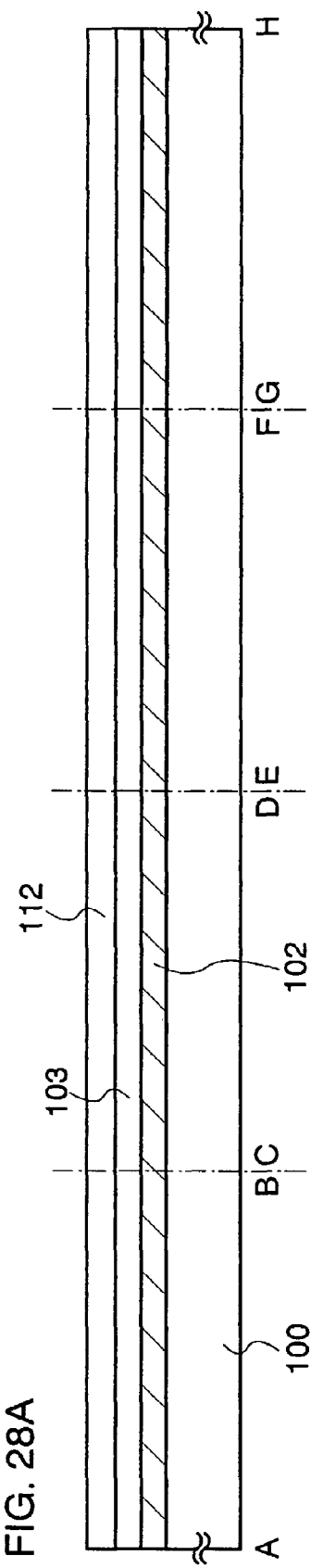
FIGS. 28A to 28C are each a view for showing an example of a manufacturing method of a nonvolatile semiconductor memory device of the present invention.

First, a semiconductor layer 103 is formed over the substrate 100 with the insulating layer 102 interposed therebetween, and the first insulating layer 112 is formed over the semiconductor layer 103 (see FIG. 28A).

The semiconductor layer 103 can be provided by a method in which an amorphous semiconductor layer is formed using a material containing silicon (Si) as its main component, or the like over the insulating layer 102 which has been formed over the substrate 100 in advance, by a sputtering method, an LPCVD method, a plasma CVD method, or the like, and the amorphous semiconductor layer is crystallized. Further, crystallization of the amorphous semiconductor layer can be performed by a laser crystallization method, a thermal crystallization method using RTA or an annealing furnace, a thermal crystallization method using a metal element that promotes crystallization, a method in which these methods are combined, or the like.

An SOI (Silicon-On-Insulator) substrate can be used instead of the above methods. As the SOI substrate, a so-called SIMOX (Separation by IMplanted OXygen) substrate may be used, which is formed in such a manner that after oxygen ions are injected into a mirror-polished wafer, an oxide layer is formed to a certain depth from a surface by high-temperature annealing as well as eliminating defects generated in a surface layer. A semiconductor layer of SOI can be used as the semiconductor layer 103.

Figure 28B:
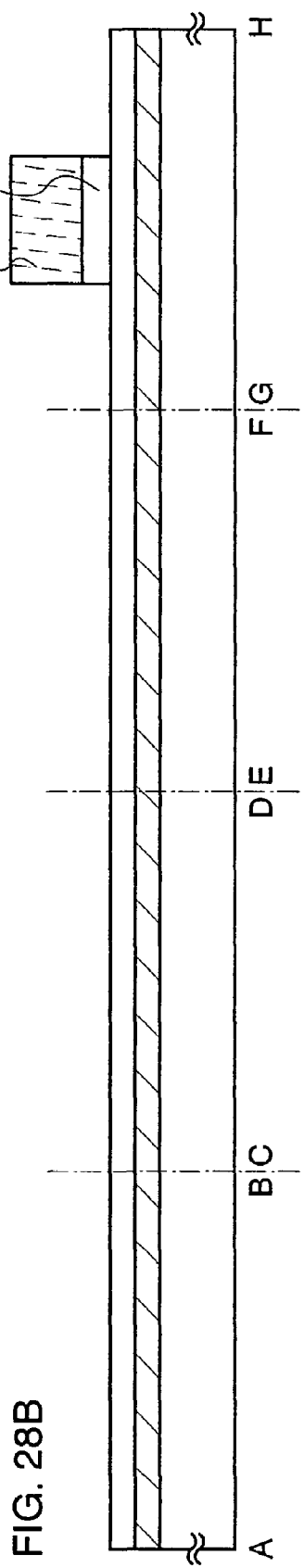

Next, the resist 114 is selectively provided over the first insulating layer 112, and the first insulating layer 112 is left by etching with the use of the resist 114 as a mask, so that a second insulating layer 113 is formed (see FIG. 28B).

Figure 28C:
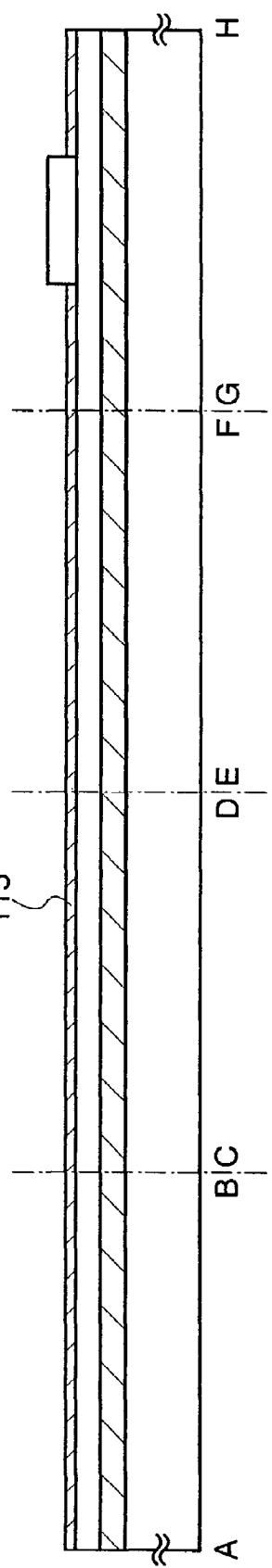

Then, a third insulating layer 115 is formed over the exposed semiconductor layer 103 (see FIG. 28C).

The third insulating layer 115 can be formed in such a manner that heat treatment, plasma treatment, or the like is performed to the exposed semiconductor layer 103. For example, oxidation treatment, nitridation treatment, or oxynitridation treatment is performed to the semiconductor layer 103 by high density plasma treatment, whereby a silicon oxide layer having a nitrogen plasma-treated layer over its surface or near the surface thereof is formed over the semiconductor layer 103 as the third insulating layer 115. It is to be noted that the third insulating layer 115 may be formed by a CVD method or a sputtering method. Alternatively, the third insulating layer 115 may be formed in such a manner that high density plasma treatment is performed to a layer formed by a CVD method or a sputtering method.

For example, in the case where oxidation treatment or nitridation treatment is performed to a semiconductor layer containing Si as its main component which is used as the semiconductor layer 103 by high density plasma treatment, a silicon oxide layer or a silicon nitride layer is formed as the third insulating layer 115. Alternatively, after oxidation treatment is performed to the semiconductor layer 103 by high density plasma treatment, nitridation treatment may be performed by another high density plasma treatment. In this case, a silicon oxide layer is formed to be in contact with the semiconductor layer 103, and a nitrogen plasma-treated layer is formed at an interface between the silicon oxide layer and the charge storage layer, or in the silicon oxide layer.

Here, the third insulating layer 115 is formed to a thickness of greater than or equal to 1 nm and less than or equal to 10 nm, preferably, greater than or equal to 1 nm and less than or equal to 5 nm. For example, oxidation treatment is performed to the semiconductor layer 103 by high density plasma treatment to form a silicon oxide layer over a surface of the semiconductor layer 103, and thereafter, nitrogen treatment is performed by high density plasma treatment to form a nitrogen plasma-treated layer at an interface between the silicon oxide layer and the charge storage layer, or in the silicon oxide layer. In addition, at this time, it is preferable that oxidation treatment and nitridation treatment by high density plasma treatment be continuously performed without any exposure to the air. By the continuous high density plasma treatment, contamination can be prevented from being mixed and improvement in production efficiency can be realized. In addition, at this time, a surface of the second insulating layer 113 is also oxidized or nitrided and a silicon oxynitride layer is formed in some cases.

Next, the charge storage layers 122a and 122b are formed over the third insulating layer 115 and the second insulating layer 113 (see FIG. 29A). The charge storage layers 122a and 122b can be formed of any materials explained in the above-described embodiments. Here, a germanium nitride layer formed by a plasma CVD method is used for the charge storage layer 122a and a silicon nitride layer formed by a plasma CVD method is used for the charge storage layer 122b.

Subsequently, a resist 123 is selectively formed over the charge storage layers 122a and 122b, and the third insulating layer 115 and the charge storage layers 122a and 122b are selectively removed with the use of the resist 123 as a mask, so that a stacked-layer structure including the third insulating layer 115 and the charge storage layers 122a and 122b are left, whereby the fourth insulating layer 120 and the charge storage layers 125a and 125b are formed. In addition, the charge storage layers 122a and 122b formed over the second insulating layer 113 are left, so that charge storage layers 127a and 127b are formed. It is to be noted that the charge storage layers 127a and 127b can be removed (see FIG. 29B). The second insulating layer formed in the memory portion serves as a tunnel insulating film in the nonvolatile memory element to be completed later.

Next, the semiconductor layer 103 is selectively etched, so that the island-shaped semiconductor layers 104, 106, 108, and 110 are formed (see FIG. 29C).

Next, the fifth insulating layer 128 is formed so as to cover the semiconductor layers 104 and 106, the charge storage layers 126a and 126b formed over the semiconductor layer 108, and the charge storage layers 127a and 127b formed over the semiconductor layer 110 (see FIG. 30A).

Subsequently, the conductive layers 134, 136, 138, and 140 each of which serves as a gate electrode are formed over the semiconductor layers 104, 106, 108, and 110, respectively (see FIG. 30B). It is to be noted that the conductive layer 138 formed over the semiconductor layer 108 provided in the memory portion serves as a control gate in the nonvolatile memory element to be completed later. In addition, each of the conductive layers 134, 136, and 140 serves as a gate electrode in the transistor to be completed later.

Next, as shown in the above-described embodiments, a channel formation region and an impurity region are formed in each of the semiconductor layers 104, 106, 108, and 110, and thereafter, the sixth insulating layer 162 is formed so as to cover the fifth insulating layer 128 and the conductive layers 134, 136, 138, and 140, and then, the conductive layer 164 which is electrically connected to the impurity regions 160, 146, 150, and 154 formed in the semiconductor layers 104, 106, 108, and 110, respectively, is formed over the insulating layer 162 (see FIG. 30C).

It is to be noted that this embodiment can be implemented in combination with other embodiment modes and embodiments described in this specification.

Embodiment 4

Figure 40A:
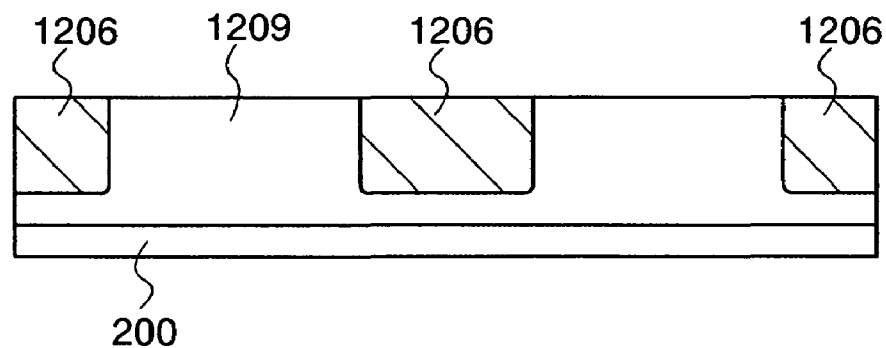
FIGS. 40A to 40C are each a view for showing an example of a manufacturing method of a nonvolatile semiconductor memory device of the present invention.
Figure 40B:
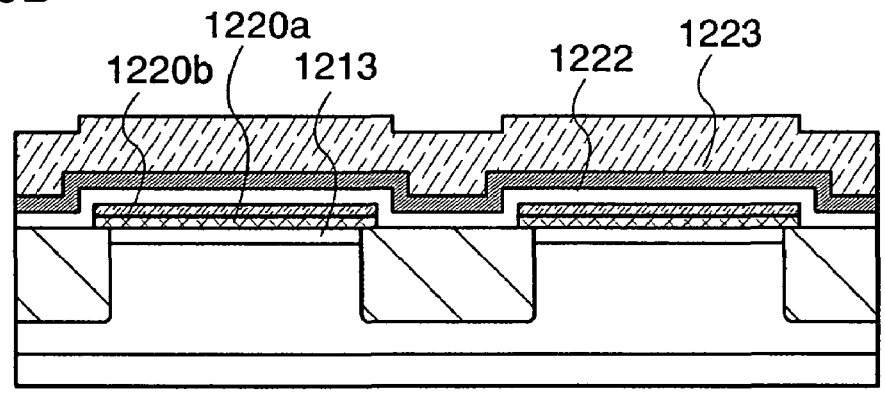
Figure 40C:
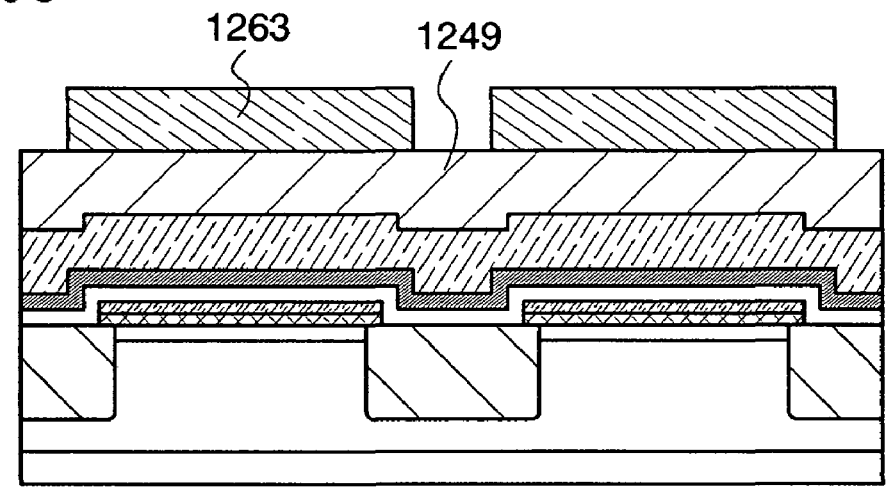

In this embodiment, a manufacturing method of a nonvolatile semiconductor memory device using a semiconductor substrate that differs from those in the above-described embodiments will be explained with reference to drawings. It is to be noted that FIGS. 37A and 37B, FIGS. 38A and 38B, and FIGS. 39A and 39B show top views; FIGS. 31A to 31C, FIGS. 32A to 32C, FIGS. 33A to 33C, FIGS. 34A to 34C, and FIGS. 35A to 35C show cross-sectional views taken along lines A-B and E-F of FIGS. 37A and 37B, FIGS. 38A and 38B, and FIGS. 39A and 39B; and FIGS. 40A to 40C show cross-sectional views taken along the line C-D of FIGS. 37A and 37B, FIGS. 38A and 38B, and FIGS. 39A and 39B. In addition, a portion taken along the line A-B shows a transistor and a nonvolatile memory element provided in a memory portion, a portion taken along the line C-D shows a nonvolatile memory element provided in a memory portion, and a portion taken along the line E-F shows a transistor provided in a logic portion. Moreover, in this embodiment, the case where a transistor provided in a region 1207 of a substrate 1200 shown in the portion taken along the line E-F is of p-channel type, a transistor provided in a region 1208 is of n-channel type, and a transistor provided in a region 1209 of the substrate 1200 shown in the portion taken along the line A-B is of n-channel type, and the case where movement of carriers of the nonvolatile memory element is performed by electrons are explained; however, the nonvolatile semiconductor memory device of the present invention is not limited thereto.

First, an insulating layer is formed over the substrate 1200. Here, single-crystal Si having n-type conductivity is used for the substrate 1200, and an insulating layer 1201 and an insulating layer 1202 are formed over the substrate 1200 (see FIG. 31A). For example, silicon oxide is formed for the insulating layer 1201 by heat treatment performed to the substrate 1200, and silicon nitride is formed over the insulating layer 1201 as the insulating layer 1202 by a CVD method.

In addition, the substrate 1200 is not particularly limited as long as it is a semiconductor substrate. For example, a single-crystal Si substrate having n-type or p-type conductivity, a compound semiconductor substrate (a GaAs substrate, an InP substrate, a GaN substrate, a SiC substrate, a sapphire substrate, a ZnSe substrate, or the like), an SOI (Silicon On Insulator) substrate formed by a bonding method or a SIMOX (Separation by IMplanted OXygen) method, or the like.

In addition, the insulating layer 1202 may be provided in such a manner that after the insulating layer 1201 is formed, the insulating layer 1201 is nitrided by high density plasma treatment. It is to be noted that the insulating layer provided over the substrate 1200 may be a single layer or a stacked layer including three layers or more.

Next, a pattern of a resist mask 1203 is selectively formed over the insulating layer 1202, and etching is selectively carried out using the resist mask 1203 as a mask, whereby depressions 1204 are selectively formed in the substrate 1200 (see FIG. 31B). The substrate 1200 and the insulating layers 1201 and 1202 can be etched by dry etching utilizing plasma.

Subsequently, after the pattern of the resist mask 1203 is removed, an insulating layer 1205 is formed so as to fill the depressions 1204 formed in the substrate 1200 (see FIG. 31C).

The insulating layer 1205 is formed using an insulating material such as silicon oxide, silicon nitride, silicon nitride containing oxygen, or silicon oxide containing nitrogen by a CVD method, a sputtering method, or the like. Here, for the insulating layer 1205, silicon oxide is formed using TEOS (tetraethyl orthosilicate) by a normal-pressure CV1) method or a low-pressure CVD method.

Next, a surface of the substrate 1200 is exposed by grinding treatment, polishing treatment, or CMP (Chemical Mechanical Polishing) treatment. Here, when the surface of the substrate 1200 is exposed, each of the regions 1207, 1208, and 1209 is provided between insulating layers 1206 formed in the depressions 1204 formed in the substrate 1200. It is to be noted that the insulating layer 1206 is obtained in such a manner that the insulating layer 1205 formed over the surface of the substrate 1200 is removed by grinding treatment, polishing treatment, or CMP treatment. Then, a p-well 1210 is formed in each of the regions 1208 and 1209 of the substrate 1200 by selective introduction of an impurity element having p-type conductivity (see FIG. 32A, FIGS. 37A and 37B, and FIG. 40A).

As the impurity element imparting p-type conductivity, boron (B), aluminum (Al), gallium (Ga), or the like can be used. Here, as the impurity element, boron (B) is introduced into the regions 1208 and 1209.

It is to be noted that, in this embodiment, an impurity element is not introduced into the region 1207 since a semiconductor substrate having n-type conductivity is used as the substrate 1200; however, an n-well may be formed in the region 1207 by introduction of an impurity element imparting n-type conductivity. As the impurity element imparting n-type conductivity, phosphorus (P), arsenic (As), or the like can be used.

On the other hand, in the case where a semiconductor substrate having p-type conductivity is used, a structure may be employed, in which an n-well is formed in the region 1207 by introduction of an impurity element imparting n-type conductivity and an impurity element is not introduced into the regions 1208 and 1209.

Next, a first insulating layer 1211 is formed over the regions 1207, 1208, and 1209 provided in the substrate 1200 (see FIG. 32B).

The first insulating layer 1211 can be formed in a similar manner to the first insulating layer 112 described in Embodiment 1. Here, for the first insulating layer 1211, silicon oxynitride is formed by a CVD method.

It is to be noted that the first insulating layer 1211 formed over the exposed region 1209 of the substrate 1200 serves as a gate insulating film in the transistor to be completed later.

Next, a resist mask 1212 is selectively formed so as to cover the first insulating layer 1211 formed over the region 1209 of the substrate 1200, the first insulating layer 1211 formed over the regions 1207 and 1208 of the substrate 1200 is selectively removed, and part of the insulating layer 1211 formed over the region 1209 is left, whereby a first insulating layer 1213 is obtained (see FIG. 32C).

After the resist mask 1212 is removed, second insulating layers 1214, 1215, and 1216 are formed over surfaces of the regions 1207 and 1208, and part of the region 1209 of the substrate 1200, respectively. Next, charge storage layers 1217a and 1217b are formed so as to cover the first insulating layer 1213 and the second insulating layers 1214, 1215, and 1216 (see FIG. 33A).

The second insulating layers 1214, 1215, and 1216 may be formed by plasma treatment as described above. For example, after the substrate 1200 is heated and the surfaces of the regions 1207, 1208, and 1209 are oxidized to form a silicon oxide layer, plasma treatment is performed to a surface of the silicon oxide layer and a nitrogen plasma-treated layer with high nitrogen concentration is formed over the surface of the silicon oxide layer or near the surface thereof. Alternatively, after oxidation treatment is performed to the surfaces of the regions 1207, 1208, and 1209 by high density plasma treatment, nitridation treatment may be performed by another high density plasma treatment. In this case, a silicon oxide layer is formed to be in contact with the surfaces of the regions 1207, 1208, and 1209, and a nitrogen plasma-treated layer with high nitrogen concentration is formed over a surface of the silicon oxide layer or near the surface thereof. That is, each of the second insulating layers 1214, 1215, and 1216 can be formed of the silicon oxide layer having the nitrogen plasma-treated layer with high nitrogen concentration over the surface of the silicon oxide layer or near the surface thereof.

Alternatively, the second insulating layers 1214, 1215, and 1216 can be formed of silicon oxide layers by oxidation of the surfaces of the regions 1207, 1208, and 1209 provided in the substrate 1200 by heat treatment.

Here, each of the second insulating layers 1214, 1215, and 1216 is formed of a stacked layer including a silicon oxide layer and a nitrogen plasma-treated layer that is formed in such a manner that oxidation treatment is performed to the surfaces of the regions 1207, 1208, and 1209 provided in the substrate 1200 by high density plasma treatment in which high-frequency power with an RF power of 3800 W is applied under the following condition: a flow ratio of Ar and $O_2$ is set to be 180:1 and pressure is set to be 106.67 Pa, and thereafter, nitridation treatment is performed by high density plasma treatment in which high-frequency power with an RF power of 1200 W is applied under the following condition: a flow ratio of $N_2$ and Ar is set to be 1:5 and pressure is set to be 12 Pa.

In this embodiment, the second insulating layer 1216 formed over the region 1209 provided in a memory portion in the substrate 1200 serves as a tunnel oxide film in the nonvolatile memory element to be completed later. Therefore, when the second insulating layer 1216 is thinner, tunnel current flows more easily, and high-speed operation as memory is possible. In addition, when the second insulating layer 1216 is thinner, charge can be stored in the charge storage layers 1217a and 1217b at lower voltage; accordingly, power consumption of the nonvolatile semiconductor memory device can be reduced. Therefore, it is preferable that the second insulating layer 1216 be formed to be thin.

The charge storage layers 1217a and 1217b are formed in a similar manner to the charge storage layers 122a and 122b described in Embodiment 1.

Next, a resist mask 1218 is formed over the charge storage layers 1217a and 1217b, and the charge storage layers 1217a and 1217b and the second insulating layers 1214, 1215, and 1216 are selectively removed using the resist mask 1218 as a mask. Here, the resist mask 1218 is formed so as to cover part of the region 1209 of the substrate 1200, and the charge storage layers 1217a and 1217b and the second insulating layers 1214, 1215, and 1216 that are not covered with the resist mask 1218 are removed, and part of the second insulating layer 1216 and the charge storage layers 1217a and 1217b provided over the region 1209 are left, whereby a second insulating layer 1220 and charge storage layers 1219a and 1219b are obtained (see FIG. 33B). Specifically, in the region 1209, the second insulating layer 1220 and the charge storage layers 1219a and 1219b that are provided in a region where a nonvolatile memory element is formed later are left. In addition, the surfaces of the regions 1207 and 1208, and part of the region 1209 of the substrate 1200 are exposed.

Figure 33A:
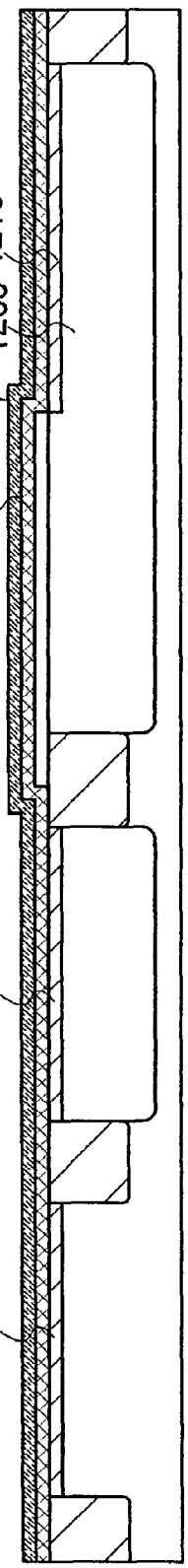
FIGS. 33A to 33C are each a view for showing an example of a manufacturing method of a nonvolatile semiconductor memory device of the present invention.
Figure 33B:
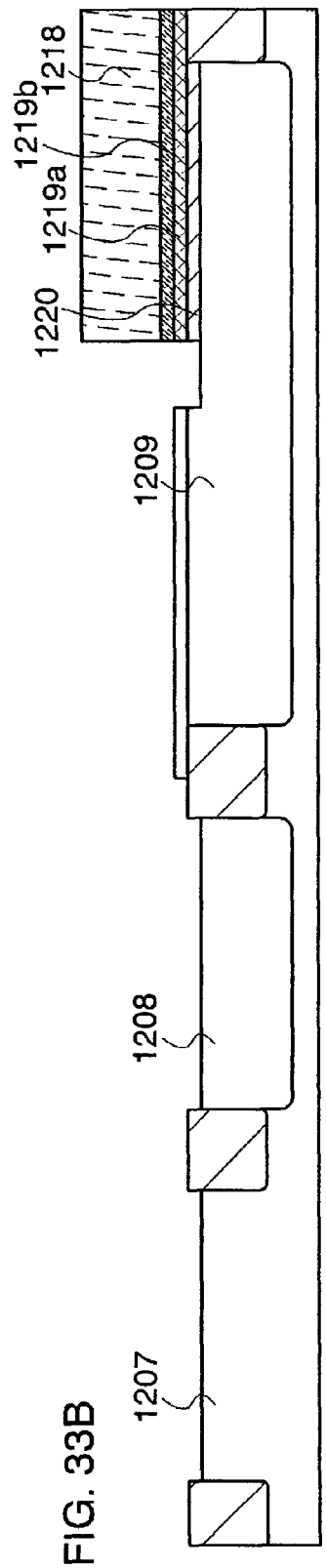
Figure 33C:
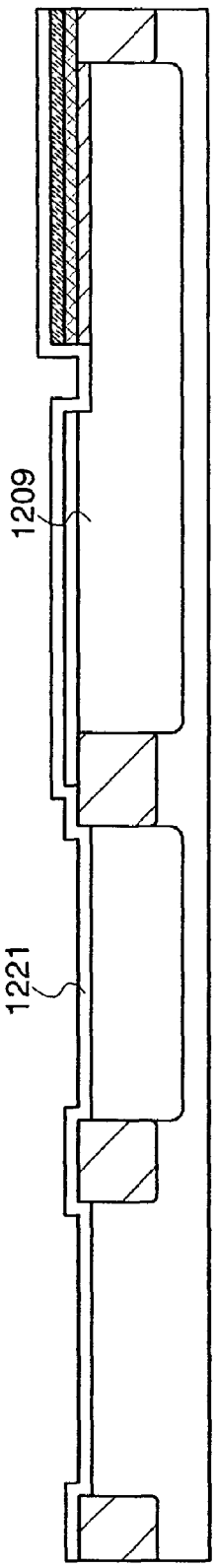

After the resist mask 1218 is removed, a third insulating layer 1221 is formed so as to cover the regions 1207, 1208, and 1209 and the charge storage layers 1219a and 1219b of the substrate 1200 (see FIG. 33C).

The third insulating layer 1221 is formed of a single layer or stacked layer using an insulating material such as silicon oxide, silicon nitride, or silicon oxynitride by a CVD method, a sputtering method, or the like, in a similar manner to the first insulating layer 1211. Here, for the third insulating layer 1221, silicon oxynitride is formed by a CVD method in which high-frequency power with an RF power of 150 W is applied under the following conditions: a flow ratio of $SiH_4:N_2O$ is set to be 1:800, a substrate temperature is set at 400° C., pressure is set to be 40 Pa, a distance between electrodes is set to be 28 mm, and a power supply frequency is 27 MHz.

It is to be noted that the third insulating layer 1221 formed over the charge storage layers 1219a and 1219b over the region 1209 of the substrate 1200 serves as a control insulating film in the nonvolatile memory element to be completed later.

Next, a conductive layer is formed over the third insulating layer 1221 (see FIG. 34A). Here, an example is shown, in which the conductive layer is formed of a stacked layer including a conductive layer 1222 and a conductive layer 1223 in this order. Needless to say, the conductive layer may be formed of a single layer or a stacked layer including three or more layers.

The conductive layers 1222 and 1223 can be formed in a similar manner to the conductive layers 130 and 132 described in Embodiment 1.

Here, a stacked-layer structure in which the conductive layer 1222 is formed using tantalum nitride and the conductive layer 1223 is formed using tungsten thereover is employed.

Next, the stacked conductive layers 1222 and 1223 are selectively etched and removed, so that the conductive layers 1222 and 1223 are left over part of each of the regions 1207, 1208, and 1209 of the substrate 1200, whereby conductive layers 1224, 1225, 1226, and 1227 each of which serves as a gate electrode are formed (see FIG. 34B and FIG. 40B). In addition, here, the surfaces of the regions 1207, 1208, and 1209 of the substrate 1200 that do not overlap with the conductive layers 1224, 1225, 1226, and 1227 are exposed. It is to be noted that the conductive layer 1227 serves as a control gate in the nonvolatile memory element to be completed later.

Specifically, over the region 1207 of the substrate 1200, of the third insulating layer 1221 formed under the conductive layer 1224, a portion which does not overlap with the conductive layer 1224 is selectively removed, and the conductive layer 1224 and the etched third insulating layer 1221 are formed so that edges of them roughly coincide with each other. In addition, over the region 1208 of the substrate 1200, of the third insulating layer 1221 formed under the conductive layer 1225, a portion which does not overlap with the conductive layer 1225 is selectively removed, and the conductive layer 1225 and the etched third insulating layer 1221 are formed so that edges of them roughly coincide with each other. Moreover, over the region 1209 of the substrate 1200, of the third insulating layer 1221 formed under the conductive layer 1226, a portion which does not overlap with the conductive layer 1226 is selectively removed, and the conductive layer 1226 and the etched third insulating layer 1221 are formed so that edges of them coincide with each other. Furthermore, over the region 1209 of the substrate 1200, of the third insulating layer 1221, the charge storage layers 1219a and 1219b, and the second insulating layer 1220 formed under the conductive layer 1227, portions which do not overlap with the conductive layer 1227 are selectively removed, and the conductive layer 1227, the etched third insulating layer (denoted by a third insulating layer 1229), charge storage layers 1228a and 1228b, and the etched second insulating layer 1220 (denoted by a second insulating layer 1230) are formed so that edges of them roughly coincide with each other.

In this case, at the same time as the formation of the conductive layers 1224, 1225, 1226, and 1227, the insulating layers and the like in the portions which do not overlap with the conductive layers 1224, 1225, 1226, and 1227 may be removed, or alternatively, after the conductive layers 1224, 1225, 1226, and 1227 are formed, the insulating layers and the like in the portions which do not overlap with the conductive layers 1224, 1225, 1226, and 1227 may be removed using the remaining resist mask or the conductive layers 1224, 1225, 1226, and 1227 as masks.

Next, an impurity element is selectively introduced into the regions 1207, 1208, and 1209 of the substrate 1200, so that low concentration impurity regions 1231, 1232, and 1233 are formed (see FIG. 34C). Here, an impurity element imparting n-type conductivity is selectively introduced at low concentration into the regions 1208 and 1209, using the conductive layers 1225, 1226, and 1227 as masks, so that the low concentration impurity regions 1232 and 1233 are formed, and an impurity element imparting p-type conductivity is selectively introduced at low concentration into the region 1207, using the conductive layer 1224 as a mask, so that the low concentration impurity region 1231 is formed. As the impurity element imparting n-type conductivity, phosphorus (P), arsenic (As), or the like can be used. As the impurity element imparting p-type conductivity, boron (B), aluminum (Al), gallium (Ga), or the like can be used.

Next, insulating layers 1234, 1235, 1236, and 1237 (also referred to as sidewalls) that are in contact with side surfaces of the conductive layers 1224, 1225, 1226, and 1227, respectively are formed. Specifically, each of the insulating layers 1234, 1235, 1236, and 1237 is formed of a single layer including a layer containing an inorganic material such as silicon, silicon oxide, or silicon nitride or a layer containing an organic material such as an organic resin, or a stacked layer including the above-described layers. Then, the insulating layers are selectively etched by anisotropic etching mainly based on a perpendicular direction, so that the insulating layers can be formed to be in contact with the side surfaces of each of the conductive layers 1224, 1225, 1226, and 1227. It is to be noted that the insulating layers 1234, 1235, 1236, and 1237 are used as masks for doping when an LDD (Lightly Doped Drain) region is formed. In addition, here, the insulating layers 1234, 1235, 1236, and 1237 are formed so as to be in contact with side surfaces of the insulating layers and the charge storage layers formed under the conductive layers 1224, 1225, 1226, and 1227 as well.

Subsequently, an impurity element is introduced into the regions 1207, 1208, and 1209 of the substrate 1200, using the insulating layers 1234, 1235, 1236, and 1237 and the conductive layers 1224, 1225, 1226, and 1227 as masks, so that impurity regions 1238, 1239, and 1240 each of which serves as a source region or drain region (see FIG. 35A and FIGS. 38A and 38B). Here, an impurity element imparting n-type conductivity is introduced at high concentration into the regions 1207, 1208, and 1209 of the substrate 1200, using the insulating layers 1235, 1236, and 1237 and the conductive layers 1225, 1226, and 1227 as masks, so that the impurity regions 1239 and 1240 are formed, and an impurity element imparting p-type conductivity is introduced at high concentration into the region 1207, using the insulating layer 1234 and the conductive layer 1224 as masks, so that the impurity region 1238 is formed.

As a result, in the region 1207 of the substrate 1200, the impurity region 1238 for forming a source region or drain region, a low concentration impurity region 1241 for forming an LDD region, and a channel formation region 1245 are formed. In the region 1208 of the substrate 1200, the impurity region 1239 for forming a source region or drain region, a low concentration impurity region 1242 for forming an LDD region, and a channel formation region 1246 are formed. In the region 1209 of the substrate 1200, the impurity region 1240 for forming a source region or drain region, low concentration impurity regions 1243 and 1244 for forming LDD regions, and channel formation regions 1247 and 1248 are formed.

It is to be noted that, in this embodiment, introduction of an impurity element is performed in such a state that the regions 1207, 1208, and 1209 of the substrate 1200 which do not overlap with the conductive layers 1224, 1225, 1226, and 1227 are exposed. Therefore, the channel formation regions 1245 and 1246 formed in the regions 1207 and 1208 of the substrate 1200, respectively, and the channel formation regions 1247 and 1248 formed in the region 1209 of the substrate 1200 can be formed in a self-alignment manner with the conductive layers 1224, 1225, 1226, and 1227.

Next, an insulating layer 1249 is formed so as to cover the insulating layers, conductive layers, and the like provided over the regions 1207, 1208, and 1209 of the substrate 1200, and openings 1250, 1251, 1252, 1253, and 1254 are formed in the insulating layer 1249 (see FIG. 35B).

The insulating layer 1249 can be formed in a similar manner to the insulating layer 162 described in Embodiment 1. Here, the insulating layer 1249 is formed using polysilazane.

Next, conductive layers 1255, 1256, 1257, 1258, and 1259 are formed in the openings 1250, 1251, 1252, 1253, and 1254, respectively by a CVD method, and conductive layers 1260, 1261, 1262, and 1263 are selectively formed over the insulating layer 1249 so as to be electrically connected to the conductive layers 1255, 1256, 1257, 1258, and 1259 (see FIG. 35C, FIGS. 39A and 39B, and FIG. 40C).

The conductive layers 1255, 1256, 1257, 1258, 1259, 1260, 1261, 1262, and 1263 can be formed in a similar manner to the conductive layer 164 described in Embodiment 1. Here, the conductive layers 1255, 1256, 1257, 1258, and 1259 can be formed in such a manner that tungsten (W) is selectively grown by a CVD method.

Through the above-described steps, a nonvolatile semiconductor memory device provided with a p-type transistor 1264 formed in the region 1207 of the substrate 1200, an n-type transistor 1265 formed in the region 1208 of the substrate 1200, and an n-type transistor 1266 and a nonvolatile memory element 1267 formed in the region 1209 of the substrate 1200 can be obtained.

Figure 36:
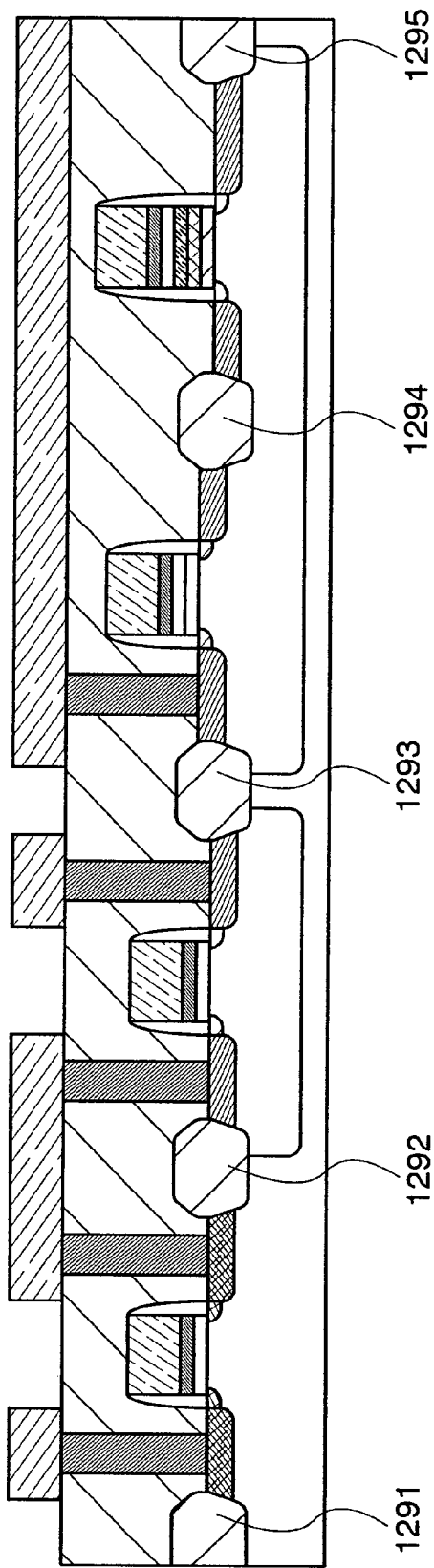
FIG. 36 is a view for showing an example of a manufacturing method of a nonvolatile semiconductor memory device of the present invention.
Figure 37A:
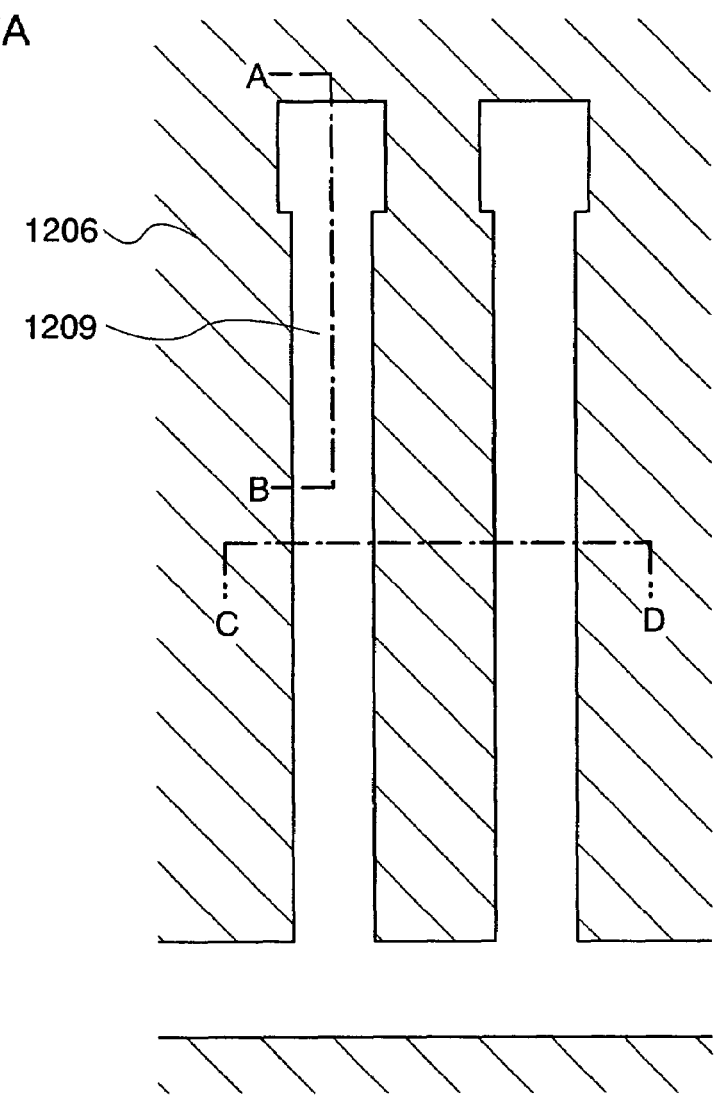
FIGS. 37A and 37B are each a view for showing an example of a top surface of a nonvolatile semiconductor memory device of the present invention.
Figure 37B:
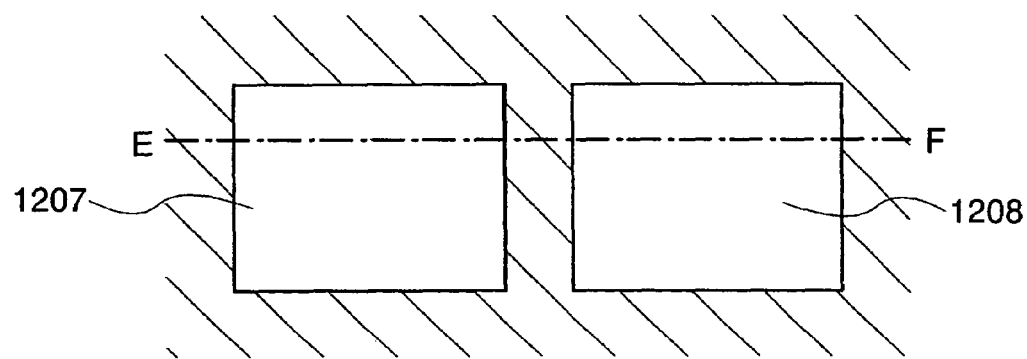

It is to be noted that instead of the insulating layer 1206 serving as an element separation region, insulating layers 1291, 1292, 1293, 1294, and 1295 formed by a LOCOS (Local Oxidation of Silicon) method can be used (see FIG. 36).

Further, it is to be noted that this embodiment can be implemented in combination with other embodiment modes and embodiments.

Embodiment 5

In this embodiment, a manufacturing method of a nonvolatile semiconductor memory device that differs from those described in the above-described embodiments will be explained with reference to drawings.

Figure 41A:
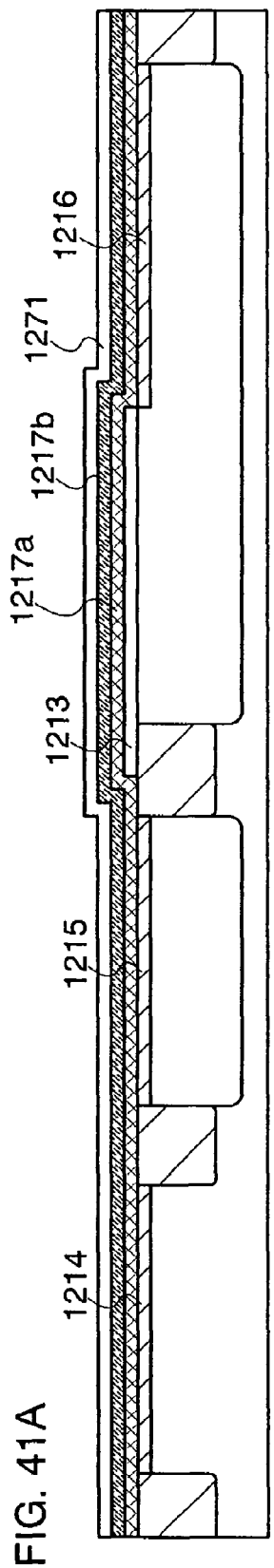
FIGS. 41A to 41C are each a view for showing an example of a manufacturing method of a nonvolatile semiconductor memory device of the present invention.

Through similar steps to those in Embodiment 4, the first insulating layer 1213, the second insulating layers 1214, 1215, and 1216, and the charge storage layers 1217*a* and 1217*b* are formed over the substrate 1200. Next, a third insulating layer 1271 is formed over the charge storage layers 1217*a* and 1217*b* (see FIG. 41A).

The third insulating layer 1271 can be formed in a similar manner to the third insulating layer 1221 described in Embodiment 4.

Figure 41B:
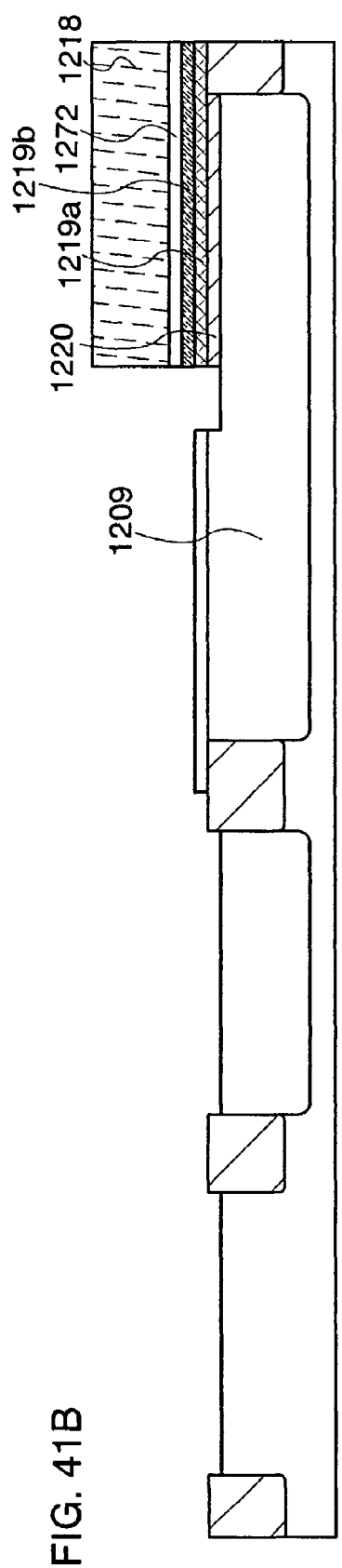

Next, the resist mask 1218 is formed over the third insulating layer 1271, and the third insulating layer 1271, the charge storage layers 1217*a* and 1217*b*, and the second insulating layers 1214, 1215, and 1216 are selectively removed using the resist mask 1218 as a mask. Parts of the second insulating layer 1216, the charge storage layers 1217*a* and 1217*b*, and the third insulating layer 1271 formed in a region 1209 are left, whereby a second insulating layer 1220, charge storage layers 1219*a* and 1219*b*, and a third insulating layer 1272 are obtained (see FIG. 41B).

After the resist mask 1218 is removed, fourth insulating layers 1273, 1274, and 1275 are formed in exposed portions of the regions 1207, 1208, and 1209 of the substrate 1200, respectively. The fourth insulating layers 1273, 1274, and 1275 can be formed by oxidation of a surface of the substrate 1200 by heat treatment, oxidation treatment, or nitridation treatment of the surface of the substrate 1200 by plasma treatment, that is, in a similar manner to the second insulating layers 1214 and 1215 described in Embodiment 4. Accordingly, the thicknesses of the fourth insulating layers 1273, 1274, and 1275 can be made thin. In addition, each of the fourth insulating layers 1273 and 1274 serves as a gate insulating film of a transistor formed in a logic portion. Therefore, a transistor with high-speed operation can be manufactured.

Here, for each of the fourth insulating layers 1273, 1274, and 1275, silicon oxide having a nitrogen plasma-treated layer with high nitrogen concentration over its surface or near the surface thereof is formed. The silicon oxide is formed in such a manner that oxidation treatment is performed to the surface of each of the regions 1207, 1208, and 1209 provided in the substrate 1200, and thereafter, nitridation treatment is performed.

Figure 41C:
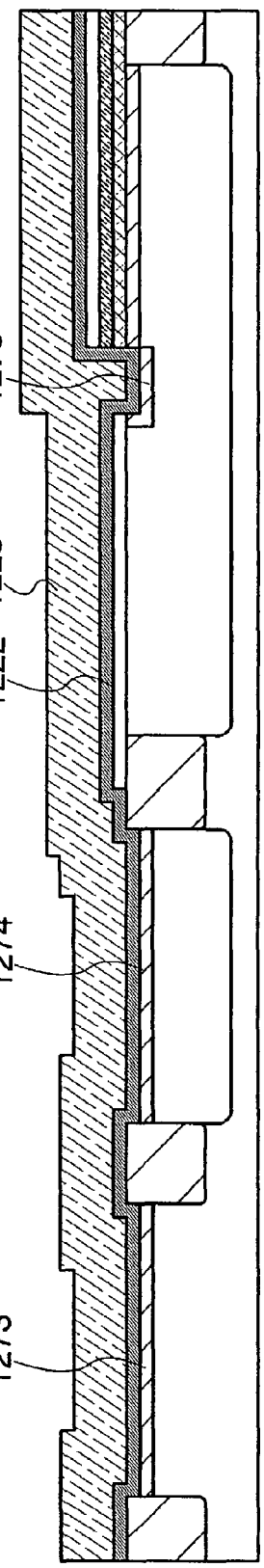

Next, conductive layers 1222 and 1223 are formed over the first insulating layer 1213, the third insulating layer 1272, and the fourth insulating layers 1273, 1274, and 1275 (see FIG. 41C).

Subsequently, in a similar manner to Embodiment 4, the stacked conductive layers 1222 and 1223 are selectively removed by etching, so that the conductive layers 1222 and 1223 are left over part of the regions 1207, 1208, and 1209 of the substrate 1200, whereby conductive layers 1224, 1225, and 1226 each of which serves as a gate electrode and a conductive layer 1227 which serves as a control gate are formed (see FIG. 40B and FIG. 42A). In addition, in the region 1209 of the substrate 1200, of the third insulating layer 1272, the charge storage layers 1219*a* and 1219*b*, and the second insulating layer 1220 formed under the conductive layer 1227, portions which do not overlap with the conductive layer 1227 are selectively removed, and the conductive layer 1227, a third insulating layer 1229, charge storage layers 1228*a* and 1228*b*, and a second insulating layer 1230 are formed so that edges of them roughly coincide with each other.

Figure 38A:
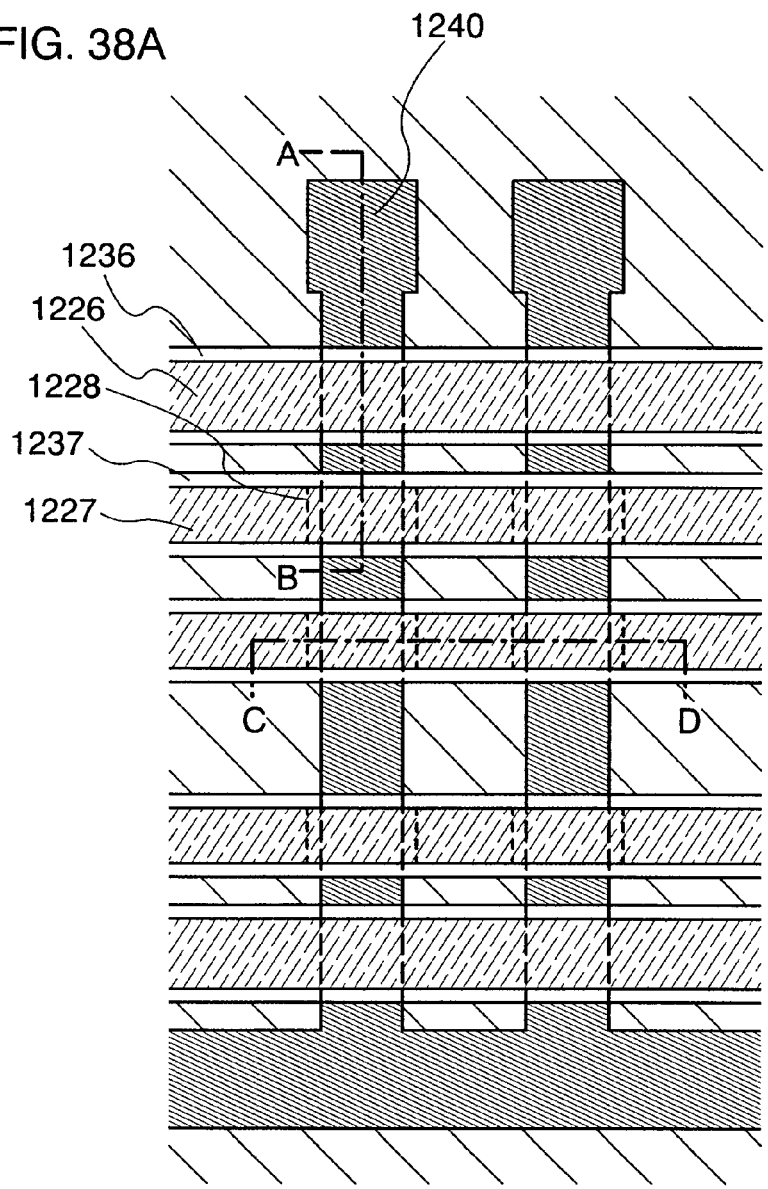
FIGS. 38A and 38B are each a view for showing an example of a top surface of a nonvolatile semiconductor memory device of the present invention.
Figure 38B:
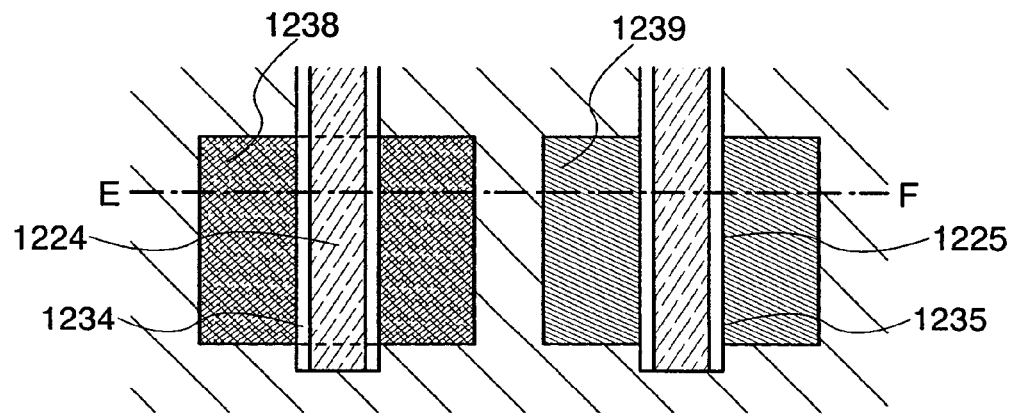
Figure 39A:
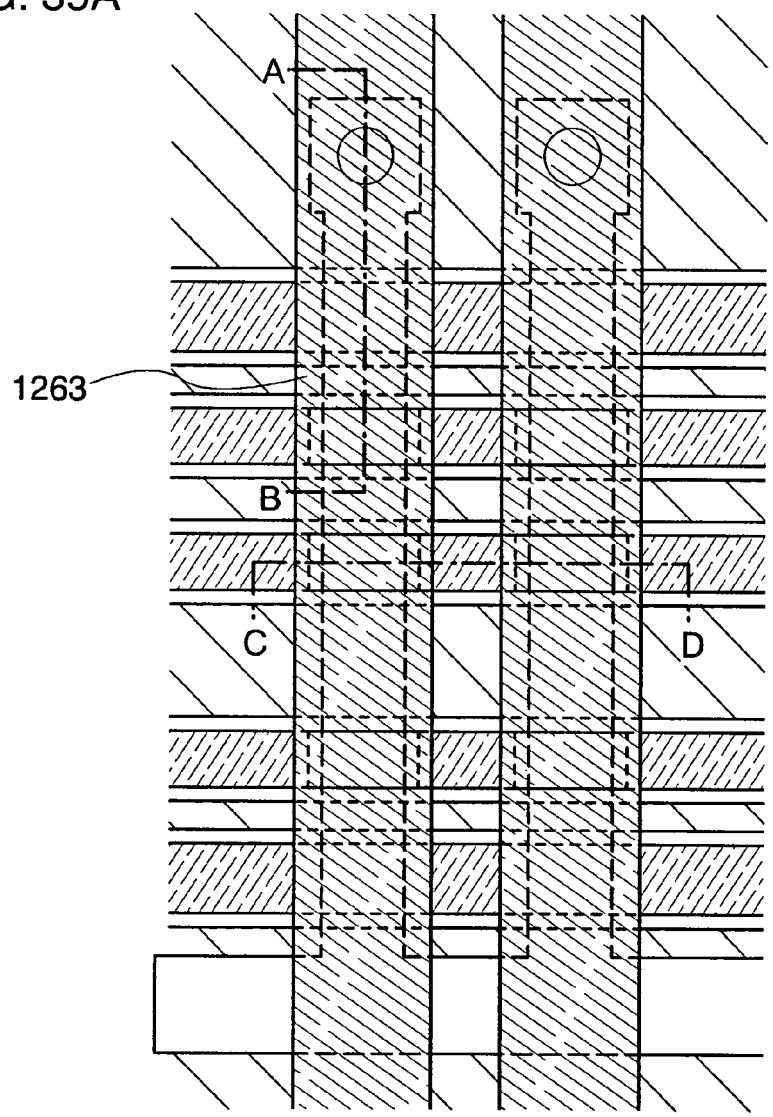
FIGS. 39A and 39B are each a view for showing an example of a top surface of a nonvolatile semiconductor memory device of the present invention.
Figure 39B:
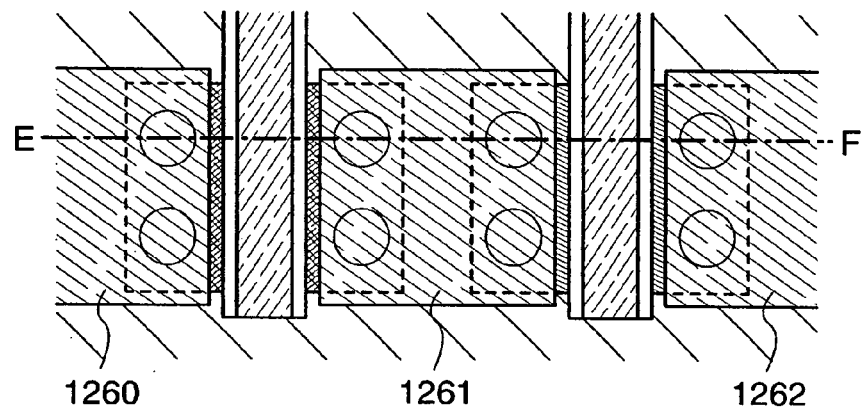

Next, in a similar manner to Embodiment 4, insulating layers 1234, 1235, 1236, and 1237 which are in contact with side surfaces of the conductive layers 1224, 1225, 1226, and 1227, respectively, impurity regions 1238, 1239, and 1240 each of which serves as a source region or drain region, and low concentration impurity regions 1241, 1242, 1243, and 1244 each of which is for forming an LDD region are formed (see FIGS. 38A and 38B and FIG. 42B).

Next, an insulating layer 1249, conductive layers 1255, 1256, 1257, 1258, and 1259, and conductive layers 1260, 1261, 1262, 1263 which are electrically connected to the conductive layers 1255, 1256, 1257, 1258, and 1259 are selectively formed (see FIGS. 39A and 39B, FIG. 40C, and FIG. 42C).

Through the above-described steps, a nonvolatile semiconductor memory device provided with a p-type transistor 1274 formed in the region 1207 of the substrate 1200, an n-type transistor 1275 formed in the region 1208 of the substrate 1200, and an n-type transistor 1276 and a nonvolatile memory element 1277 formed in the region 1209 of the substrate 1200 can be obtained.

Embodiment 6

Figure 43:
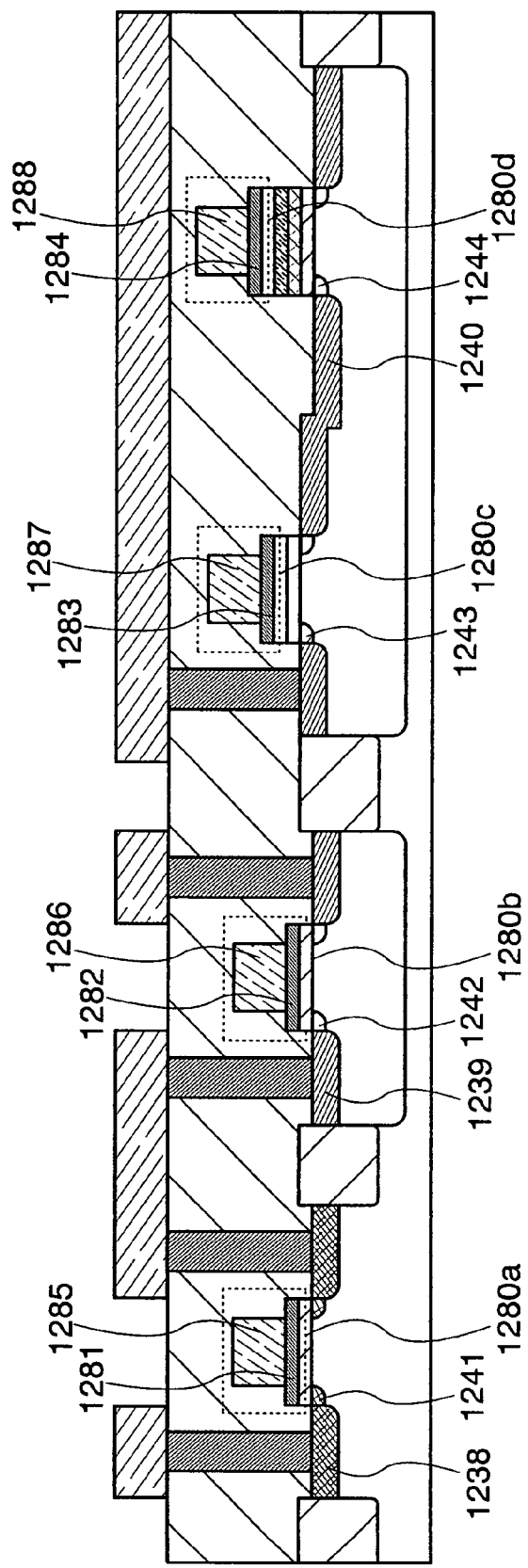
FIG. 43 is a view for showing an example of a manufacturing method of a nonvolatile semiconductor memory device of the present invention.

In this embodiment, the conductive layers 1224, 1225, 1226, and 1227 each of which serves as a gate electrode in Embodiments 4 and 5 will be explained with reference to FIG. 43. Although Embodiment 4 is used for the explanation here, this embodiment can be applied to Embodiment 5.

In this embodiment, each of conductive layers 1280*a*, 1280*b*, 1280*c*, and 1280*d* serving as a gate electrode has a stacked-layer structure, in which each of first layers 1281, 1282, 1283, and 1284 formed of metal nitride and each of second layers 1285, 1286, 1287, and 1288 formed of a metal are stacked and edges of each of the first layers extend outward from the edges of each of the second layers. At this time, the first layer is formed of metal nitride, whereby a barrier metal can be obtained. That is, a metal element in the second layer can be prevented from diffusing into an insulating layer serving as a gate insulating film or the substrate 1200 under the insulating layer.

When the conductive layers 1280*a*, 1280*b*, 1280*c*, and 1280*d* with such shapes are used as gate electrodes, the low concentration impurity regions 1241, 1242, 1243, and 1244 each of which is for forming an LDD region can be formed at the same time as the impurity regions 1238, 1239, and 1240 each of which serves as a source region or drain region by introduction of an impurity element into regions 1207, 1208, and 1209 of the substrate 1200. That is, a region of the second layer extending outward from the edges of the first layer serves as a mask for the low concentration impurity region. Therefore, the number of steps can be reduced, and thus, throughput can be improved.

Embodiment 7

In this embodiment, application examples of a semiconductor device capable of inputting and outputting data without contact, which is provided with the above-described nonvolatile semiconductor memory device of the present invention will be explained below with reference to drawings. The semiconductor device capable of inputting and outputting data without contact is referred to as an RFID tag, an ID tag, an IC tag, an IC chip, an RF tag, a wireless tag, an electronic tag, or a wireless chip depending on the usage pattern.

Figure 44A:
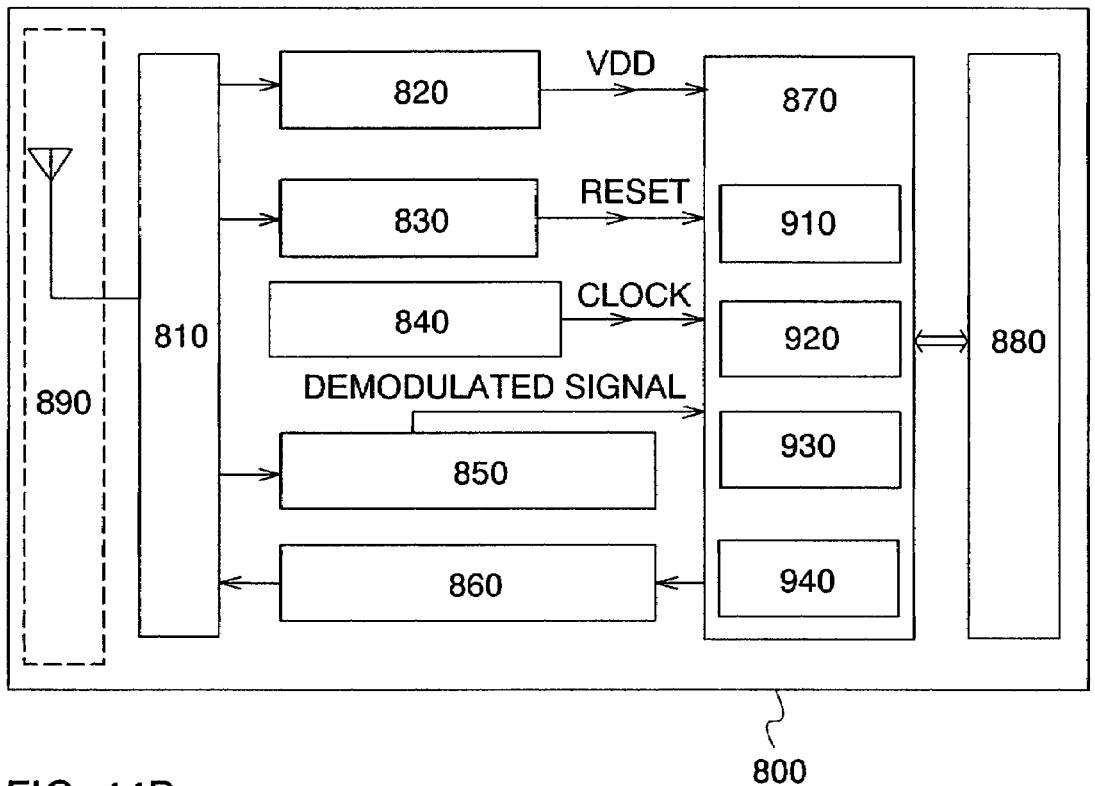
FIGS. 44A to 44C are each a view for showing an example of a nonvolatile semiconductor memory device of the present invention.

The semiconductor device 800 has a function of exchanging data without contact, and includes a high-frequency circuit 810, a power supply circuit 820, a reset circuit 830, a clock generating circuit 840, a data demodulating circuit 850, a data modulating circuit 860, a control circuit 870 for controlling other circuits, a memory circuit 880, and an antenna 890 (FIG. 44A). The high-frequency circuit 810 receives a signal from the antenna 890 and outputs a signal, which is received from the data modulating circuit 860, from the antenna 890. The power supply circuit 820 generates power supply potential from a received signal. The reset circuit 830 generates a reset signal. The clock generating circuit 840 generates various clock signals based on a received signal input from the antenna 890. The data demodulating circuit 850 demodulates the received signal and outputs the demodulated signal to the control circuit 870. The data modulating circuit 860 modulates a signal received from the control circuit 870. As the control circuit 870, for example, a code extracting circuit 910, a code judging circuit 920, a CRC judging circuit 930, and an output unit circuit 940 are provided. It is to be noted that the code extracting circuit 910 extracts each of plural codes included in an instruction sent to the control circuit 870. The code judging circuit 920 judges the content of the instruction by comparing the extracted code with a code corresponding to a reference. The CRC judging circuit 930 detects whether or not there is a transmission error or the like based on the judged code.

Subsequently, an example of an operation of the aforementioned semiconductor device is explained. First, a wireless signal is received by the antenna 890 and then sent to the power supply circuit 820 through the high-frequency circuit 810, whereby high power supply potential (hereinafter referred to as VDD) is generated. The VDD is supplied to each circuit in the semiconductor device 800. A signal sent to the data demodulating circuit 850 through the high-frequency circuit 810 is demodulated (hereinafter this signal is referred to as a demodulated signal). Moreover, signals and the demodulated signals passed through the reset circuit 830 and the clock generating circuit 840 via the high-frequency circuit 810 are sent to the control circuit 870. The signals sent to the control circuit 870 are analyzed by the code extracting circuit 910, the code judging circuit 920, the CRC judging circuit 930, and the like. Then, based on the analyzed signals, information of the semiconductor device stored in the memory circuit 880 is output. The information of the semiconductor device which has been output is encoded through the output unit circuit 940. Furthermore, the encoded information of the semiconductor device 800 passes through the data modulating circuit 860 and then is sent by the antenna 890. It is to be noted that low power supply potential (hereinafter referred to as VSS) is common in the plural circuits included in the semiconductor device 800 and VSS can be GND. In addition, the nonvolatile semiconductor memory device of the present invention can be applied to the memory circuit 880. The nonvolatile semiconductor memory device of the present invention can lower driving voltage; therefore, a distance which data can be communicated without contact can be extended.

In this manner, when a signal is sent from a communication device to the semiconductor device 800 and a signal sent from the semiconductor device 800 is received by the communication device, the data in the semiconductor device can be read.

It is to be noted that, here, the communication device may have means for sending and receiving information with RFID with wireless communication. For example, a reader for reading information, a reader/writer provided with reading function and writing function, or the like can be given. In addition, a mobile phone or computer provided with one or both of reading function and writing function or the like is also included.

Moreover, in the semiconductor device 800, power supply voltage may be supplied to each circuit by electromagnetic waves without mounting a power supply (battery), or a power supply (battery) may be mounted so that power supply voltage is supplied to each circuit by electromagnetic waves and the power supply (battery).

Figure 44B:
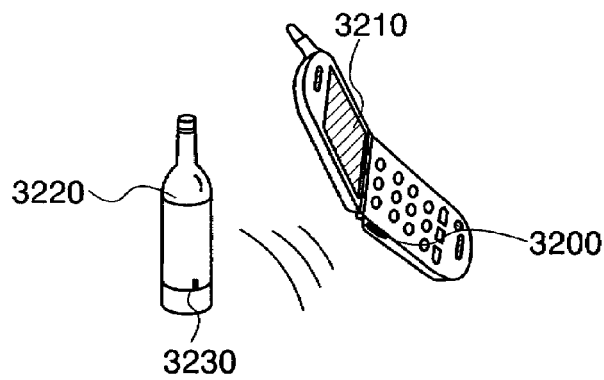
Figure 44C:
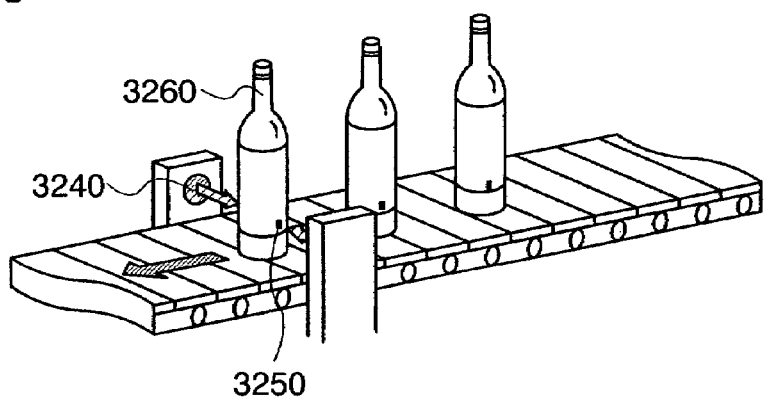

Next, an example of usage of a semiconductor device in which data can be input/output without contact is explained. A side surface of a mobile terminal including a display portion 3210 is provided with a communication device 3200. A side surface of a product 3220 is provided with a semiconductor device 3230 (FIG. 44B). When the communication device 3200 is held over the semiconductor device 3230 included in the product 3220, the display portion 3210 displays information on the product, such as a material, a place of origin, an inspection result for each production step, a history of the distribution process, and a description of the product. In addition, when a product 3260 is transferred by a conveyer belt, the product 3260 can be inspected with the use of a semiconductor device 3250 provided to the product 3260 and a communication device 3240 (FIG. 44C). In this manner, with the use of the semiconductor device in the system, information can be obtained easily and higher performance and higher added value are achieved.

The nonvolatile semiconductor memory device of the present invention can be used for electronic appliances equipped with a memory of all fields. For example, as electronic appliances to which the nonvolatile semiconductor memory device of the present invention is applied, the following can be given: a camera such as a video camera or a digital camera, a goggle type display (a head mounted display), a navigation system, an audio reproducing device (car audio set, audio component set, or the like), a computer, a game machine, a portable information terminal (mobile computer, mobile phone, portable game machine, electronic book, or the like), and an image reproducing device provided with a recording medium (specifically, a device provided with a display device that can reproduce a recording medium such as a digital versatile disc (DVD) and display the image), and the like. Specific examples of these electronic appliances are shown in FIGS. 45A to 45E.

Figure 45A:
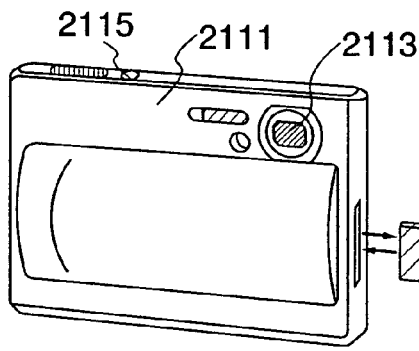
FIGS. 45A to 45E are each a view for showing a usage pattern of a nonvolatile semiconductor memory device of the present invention.
Figure 45B:
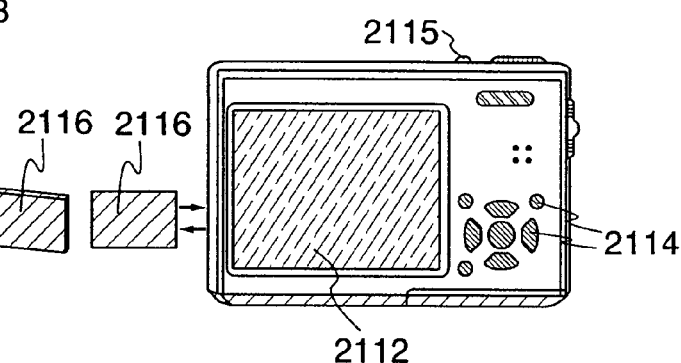

FIGS. 45A and 45B each show a digital camera. FIG. 45B is a view showing the back of the digital camera shown in FIG. 45A. This digital camera includes a chassis 2111, a display portion 2112, a lens 2113, operation keys 2114, a shutter button 2115, and the like. The digital camera is provided with a removable nonvolatile memory 2116, in which data taken by the digital camera is stored. The nonvolatile semiconductor memory device formed by the present invention can be applied to the memory 2116.

Figure 45C:
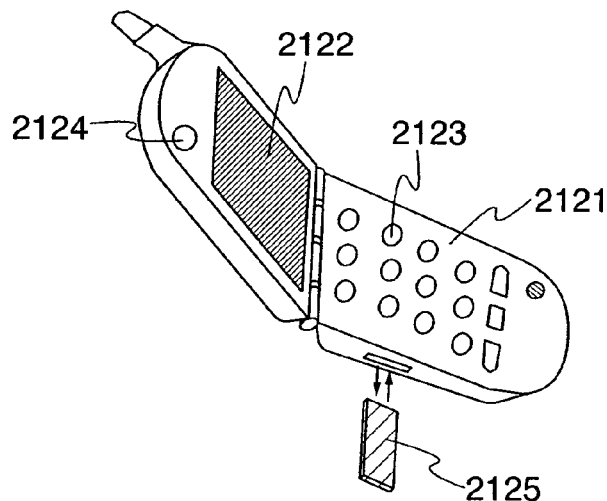

FIG. 45C shows a mobile phone, which is a typical example of a mobile terminal. This mobile phone includes a chassis 2121, a display portion 2122, operation keys 2123, and the like. The mobile phone is provided with a removable nonvolatile memory 2125. Data such as phone numbers, image data, music data, or the like included in the mobile phone can be stored in the memory 2125 and can be reproduced. The nonvolatile semiconductor memory device formed by the present invention can be applied to the memory 2125.

Figure 45D:
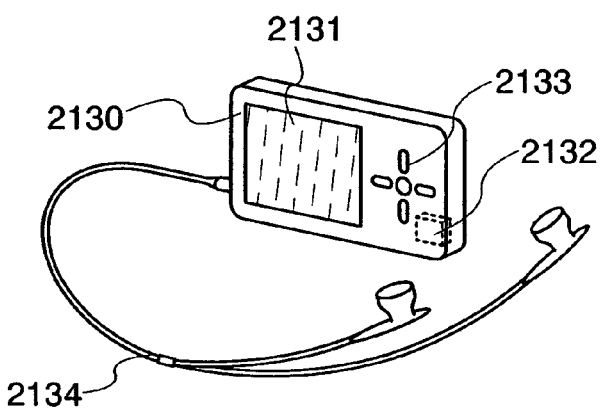

FIG. 45D shows a digital player, which is a typical example of an audio device. The digital player shown in FIG. 45D includes a main body 2130, a display portion 2131, a memory portion 2132, an operation portion 2133, earphones 2134, and the like. Further, headphones or wireless earphones can be used instead of the earphone 2134. The nonvolatile semiconductor memory device formed by the present invention can be used for the memory portion 2132. For example, NAND type nonvolatile memory with a memory capacity of 20 to 200 gigabytes (GB) is used and the operation portion 2133 is operated, whereby an image or sound (music) can be recorded and played. It is to be noted that power consumption of the display portion 2131 can be suppressed when white characters are displayed on a black background. This is effective especially in a mobile audio device. The nonvolatile semiconductor memory device provided in the memory portion 2132 may be removable.

Figure 45E:
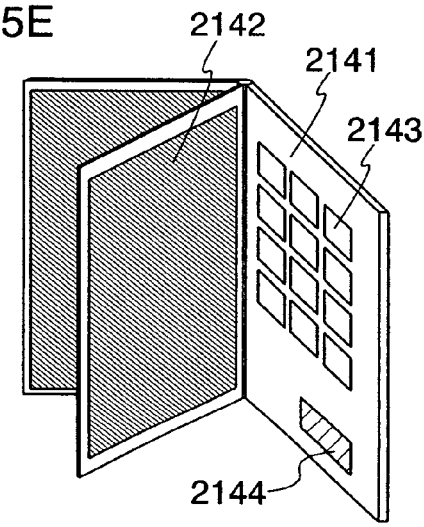

FIG. 45E shows an electronic book (also referred to as electronic paper). This electronic book includes a main body 2141, a display portion 2142, operation keys 2143, and a memory portion 2144. A modem may be built in the main body 2141, or a structure in which information can be sent and received wirelessly may be employed. The nonvolatile semiconductor memory device formed by the present invention can be used for the memory portion 2144. For example, NAND type nonvolatile memory with a memory capacity of 20 to 200 gigabytes (GB) is used and the operation keys 2143 are operated, whereby an image or sound (music) can be recorded and played. The nonvolatile semiconductor memory device provided in the memory portion 2144 may be removable.

As described above, an application range of the nonvolatile semiconductor memory device of the present invention is extremely wide, and the nonvolatile semiconductor memory device of the present invention can be applied to electronic appliances of all fields as long as the electronic appliances have memory.

This application is based on Japanese Patent Application serial No. 2006-153516 filed in Japan Patent Office on Jun. 1, 2006, the entire contents of which are hereby incorporated by reference.

What is claimed is:

1. A nonvolatile semiconductor memory device comprising:

a semiconductor region containing a channel formation region between a pair of impurity regions;
a first insulating layer over the channel formation region;
a plurality of layers containing different nitride compounds over the first insulating layer;
a second insulating layer over the plurality of layers containing the different nitride compounds; and
a control gate over the second insulating layer,
wherein an area of an upper surface of the plurality of layers containing the different nitride compound is smaller than that of an upper surface of the control gate, and
wherein the second insulating layer extends beyond ends of the control gate.

2. A nonvolatile semiconductor memory device according to claim 1, wherein one or more of the plurality of layers containing the different nitride compounds serve as a charge storage layer.

3. A nonvolatile semiconductor memory device according to claim 1, wherein one of the different nitride compounds is a germanium nitride compound.

4. A nonvolatile semiconductor memory device according to claim 3, wherein the germanium nitride compound is one selected from the group consisting of germanium nitride, germanium nitride to which oxygen is added, and germanium nitride to which oxygen and hydrogen are added.

5. A nonvolatile semiconductor memory device according to claim 1, wherein one of the different nitride compounds is a silicon nitride compound.

6. A nonvolatile semiconductor memory device according to claim 5, wherein the silicon nitride compound is one selected from the group consisting of silicon nitride, silicon nitride to which oxygen is added, and silicon nitride to which oxygen and hydrogen are added.

7. A nonvolatile semiconductor memory device according to claim 1, wherein each of the plurality of layers containing the different nitride compounds has a thickness of greater than or equal to 1 nm and less than or equal to 20 nm.

8. A nonvolatile semiconductor memory device according to claim 1, wherein the first insulating layer is a silicon oxide layer and contains nitrogen at an interface between the silicon oxide layer and the plurality of layers, or in the silicon oxide layer.

9. A nonvolatile semiconductor memory device according to claim 1, wherein the first insulating layer is formed in such a manner that a silicon oxide layer formed by oxidation of the semiconductor region by a plasma treatment is nitrided by a plasma treatment.

10. A nonvolatile semiconductor memory device according to claim 1, wherein the semiconductor region is a semiconductor layer formed over an insulating surface.

11. A nonvolatile semiconductor memory device according to claim 1, wherein the semiconductor region is a semiconductor substrate.

12. A nonvolatile semiconductor memory device according to claim 1, wherein the nonvolatile semiconductor memory device is incorporated in one selected from the group consisting of a digital camera, a mobile phone, a digital player and an electronic book.

13. A nonvolatile semiconductor memory device comprising:

a semiconductor region containing a channel formation region between a pair of impurity regions;
a first insulating layer including an oxide layer and a nitride layer over the channel formation region;
a plurality of layers containing different nitride compounds over the first insulating layer;

a second insulating layer over the plurality of layers containing the different nitride compounds; and a control gate over the second insulating layer, wherein an area of an upper surface of the plurality of layers containing the different nitride compound is smaller than that of an upper surface of the control gate, and wherein the second insulating layer extends beyond ends of the control gate.

14. A nonvolatile semiconductor memory device according to claim 13, wherein one or more of the plurality of layers containing the different nitride compounds serve as a charge storage layer.

15. A nonvolatile semiconductor memory device according to claim 13, wherein one of the different nitride compounds is a germanium nitride compound.

16. A nonvolatile semiconductor memory device according to claim 15, wherein the germanium nitride compound is one selected from the group consisting of germanium nitride, germanium nitride to which oxygen is added, and germanium nitride to which oxygen and hydrogen are added.

17. A nonvolatile semiconductor memory device according to claim 13, wherein one of the different nitride compounds is a silicon nitride compound.

18. A nonvolatile semiconductor memory device according to claim 17, wherein the silicon nitride compound is one selected from the group consisting of silicon nitride, silicon nitride to which oxygen is added, and silicon nitride to which oxygen and hydrogen are added.

19. A nonvolatile semiconductor memory device according to claim 13, wherein each of the plurality of layers containing the different nitride compounds has a thickness of greater than or equal to 1 nm and less than or equal to 20 nm.

20. A nonvolatile semiconductor memory device according to claim 13, wherein the oxide layer included in the first insulating layer is a silicon oxide layer and contains nitrogen at an interface between the silicon oxide layer and the plurality of layers, or in the silicon oxide layer.

21. A nonvolatile semiconductor memory device according to claim 13, wherein the first insulating layer is formed in such a manner that a silicon oxide layer formed by oxidation of the semiconductor region by a plasma treatment is nitrided by a plasma treatment.

22. A nonvolatile semiconductor memory device according to claim 13, wherein the semiconductor region is a semiconductor layer formed over an insulating surface.

23. A nonvolatile semiconductor memory device according to claim 13, wherein the semiconductor region is a semiconductor substrate.

24. A nonvolatile semiconductor memory device according to claim 13, wherein the nonvolatile semiconductor memory device is incorporated in one selected from the group consisting of a digital camera, a mobile phone, a digital player and an electronic book.

25. A nonvolatile semiconductor memory device comprising:

a semiconductor region containing a channel formation region between a pair of impurity regions;

a first insulating layer over the channel formation region;

a plurality of layers containing different nitride compounds over the first insulating layer; and a second insulating layer over the plurality of layers containing the different nitride compounds; and a control gate over the second insulating layer, wherein the first insulating layer, the plurality of layers containing the different nitride compounds, and the control gate are stacked in a position that overlaps with the channel formation region, wherein an area of an upper surface of the plurality of layers containing the different nitride compound is smaller than that of an upper surface of the control gate, and wherein the second insulating layer extends beyond ends of the control gate.

26. A nonvolatile semiconductor memory device according to claim 25, wherein one or more of the plurality of layers containing the different nitride compounds serve as a charge storage layer.

27. A nonvolatile semiconductor memory device according to claim 25, wherein one of the different nitride compounds is a germanium nitride compound.

28. A nonvolatile semiconductor memory device according to claim 27, wherein the germanium nitride compound is one selected from the group consisting of germanium nitride, germanium nitride to which oxygen is added, and germanium nitride to which oxygen and hydrogen are added.

29. A nonvolatile semiconductor memory device according to claim 25, wherein one of the different nitride compounds is a silicon nitride compound.

30. A nonvolatile semiconductor memory device according to claim 29, wherein the silicon nitride compound is one selected from the group consisting of silicon nitride, silicon nitride to which oxygen is added, and silicon nitride to which oxygen and hydrogen are added.

31. A nonvolatile semiconductor memory device according to claim 25, wherein each of the plurality of layers containing the different nitride compounds has a thickness of greater than or equal to 1 nm and less than or equal to 20 nm.

32. A nonvolatile semiconductor memory device according to claim 25, wherein the first insulating layer is a silicon oxide layer and contains nitrogen at an interface between the silicon oxide layer and the plurality of layers, or in the silicon oxide layer.

33. A nonvolatile semiconductor memory device according to claim 25, wherein the first insulating layer is formed in such a manner that a silicon oxide layer formed by oxidation of the semiconductor region by a plasma treatment is nitrided by a plasma treatment.

34. A nonvolatile semiconductor memory device according to claim 25, wherein the semiconductor region is a semiconductor layer formed over an insulating surface.

35. A nonvolatile semiconductor memory device according to claim 25, wherein the semiconductor region is a semiconductor substrate.

36. A nonvolatile semiconductor memory device according to claim 25, wherein the nonvolatile semiconductor memory device is incorporated in one selected from the group consisting of a digital camera, a mobile phone, a digital player and an electronic book.

37. A nonvolatile semiconductor memory device comprising:

a semiconductor region containing a channel formation region, a pair of LDD regions, and source and drain regions;

a first insulating layer over the channel formation region;

a plurality of layers containing different nitride compounds over the first insulating layer;

a second insulating layer over the plurality of layers containing the different nitride compounds; and a control gate over the second insulating layer, wherein the control gate overlaps with the channel formation region and the pair of LDD regions, wherein an area of an upper surface of the plurality of layers containing the different nitride compound is smaller than that of an upper surface of the control gate, and wherein the second insulating layer extends beyond ends of the control gate.

38. A nonvolatile semiconductor memory device according to claim 37, wherein one or more of the plurality of layers containing the different nitride compounds serve as a charge storage layer.

39. A nonvolatile semiconductor memory device according to claim 37, wherein one of the different nitride compounds is a germanium nitride compound.

40. A nonvolatile semiconductor memory device according to claim 39, wherein the germanium nitride compound is one selected from the group consisting of germanium nitride, germanium nitride to which oxygen is added, and germanium nitride to which oxygen and hydrogen are added.

41. A nonvolatile semiconductor memory device according to claim 37, wherein one of the different nitride compounds is a silicon nitride compound.

42. A nonvolatile semiconductor memory device according to claim 41, wherein the silicon nitride compound is one selected from the group consisting of silicon nitride, silicon nitride to which oxygen is added, and silicon nitride to which oxygen and hydrogen are added.

43. A nonvolatile semiconductor memory device according to claim 37, wherein each of the plurality of layers containing the different nitride compounds has a thickness of greater than or equal to 1 nm and less than or equal to 20 nm.

44. A nonvolatile semiconductor memory device according to claim 37, wherein the first insulating layer is a silicon oxide layer and contains nitrogen at an interface between the silicon oxide layer and the plurality of layers, or in the silicon oxide layer.

45. A nonvolatile semiconductor memory device according to claim 37, wherein the first insulating layer is formed in such a manner that a silicon oxide layer formed by oxidation of the semiconductor region by a plasma treatment is nitrided by a plasma treatment.

46. A nonvolatile semiconductor memory device according to claim 37, wherein the semiconductor region is a semiconductor layer formed over an insulating surface.

47. A nonvolatile semiconductor memory device according to claim 37, wherein the semiconductor region is a semiconductor substrate.

48. A nonvolatile semiconductor memory device according to claim 37, wherein the nonvolatile semiconductor memory device is incorporated in one selected from the group consisting of a digital camera, a mobile phone, a digital player and an electronic book.

* * * * *